United States Patent [19]

Itoh et al.

[11] Patent Number: 5,684,856
[45] Date of Patent: Nov. 4, 1997

[54] STAGE DEVICE AND PATTERN TRANSFER SYSTEM USING THE SAME

[75] Inventors: Hirohito Itoh, Funabashi; Shinji Ohishi, Oyama; Kazunori Iwamoto, Yokohama; Nobushige Korenaga, Sagamihara; Youzou Fukagawa, Yokohama; Toshiya Asano; Satoru Takahashi, both of Tokyo, all of Japan

[73] Assignee: Canon Kabushiki Kaisha, Tokyo, Japan

[21] Appl. No.: 275,428

[22] Filed: Jul. 15, 1994

Related U.S. Application Data

[63] Continuation-in-part of Ser. No. 127,740, Sep. 29, 1993, abandoned, and Ser. No. 40,600, Mar. 31, 1993, abandoned.

[30] Foreign Application Priority Data

| | | | |
|---|---|---|---|
| Sep. 18, 1991 | [JP] | Japan | 3-238214 |
| Mar. 31, 1992 | [JP] | Japan | 4-077559 |
| Feb. 22, 1993 | [JP] | Japan | 5-032053 |

[51] Int. Cl.$^6$ .................................................. H05G 1/00
[52] U.S. Cl. ........................ 378/34; 378/208; 250/453.11
[58] Field of Search ................ 378/34, 208; 250/453.11, 250/442.11

[56] References Cited

U.S. PATENT DOCUMENTS

| | | | |
|---|---|---|---|
| 5,073,912 | 12/1991 | Kobayashi et al. | 378/34 |
| 5,260,580 | 11/1993 | Itoh et al. | 378/208 |

FOREIGN PATENT DOCUMENTS 0439052  7/1991  European Pat. Off. .

Primary Examiner—Don Wong
Attorney, Agent, or Firm—Fitzpatrick, Cella, Harper & Scinto

[57] ABSTRACT

A stage device includes a first, fine-motion driving system for moving a movable stage through a first range; and a second, relatively rough-motion driving system for moving the movable stage through a second range which is substantially of the same extent as the first range.

16 Claims, 75 Drawing Sheets

FIG. 5(a) STAGE POSITION
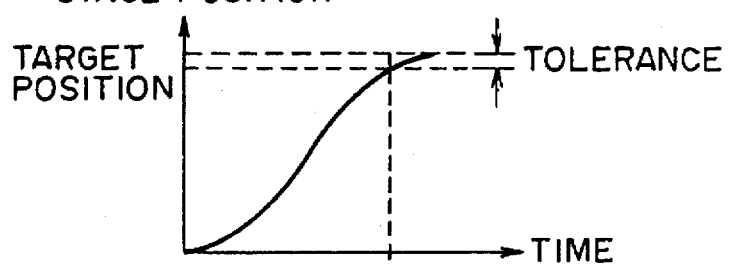
FIG. 5(b) INT. SW
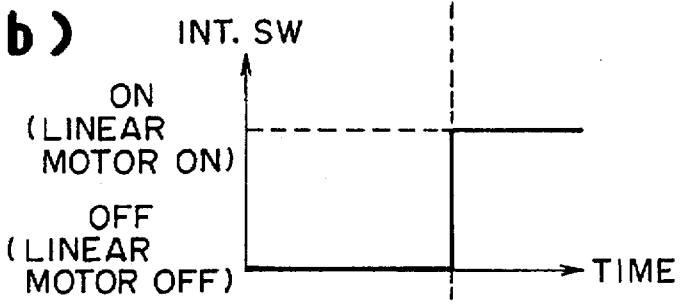
FIG. 5(c) LINEAR MOTOR CURRENT
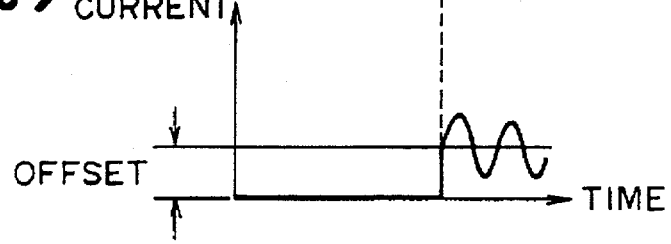

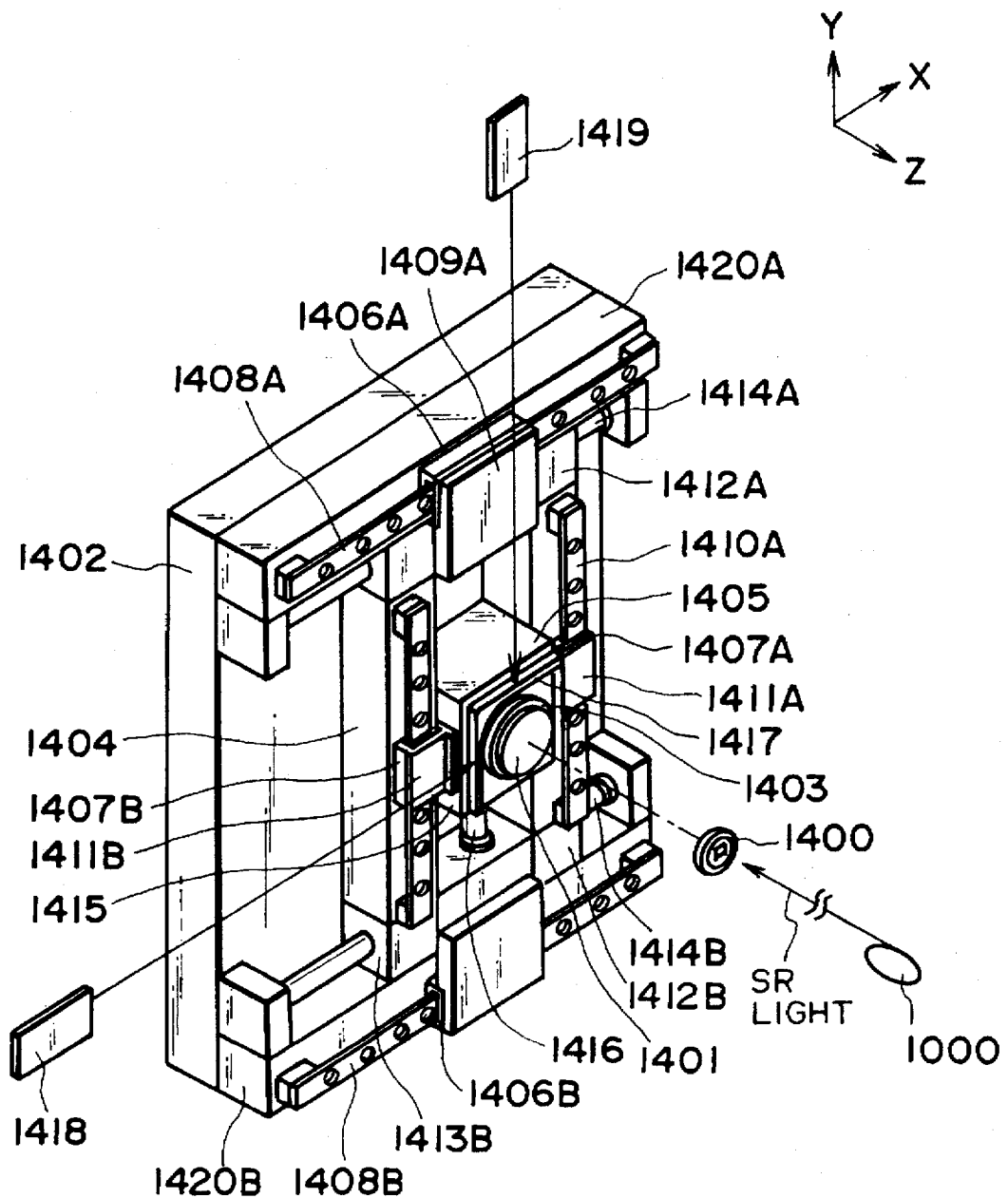
F I G. 14

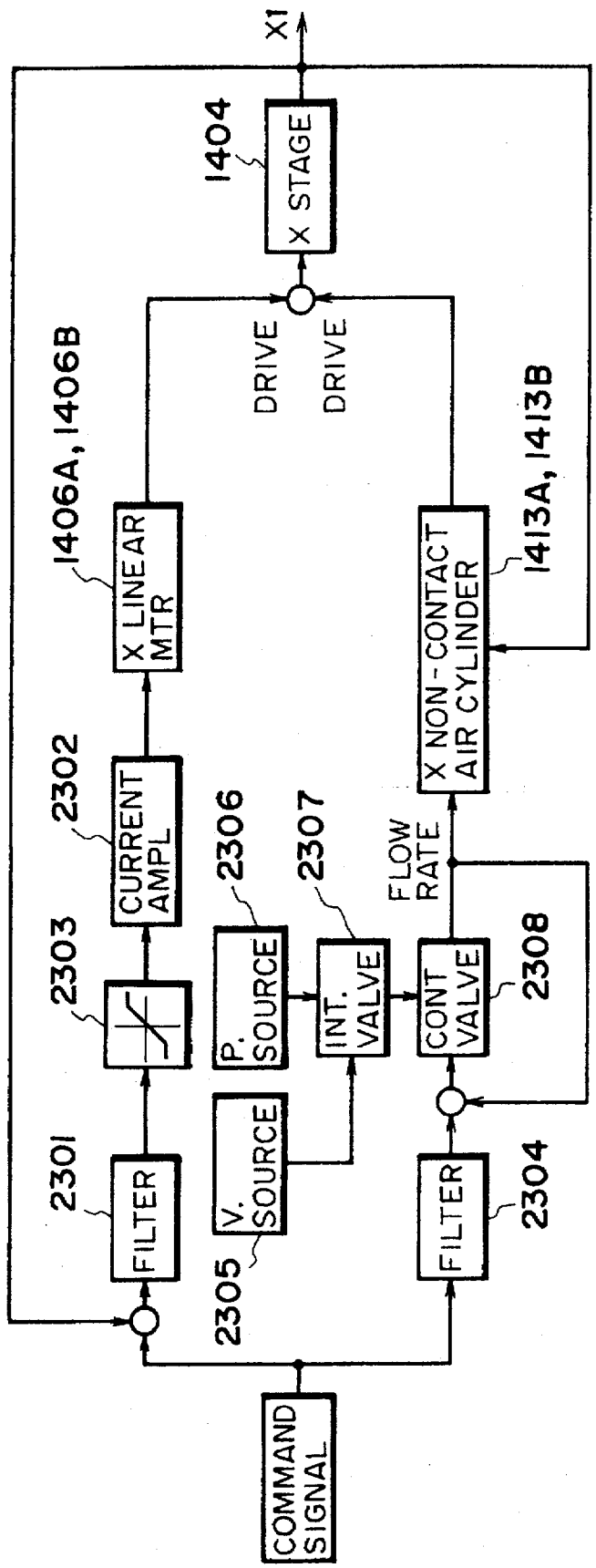
F I G. 23

FIG. 24(a)
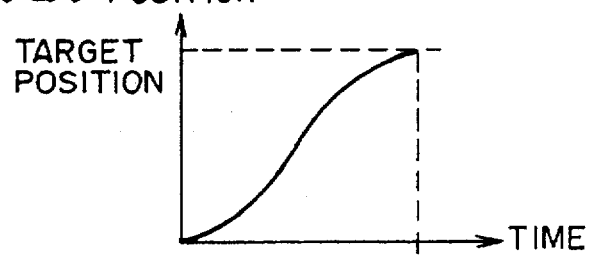
FIG. 24(b)
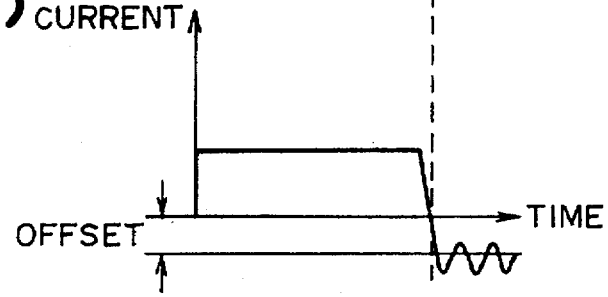
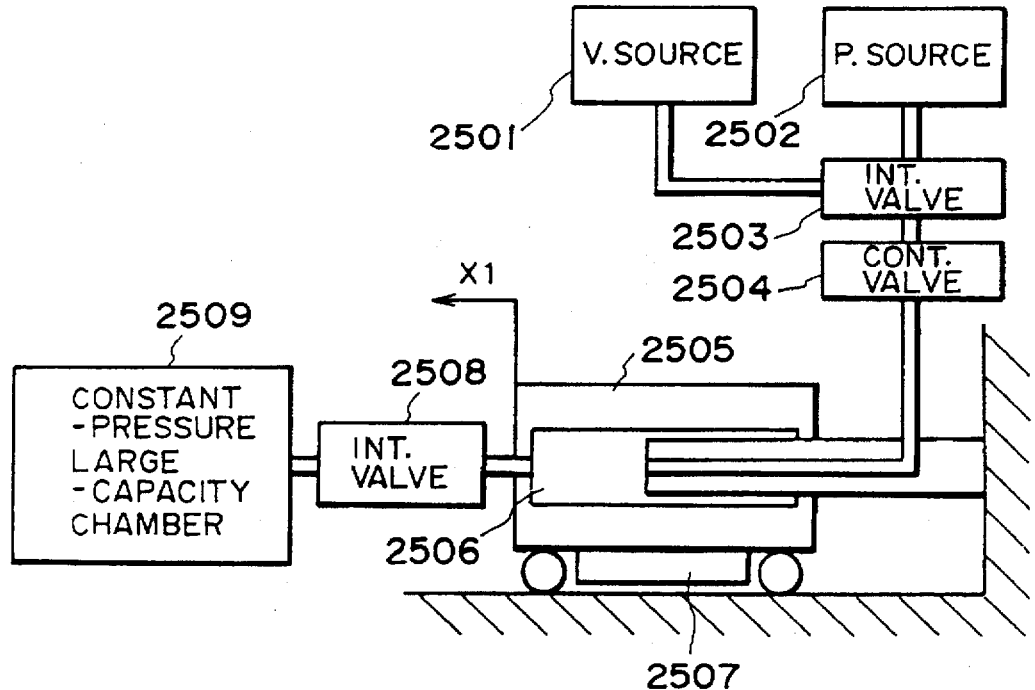
FIG. 25

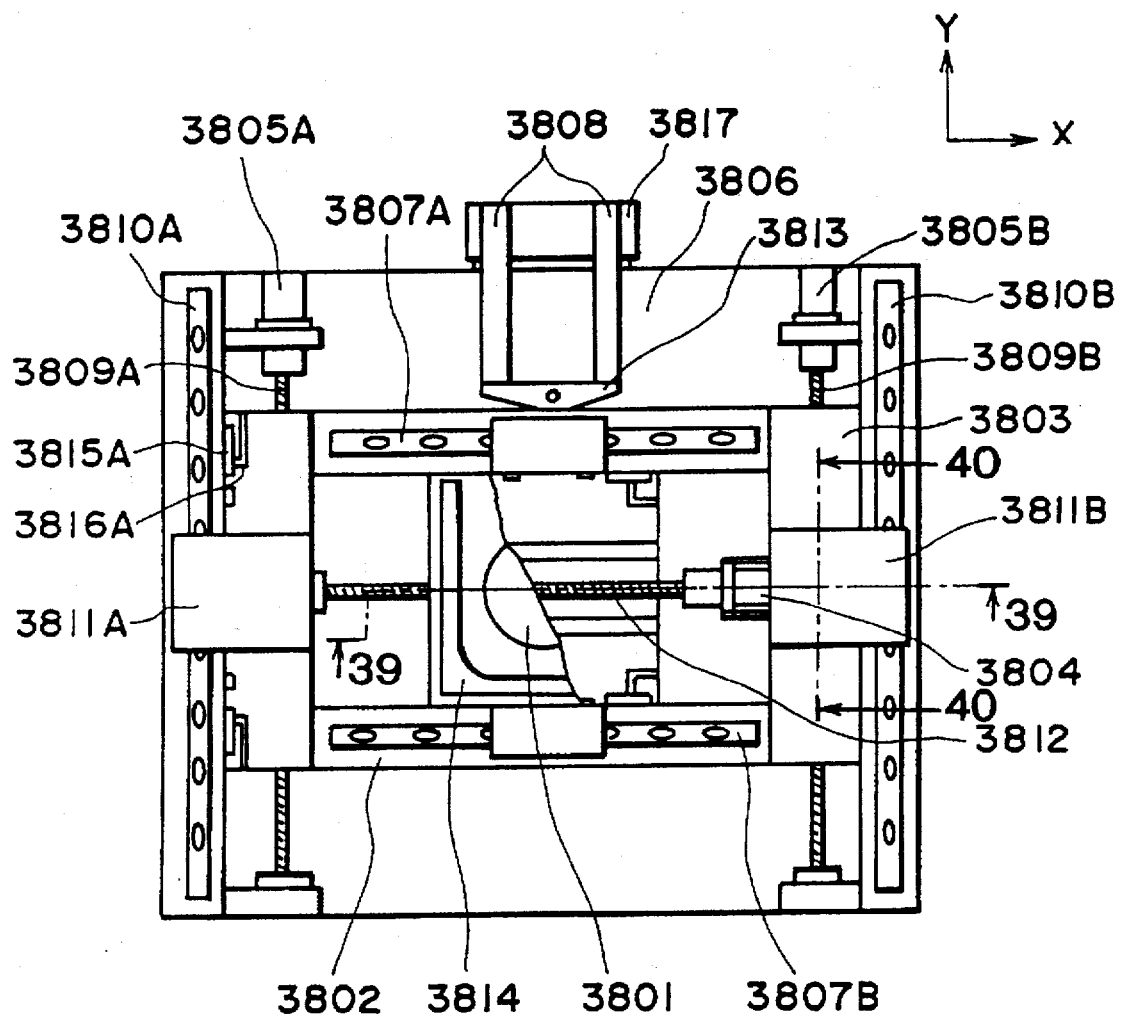
F I G. 38

FIG. 45(a) STAGE POSITION
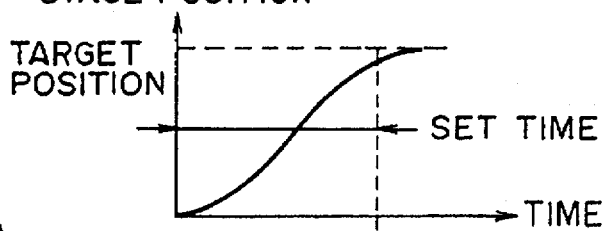
FIG. 45(b) INT. SW
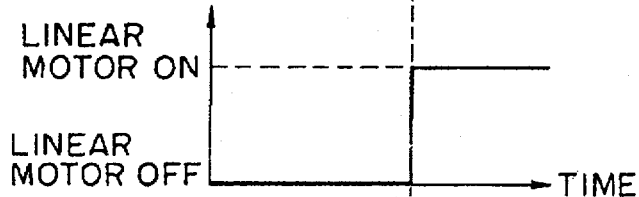
FIG. 45(c) LINEAR MOTOR CURRENT
FIG. 45(d) CLUTCH
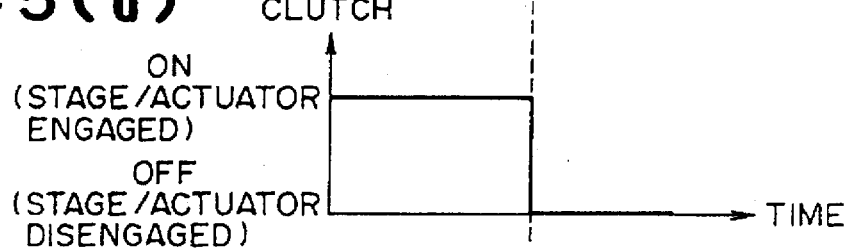
FIG. 45(e) RESISTANCE TO LINEAR MOTOR
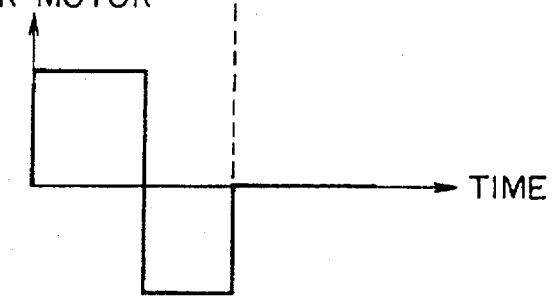

ENLARGED VIEW OF GAP JOINT

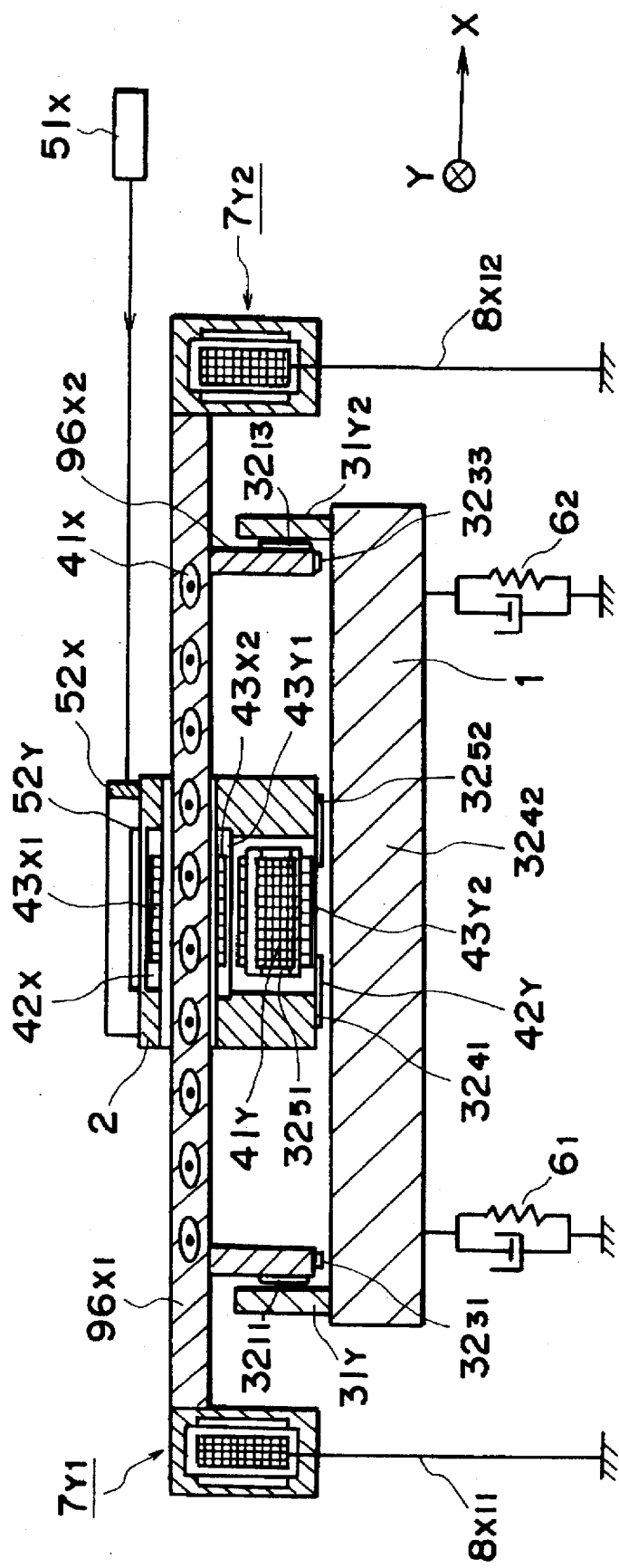
F I G. 81

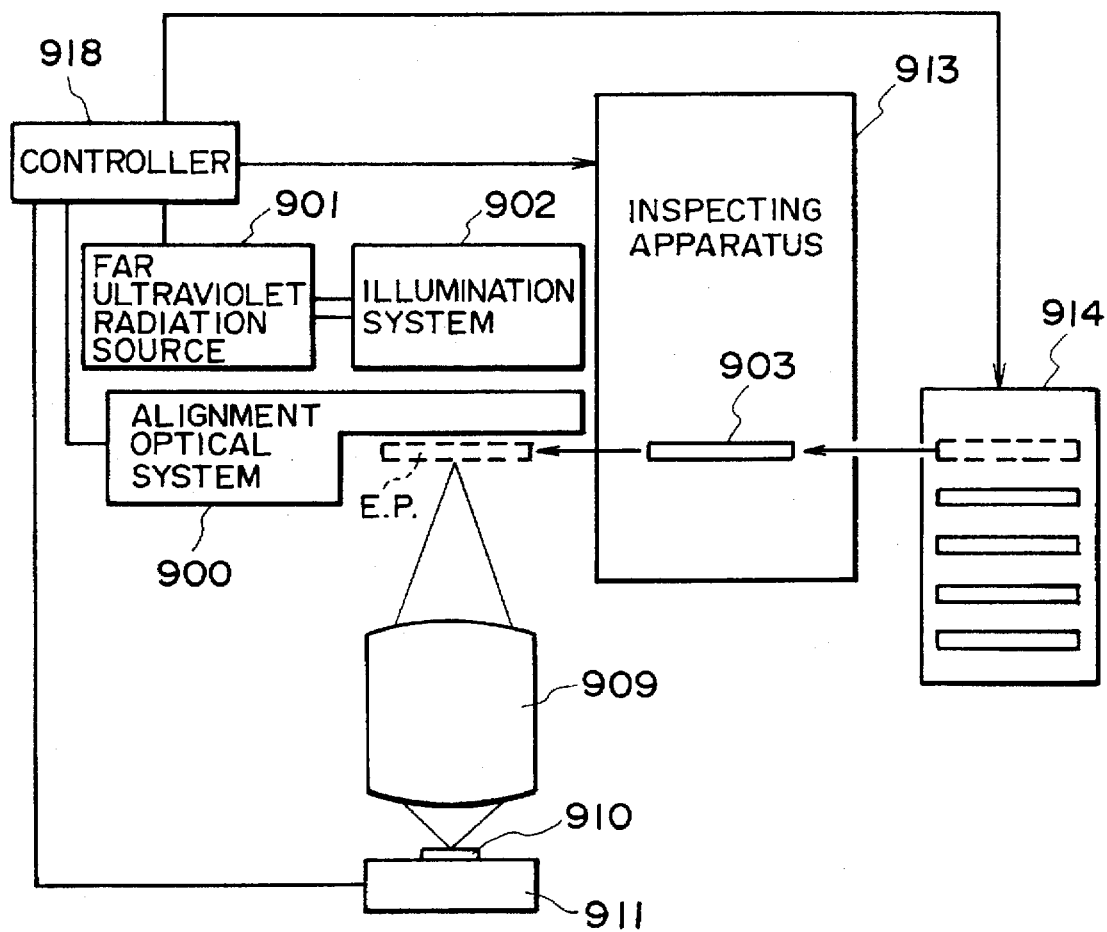
F I G. 84

STAGE DEVICE AND PATTERN TRANSFER SYSTEM USING THE SAME

The subject application is a continuation-in-part of application Ser. No. 08/127,740 filed Sep. 29, 1993, now abandoned and of application Ser. No. 08/040,600 filed Mar. 31, 1993, now abandoned.

FIELD OF THE INVENTION AND RELATED ART

This invention relates to a stage device and a pattern transfer system using the same.

In an exposure apparatus, a stage device is used in an alignment system, for example. In an exposure apparatus for the manufacture of semiconductor devices, extraordinarily high exposure precision as well as highest throughput for highest productivity are strongly required. As for a stage device to be provided for making stepwise motion of a wafer, high precision positioning as well as quickness to assure highest throughput are required. Moreover, with the recent increasing in size of a wafer, a larger movable distance (i.e., stroke) is also required.

A known type movable stage device satisfying these requirements uses a linear motor as a driving means. However, in this type of movable stage, while the linear motor satisfies large stroke, high precision and quickness, the efficiency is low and as a result a large amount of heat is produced during the motion. Although the quantity of heat generation does not raise a large problem when the stage position is to be held, it causes a serious problem during acceleration in the initial period of motion. In an exposure apparatus such as an X-ray exposure apparatus, the heat generated by the linear motor can be transmitted to a wafer through the stage device. Therefore, if the step-and-repeat motion is made so frequently to improve the throughput, heat is accumulated in the wafer thus causing thermal distortion thereof.

FIG. 87 is a top view of a conventional movable stage device of the above type; FIG. 88 is an enlarged sectional view taken along line E—E of FIG. 87.

This conventional movable stage device includes a stationary base 1 supported by two dampers $6_1$ and $6_2$ which constitute a stationary base supporting means having low rigidity and are adapted to dampen vibrations from a floor (see FIG. 88). Two guide plates $31_1$ and $31_2$ which constitute a guide means are provided at the right and left sides of the stationary base 1 (as seen in FIG. 88). A movable stage 2 is supported by the stationary base 1 and the guide plates $31_1$ and $31_2$ in a non-contact fashion through the intermediation of a plurality of fluid static pressure bearings (FIGS. 87 and 88 show only fluid static pressure bearings $32_{11}$, $32_{12}$, $32_{13}$, $32_{21}$, $32_{22}$ and $32_{23}$), and a linear motor 4 is provided on the stationary base 1 to constitute a driving means for imparting thrust to the movable stage 2 (see FIG. 88).

The linear motor 4 includes a yoke 42 fastened to the back surface of the movable stage 2 (the surface facing the stationary base 1) and having a rectangular hollow section. A group of drive coils 41 are arranged in a row along the stationary base 1 in the direction of movement of the movable stage 2 (i.e., horizontally) and are supported above the stationary base 1 by supports $35_1$ and $35_2$ at the respective ends of the row so that the row of coils extends through the hollow section of the yoke 42. A pair of permanent magnets $43_1$ and $43_2$ are mounted in the hollow section of the yoke 42. The movable stage 2 moves along the guide plates $31_1$ and $31_2$ when thrust is imparted to the stage by the linear motor 4. The distance the movable stage 2 moves is controlled according to positional information regarding the movable stage 2 obtained by a laser distance measurement system consisting of a mirror 52 fixed to the movable stage 2 and a laser distance measuring device 51. The above-mentioned dampers $6_1$ and $6_2$ are provided between the stationary base 1 and the floor and have low rigidity because of their low resonance frequency so that vibrations from the floor are not transmitted to the stationary base 1. Thus, they serve to dampen any vibrations generated in the stationary base 1.

In this conventional movable stage device, the positioning of the movable stage 2 is effected quickly and with high accuracy by the following driving method. As shown in FIG. 15, for a long-distance movement, as in the case of moving the movable stage 2 from a stop position to a point near a target position, speed control is performed which allows movement at high speed. For accurate positioning of the stage 2 around the target position, position control is performed. To achieve high-speed movement during speed control, the linear motor 4 is used and, at the same time, an arrangement is adopted in which, as shown in FIG. 89, the speed of the stage is rapidly increased when it starts to move from the stop position and rapidly decreased directly before reaching the target position, thereby maintaining the maximum speed as high as possible and for as long a time as possible.

The conventional movable stage device, however, has the following problems:

(1) The reaction generated when imparting thrust to the movable stage 2 is received by the group of drive coils 41 of the linear motor 4 on the stationary base 1, and the rigidity of the dampers $6_1$ and $6_2$ is insufficient to dampen the reaction, so that increasingly abrupt acceleration and deceleration of the movable stage at the time of speed control results in a proportionally increasing reaction, thereby causing the stationary base 1 to shake to a large degree. Therefore, at the time of position control, the movable stage 2 is shaken by the vibration of the stationary base 1. Thus, the conventional device does not help shorten the time taken for final positioning; on the contrary, the conventional device takes a relatively long time to effect final positioning.

(2) The vibration of the stationary base 1 causes its posture to change, thereby changing the posture of the movable stage 2. Thus, when applied to a machine tool or the like, the device will cause deterioration in machining precision. When applied to a semiconductor printing device, the device will cause deterioration in resolution since the focal point of the printing light will be shifted due to the tilting of the stage.

(3) Once the stationary base 1 has begun to shake, there is no means for effectively stopping its vibration; there is nothing to do but to wait for the vibration to subside by itself and cease to have any influence on the operation being performed.

(4) Effecting rapid acceleration and deceleration by using a large-thrust linear motor 4 results in an increase in the quantity of heat generated in the linear motor, thereby causing the movable stage 2, for example, to be deformed by heat. Therefore, when this device is applied to a machine tool or the like, the deformation by heat of the movable stage 2 causes the distance between the mirror 52 and the machining point to change, resulting in deterioration in machining precision. In the case when it is applied to a semiconductor printing apparatus, this device will cause deterioration in printing accuracy because of the changes caused in the distance between the mirror 52 and the printing position.

(5) The consumption of the thrust of the linear motor 4 in shaking the stationary base 1 leads to a waste of energy. These problems and others are addressed and overcome by the present invention.

SUMMARY OF THE INVENTION

It is accordingly an object of the present invention to provide an improved stage device which has high precision and high quickness but which does not generate a large quantity of heat.

It is another object of the present invention to provide a pattern transfer system such as an exposure apparatus which uses a stage device such as above.

In accordance with an aspect of the present invention, there is provided a stage device which comprises a movable stage, first driving means for fine motion of the movable stage within a first predetermined range, and second driving means for relatively rough motion of the movable stage within a second predetermined range which is substantially of the same range as the first range.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5(a) through 5(c) are time charts for explaining the operation of the drive control of the FIG. 4 example, wherein the portion (a) shows the position of the movable stage with respect to driving time, the portion (b) shows the timing for switching an interchange switch, and the portion (c) shows an applied current to a linear motor.

FIGS. 13A and 13B show first driving means of the movable stage device of FIG. 11, wherein FIG. 13A is a front view and FIG. 13B is a sectional view.

FIG. 14 is a perspective view of a movable stage device according to a third embodiment of the present invention.

FIG. 23 is a block diagram of a third example of drive control in the movable stage device of FIG. 14.

FIGS. 24(a) and 24(b) are time charts for explaining the operation of the drive control of the FIG. 23 example, wherein the portion (a) shows the position of the movable stage with respect to driving time, and the portion (b) shows an applied current to a linear motor.

FIG. 25 is a schematic view for explaining the principle of operation of a modified form Of the movable stage device of FIG. 14.

FIG. 38 is a front view of a movable stage device according to a sixth embodiment of the present invention.

FIGS. 45(a) through (e) are time charts for explaining the operation of the drive control of the FIG. 44 example, wherein the portion (a) shows the position of the movable stage with respect to driving time, the portion (b) shows the timing for switching an interchange switch, the portion (c) shows an applied current to a linear motor, the portion (d) shows the timing for switching an interchange clutch, and the portion (e) shows changes counteracting to the linear motor.

FIG. 81 is an enlarged sectional view taken along line 81—81 of FIG. 80.

FIG. 84 is a block diagram showing the construction of an exposure system.

DESCRIPTION OF THE PREFERRED EMBODIMENTS

First Embodiment

Figure 1:
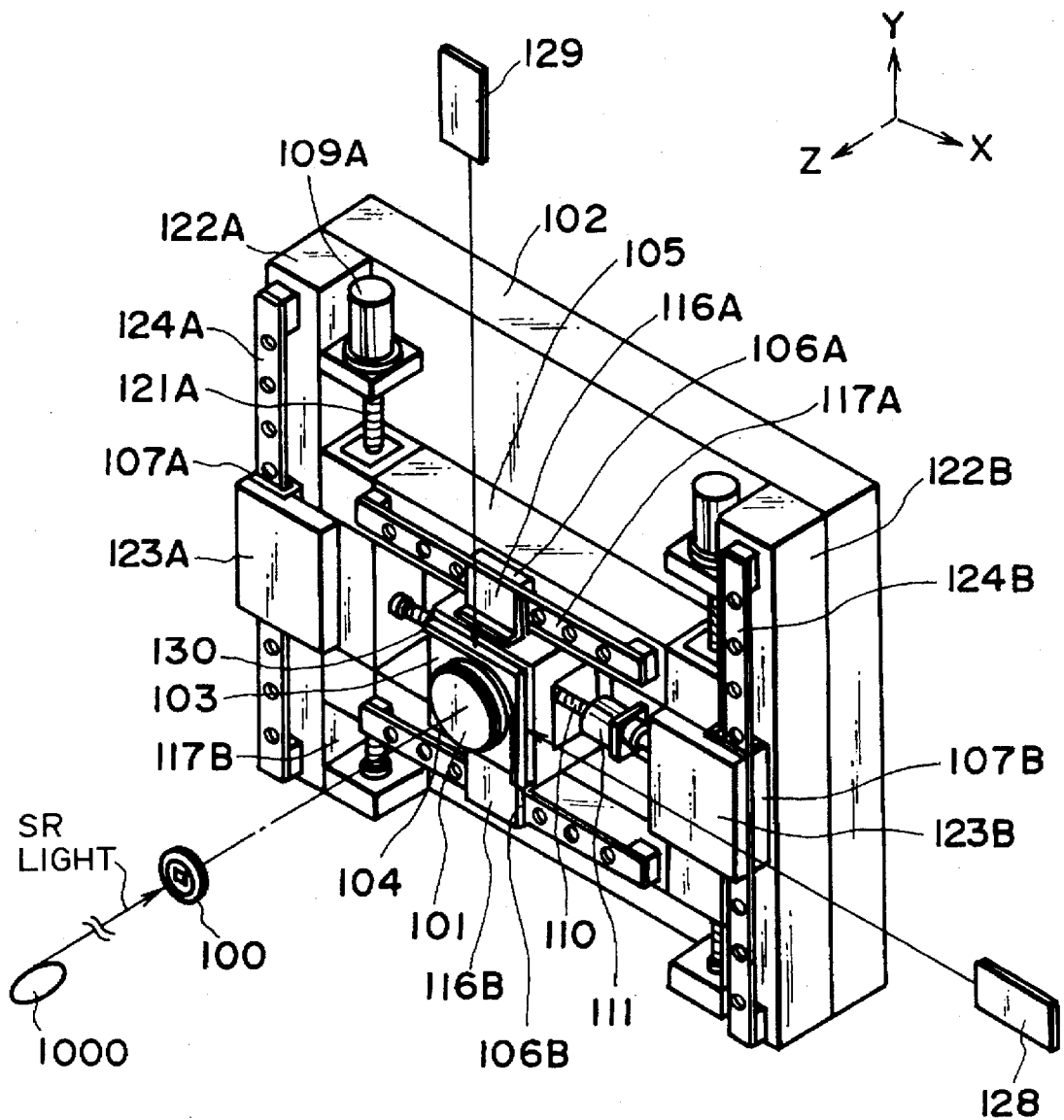
FIG. 1 is a perspective view of a movable stage device according to a first embodiment of the present invention.

Initially, a first embodiment of the present invention will be explained with reference to FIGS. 1, 2A and 2B.

In this embodiment, the invention is applied to an alignment system incorporated into an SOR X-ray exposure apparatus for printing a semiconductor device manufacturing pattern of a mask 100 on a resist of a wafer 101 by using orbit radiation light (SOR X-rays), for positioning the wafer 101 with respect to the mask 100.

The movable stage device of this embodiment comprises first driving means which includes X linear motors 106A and 106B and Y linear motors 107A and 107B, for fine motion for final positioning with respect to X and Y directions, respectively, as well as second driving means which includes an X motor 108 and Y motors 109A and 109B for relatively rough motion (stepwise motion) with respect to the X and Y directions.

The wafer is held by attraction by a wafer chuck 103 mounted on an X stage 104. Through the fine motion and relatively rough motion by the first and second driving means, the wafer can be positioned and aligned correctly with respect to SR light emitted by an SOR ring (X-ray source) 1000 and passed through the mask 100.

The X stage 104 is coupled to the X motor 108, mounted on a Y stage 105, through an X nut 114 and an X screw shaft 110 coupled by a bearing unit 111 which comprises a coupling 112 and a rolling bearing 113. Thus, forward or reverse rotation of the X motor 108 causes motion of the stage in the positive or negative X direction. Further, the X stage 104 is coupled to X linear motor coils 117A and 117B, disposed in parallel in the X direction on the Y stage 105, through X linear motor coupling plates 16A and 17A and X linear motors 116A and 117B disposed above and below it, respectively. Thus, it can be moved in the positive or negative X direction, similarly. X leaf spring means 115 is provided between the X stage 101 and the X nut 114, so that resilient coupling is provided therebetween. This allows that, for the final positioning subsequent to stopping of the X motor 108 upon completion of the stepwise motion of the motor 108, the stage is displaced with the drive of the X linear motor 106A or 106B within the range counteractable to the spring force of the X leaf spring means 115. Also, a sensor (strain gauge or gap sensor) is provided to detect the amount of displacement of the X leaf spring 115.

In relation to the Y stage 105, the X stage 104 is provided with a pair of static pressure bearing means which comprises X static pressure bearing pressurizing systems 118A and 118B, X preloading magnets 119A and 119B, and X static pressure pads 120A and 120B (elements 118A, 119A and 120A are not shown).

On the other hand, the Y stage 105 is coupled to the Y motors 109A and 109B, mounted to a stage base 102, through Y screw shafts 121A and 121B and Y nuts (not shown) coupled by similar bearing units as described. Thus, forward or reverse rotation of the Y motors 109A and 109B causes positive or negative motion of the stage.

Mounted on the right-hand and left-hand sides of the Y stage 105 are Y linear motor coupling plates 123A and 123B and Y linear motors 107A and 107B. Through these Y linear motors 107A and 107B, it is coupled to Y linear motor coils 124A and 124B which are provided on a pair of yaw guides 122A and 122b, respectively, disposed in parallel in the Y direction on the stage base 102. Thus, it can be moved in the positive or negative Y direction, similarly.

As regards the Y stage 105, like the X stage 104, Y leaf spring means (not shown) is provided between it and the Y nut. Thus, resilient coupling is provided therebetween. This allows that, for final positioning subsequent to stopping of the Y motors 109A and 109B after completion of the stepwise motion of the motors 109A and 109B, the stage is displaced with the drives of the Y linear motors 107A and 107B within the range counteractable to the spring force of the Y leaf spring. A sensor (strain gauge or gap sensor) is provided to detect the amount of displacement of the Y leaf spring.

In relation to the Y yaw guides 122A and 122B, the Y stage 105 is provided with a pair of static pressure bearing means which comprises Y static pressure pads 125A and 125B, Y static pressure bearing pressurizing systems 126A and 126B and Y preloading magnets 127B.

X-axis laser interferometer unit 128 and Y-axis laser interferometer unit 129 shown in FIG. 1 are provided to measure the position of the X stage 104 in the X and Y directions, respectively, in response to reception of laser light reflected from a square mirror 130 on the X stage 104.

Figure 3:
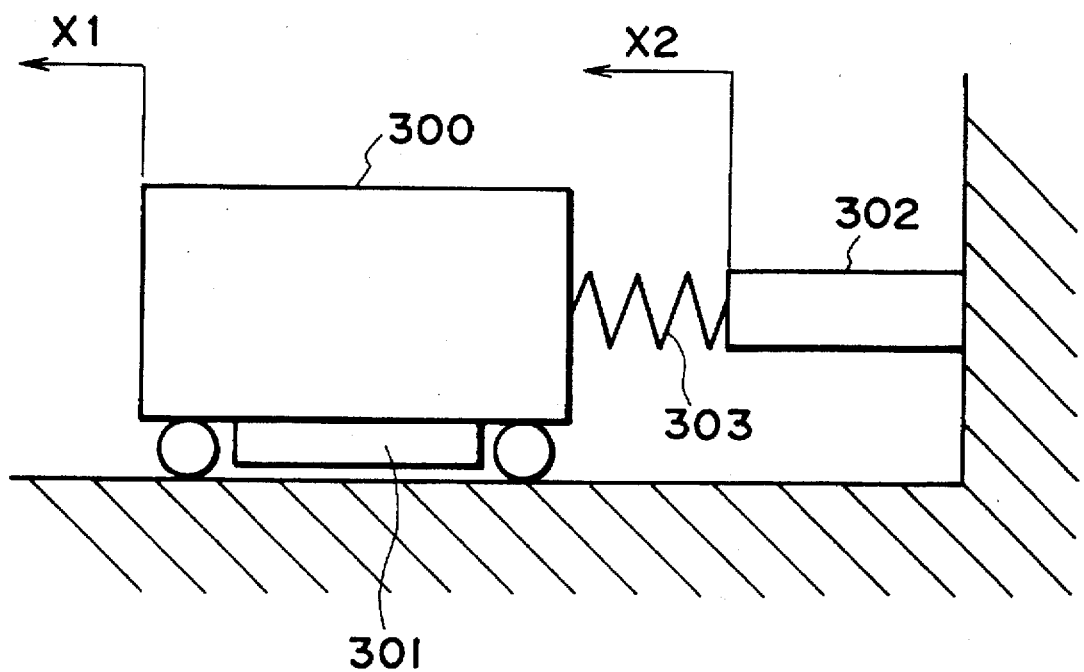
FIG. 3 is a schematic view for explaining the principle of operation of the movable stage device of FIG. 1.

The principle of positioning in this embodiment will be explained with reference to FIG. 3.

The structure of this embodiment described above is such as shown in FIG. 3 wherein a spring member 303 is disposed between a second driving means 302 and a movable stage 300.

For stepwise motion and positioning, for example, first energy such as a voltage for the stepwise motion of the stage is applied to the second driving means 302. In response, the second driving means produces a drive corresponding to the received energy, which drive is transmitted to the movable stage 300 through the spring member 303, whereby the movable stage 300 is moved stepwise. At this time, the output of a first driving means 301 is intercepted by a switch so that it produces no drive or, alternatively, it produces a limited, very small drive. Therefore, heat generation is sufficiently suppressed to a level that can be neglected. Also, the second driving means 320 does not generate heat or, if it generates heat, a cooling means is provided. Thus, substantially no thermal energy is transmitted to the movable stage 300.

During the stepwise motion, a control system for the second driving means executes open-loop control wherein the position is not fed back, or a semi-closed loop control wherein displacement of the second driving means 302 is fed back, whereby stable stepwise motion is assured.

Close to completion of the stepwise motion, the switch having intercepted the output of the first driving means 301 is turned to a side, connecting the output. In response, the first driving means 301 begins to produce a drive for the positioning (as a trigger for turning the switch, the stage position or the time may be used) or, alternatively, the drive having been limited to a very low level becomes contributable to the positioning. On the other hand, up to this moment, the second driving means 302 has become substantially stationary. However, due to the provision of the spring member 303 between the movable stage 300 and the second driving means 302, the position of the movable stage 300 can be controlled by the first driving means 301 within the range counteractable to the spring force of it. Since the control system executes closed-loop control wherein the stage position is fed back and since the first driving means 301 comprises a linear motor, a high mechanical rigidity system can easily be assured and high gain (high precision) and stable position control is ensured.

As regards heat generation during the positioning operation, the second driving means 302 does not generate heat or it is cooled. Moreover, the stepwise motion has already been finished. Therefore, heat generation if any is very low as compared with that during the stepwise motion. While the first driving means 301 needs a force effective to counteract to any disturbance, vibrating the movable stage 300, and effective to flex the spring member 303, since the amount of displacement during the positioning operation is very small (e.g., about 0.1 micron), heat generation resulting from production of such force is very small. Thus, it does not have an adverse effect on the stage 300.

Now, drive control for the first driving means (X linear motors 106A and 106B, and Y linear motors 107A and 107B) and the second driving means (X motor 108 and Y motors 109A and 109B) will be explained.

Since essentially the same explanation applies to the drive control in both of the X and Y directions, only the drive control in the X direction will now be explained.

First, referring to FIGS. 4 and 5(a) and 5(c), an example wherein drive control is executed with reference to the movement distance of the X stage 104 in the X direction, will be explained.

Figure 4:
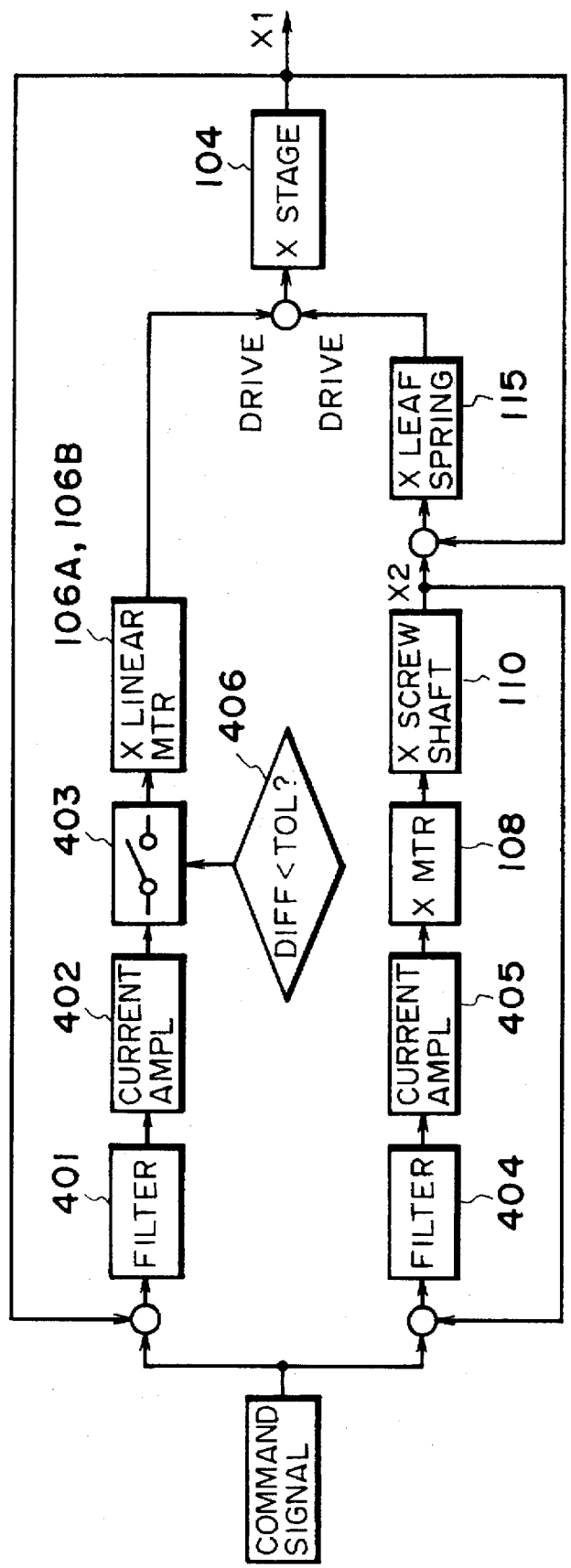
FIG. 4 is a block diagram of a first example of drive control in the movable stage device of FIG. 1.

FIG. 4 is a block diagram of drive control means of this example. FIGS. 5(a) through 5(c) are time charts, showing an example of control operation of the drive control means of FIG. 4, wherein the portion (a) shows the movement distance of the X stage 104 with respect to time, the portion (b) shows the timing of switching an interchange switch 403, and the portion (c) shows applied currents to the X linear motors 106A and 106B.

The drive control means of this example comprises two filters 401 and 402, two current amplifiers 402 and 405, an interchange switch 403 and a comparator 406.

An instruction signal corresponding to the movement distance of the X stage 104 to a target position (destination) is applied to the X motor 108 via the filter 404 and the current amplifier 405. In response, a drive of the X motor 208 is transmitted to the X stage 104 via the X screw shaft 110 and the X leaf spring 115, whereby the X stage 104 is moved.

The interchange switch 403 is a switch for turning on/off the application of drive current to the X linear motors 106A and 106B. When the switch 403 is connected, the instruction signal described above is applied to the X linear motors 106A and 106B through the filter 401 and the current amplifier 402.

The comparator 406 serves to discriminate whether the difference between the target position and the current position of the X stage 104, being moved by the X motor 108 is within a predetermined tolerable range or not and, if so, the switch 403 is turned into the connected state. The tolerable range is set in accordance with the spring force of the X leaf spring 115.

In the drive control means of this example, the X stage 104 is moved into the predetermined tolerable range of the target position through the stepwise motion thereof by the X motor 108. After this, the X linear motors 106A and 106B are driven to execute the final positioning. Since the tolerable range for the target position is set in accordance with the spring force of the X leaf spring 115, motion by the X linear motors 106A and 106B for the final positioning can be done easily.

Here, while couteracting the spring force, the X linear motors 106A and 106B should also provide a force effective to absorb any disturbance tending to cause vibration of the X stage 104. In the portion (c) of FIG. 5, the offset corresponds to the force acting against the spring force, and the amplitude of the current wave after the switching of the switch 403 corresponds to the force effective to absorb the disturbance. The same applies to some examples to be described later.

Referring now to FIGS. 6 and 7(a) through 7(c), an example wherein drive control is executed with reference to the driving time of the X stage 104 in the X direction, will be explained.

Figure 6:
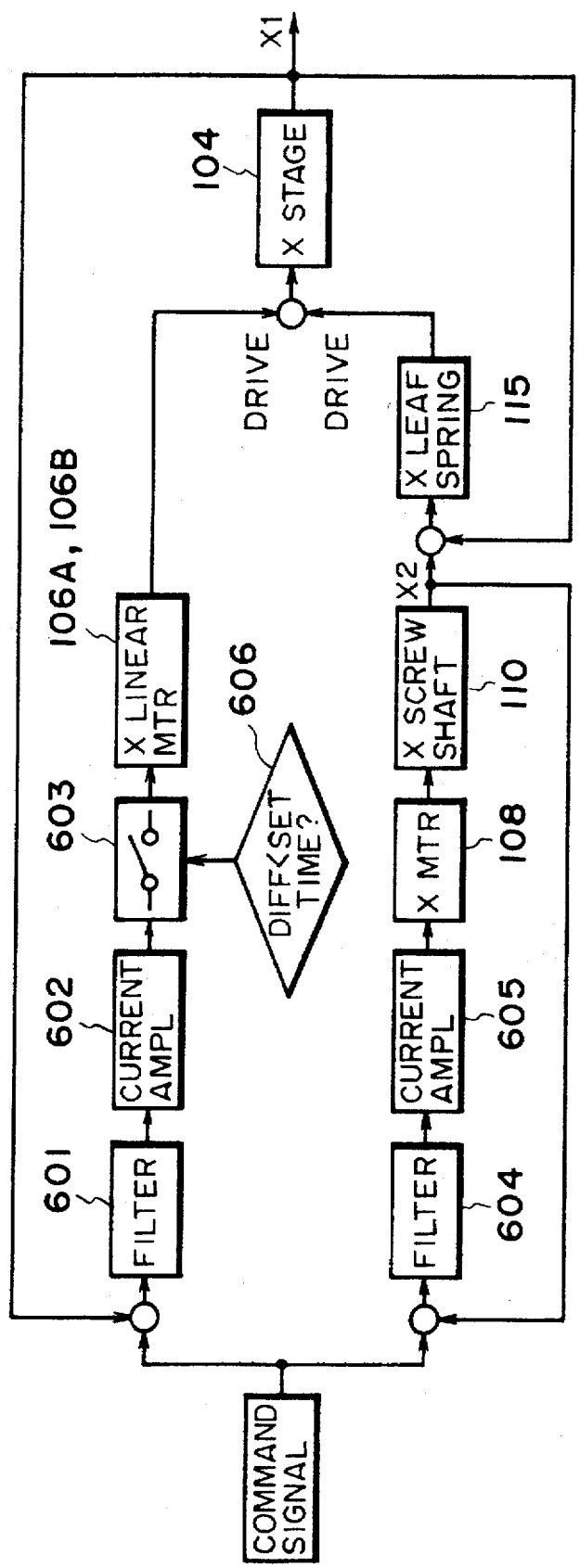
FIG. 6 is a block diagram of a second example of drive control in the movable stage device of FIG. 1.
Figure 7A:
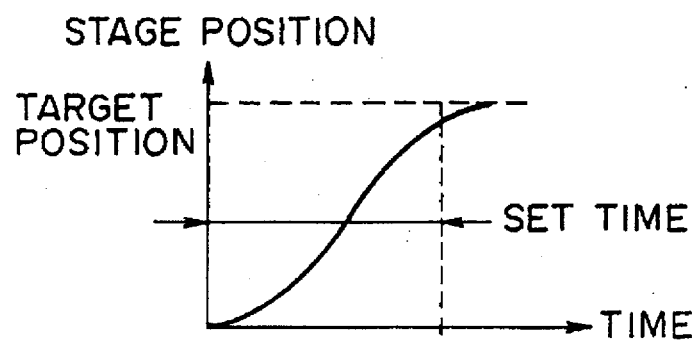
FIGS. 7(a) through 7(c) are time charts for explaining the operation of the drive control of the FIG. 6 example, wherein the portion (a) shows the position of the movable stage with respect to driving time, the portion (b) shows the timing for switching an interchange switch, and the portion (c) shows an applied current to a linear motor.
Figure 7B:
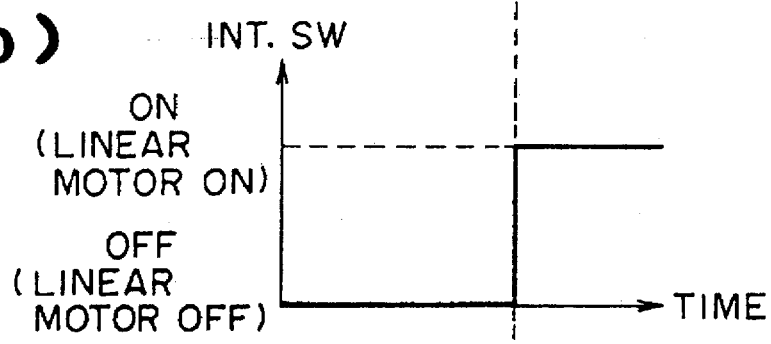
Figure 7C:
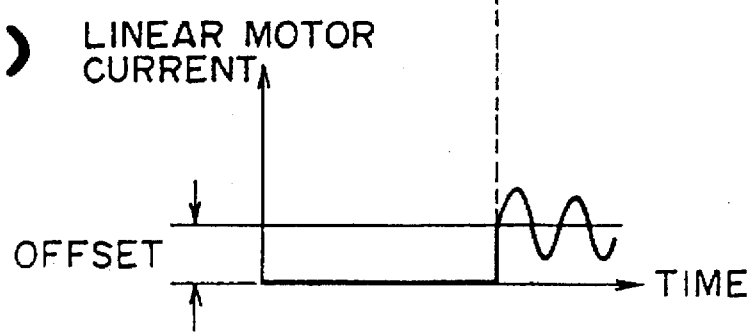

FIG. 6 is a block diagram of drive control means of this example. FIGS. 7(a) through 7(c) are time charts showing an example of control operation of the drive control means of FIG. 6, wherein the portion (a) shows the movement distance with respect to driving time, the portion (b) shows the timing for switching an interchange switch 603, and the portion (c) shows applied currents to the X linear motors 106A and 106B.

The drive control means of this example comprises two filters 601 and 604, two current amplifiers 602 and 605 and an interchange switch 603, like those of the FIG. 4 example, as well as a comparator 606.

In this example, the time in which the X stage 104 goes to and reaches a position adjacent to the target position in response to the application of a predetermined drive current to the X motor 108, is set beforehand as a set time. Then, in the comparator 606, the driving time of the X stage 104 by the X motor 108 is compared with the set time and, when the former exceeds the latter, the switch 603 is turned into its connected state. In response, electric currents are applied to the X linear motors 106A and 106B, to execute the final positioning operation.

Next, referring to FIGS. 8 and 9, an example wherein the X linear motors 106A and 106B are driven continuously until the X stage 104 reaches the target position, will be explained.

Figure 8:
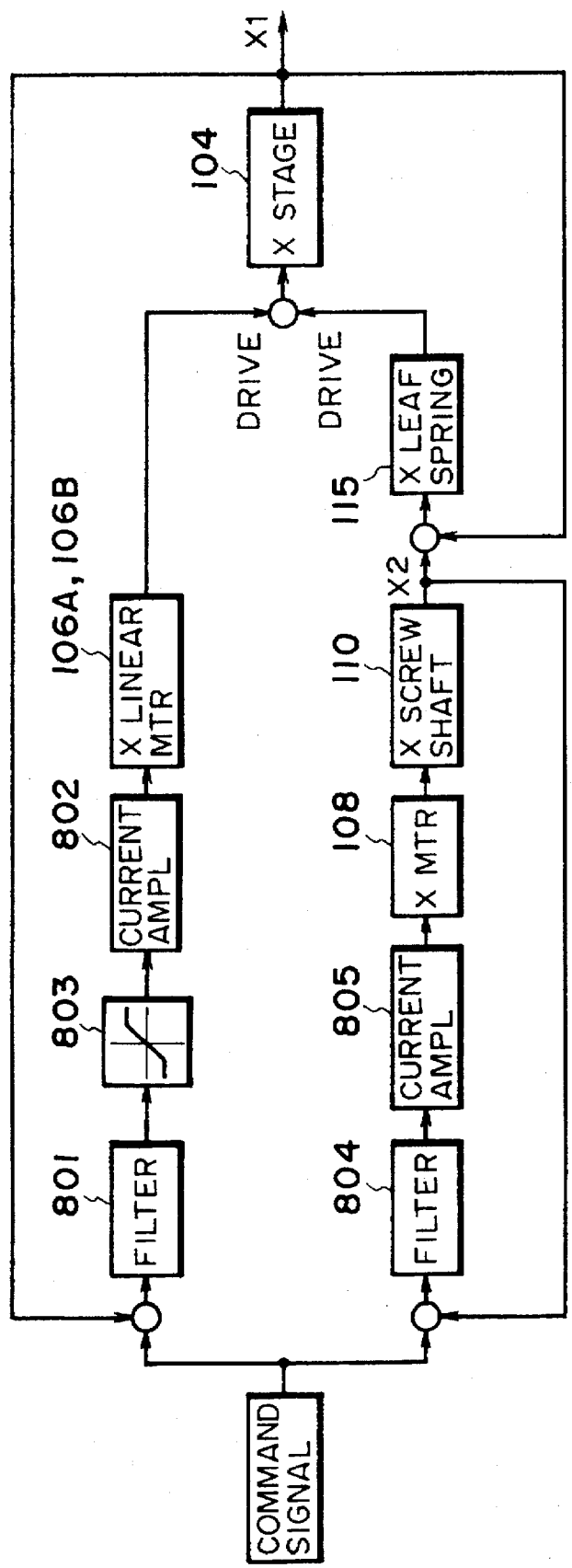
FIG. 8 is a block diagram of a third example of drive control in the movable stage device of FIG. 1.
Figure 9A:
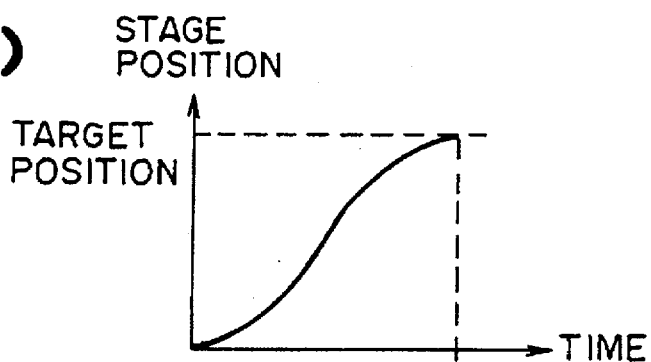
FIGS. 9(a) and 9(b) are time charts for explaining the operation of the drive control of the FIG. 8 example, wherein the portion (a) shows the position of the movable stage with respect to driving time, and the portion (b) shows an applied current to a linear motor.
Figure 9B:
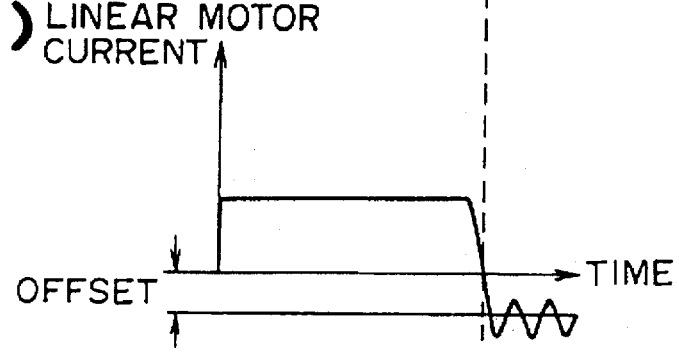
Figure 10:
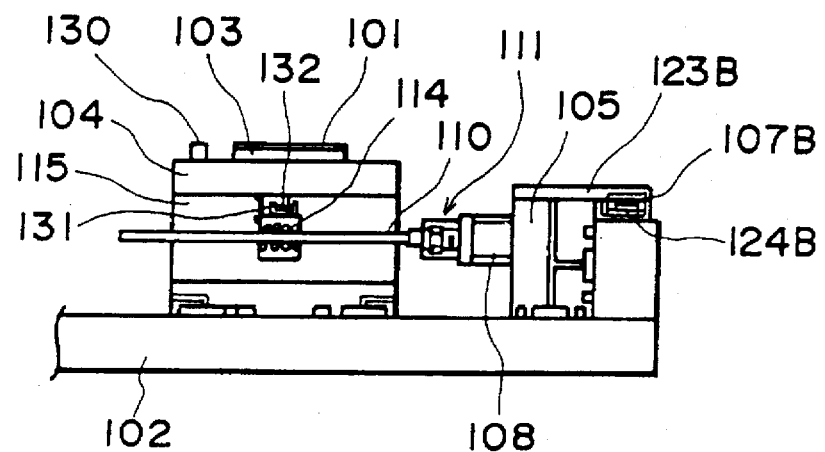
FIG. 10 is a sectional view of a modified form of the movable stage device of FIG. 1.

FIG. 8 is a block diagram of drive control means of this example. FIGS. 9(a) and 9(b) are time charts showing an example of control operation of the drive control means of FIG. 8, wherein the portion (a) shows the movement distance with respect to driving time, and the portion (b) shows applied currents to the X linear motors 106A and 106B.

The drive control means of this example comprises two filters 801 and 802 and two current amplifiers 802 and 805, like those of the FIG. 4 example, as well as a current limiter 803.

Since the linear motor is controlled by a closed loop wherein the stage position is continuously fed back, if the difference to the target position is large, a current is continuously applied in the direction of acceleration. Also in this case, the applied current to the X linear motors 106A and 106B is restricted by the current limiter 803. When the X stage 104 comes almost to the target position, the X motor 108 then produces substantially no drive and, on the other hand, the X linear motors 106A and 106B having been current-restricted by the current limiter become contributable to the positioning operation. Since the stage position is fed back to the X linear motors 106A and 106B only, in the neighborhood of the target position it is equivalent to control only by a closed loop through the X linear motors 106A and 106B. The final positioning operation is made in this state.

In this example, the drive current applied to the X linear motors 106A and 106B is restricted by the current limiter 803 and, therefore, the drive therefrom is very small. However, with the stoppage of the X motor 108, they contribute to the positioning, within the range counteractable to the spring force of the X leaf spring 115.

In this example, the maximum level of the electric current to be applied to the X linear motors 106A and 106B is set approximately at the same level of the sum of (i) the current corresponding to the force absorbing any disturbance, tending to cause vibration of the X stage 104 and (ii) the current corresponding to the force which can be determined by the product of positioning error (a few microns) by the X motor 108 with the spring constant of the leaf spring 115. As compared with the current for the stepwise motion, this level is very low as can be neglected.

In the embodiment described above, it is possible that the X leaf spring 115 deforms due to continuous application of stress thereto, during the stepwise motion and final positioning of the X stage 104.

In consideration of this possibility, a clutch 131 and a driving plate 132 are provided between the X stage 104 and the X nut 114, engaging with the X screw shaft 110 coupled to the X motor 108, such that the X stage 104 and the X nut 114 are fixed during the stepwise motion period in which a large stress is applied to the X leaf spring 115. This assures that stress is applied to the X leaf spring 115 only during the final positioning operation, thus avoiding deformation of the X leaf spring 115 as well as overshooting of the X stage 104. The same applies to the Y stage 105 side.

Second Embodiment

Figure 11:
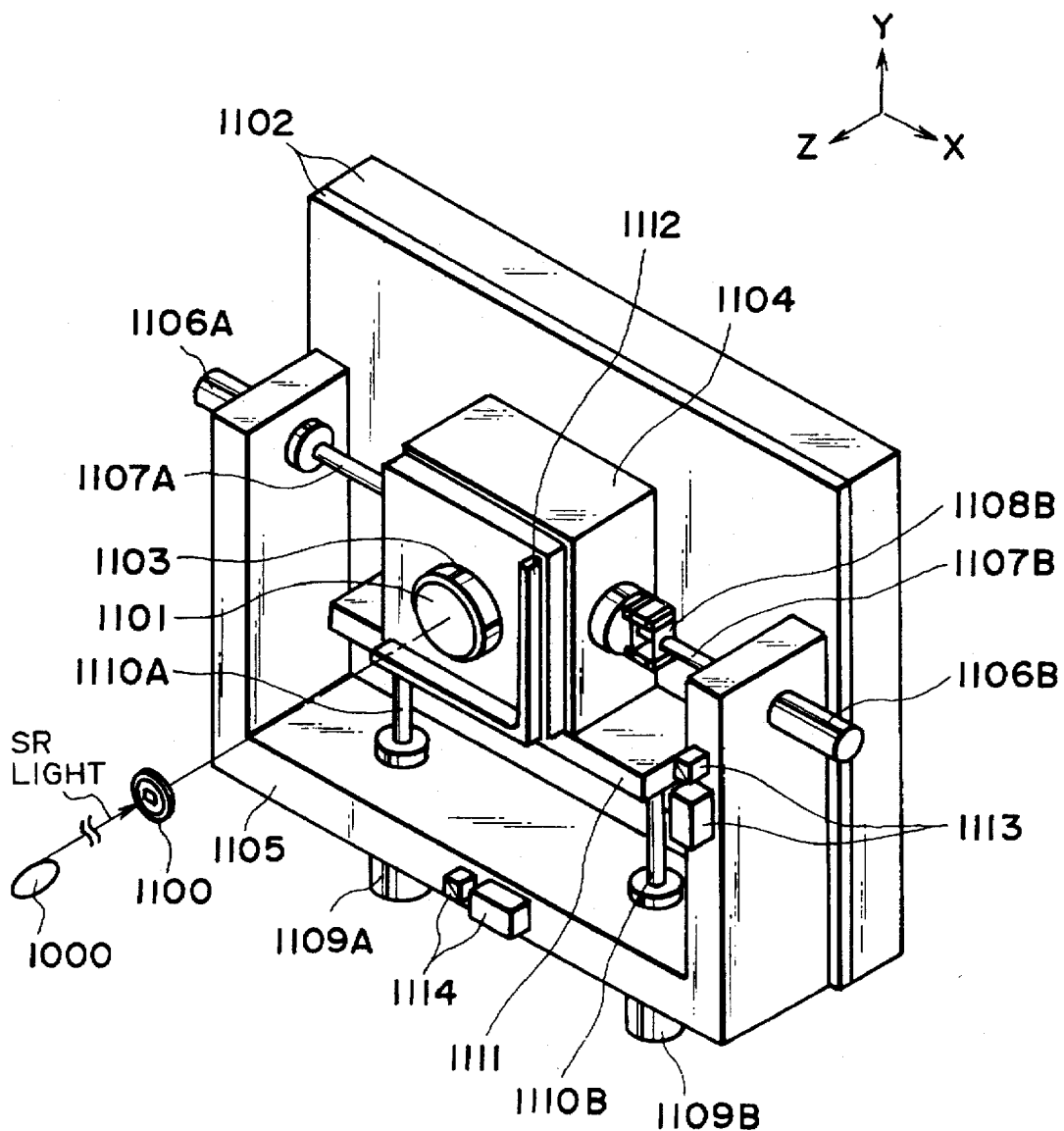
FIG. 11 is a perspective view of a movable stage device according to a second embodiment of the present invention.
Figure 12:
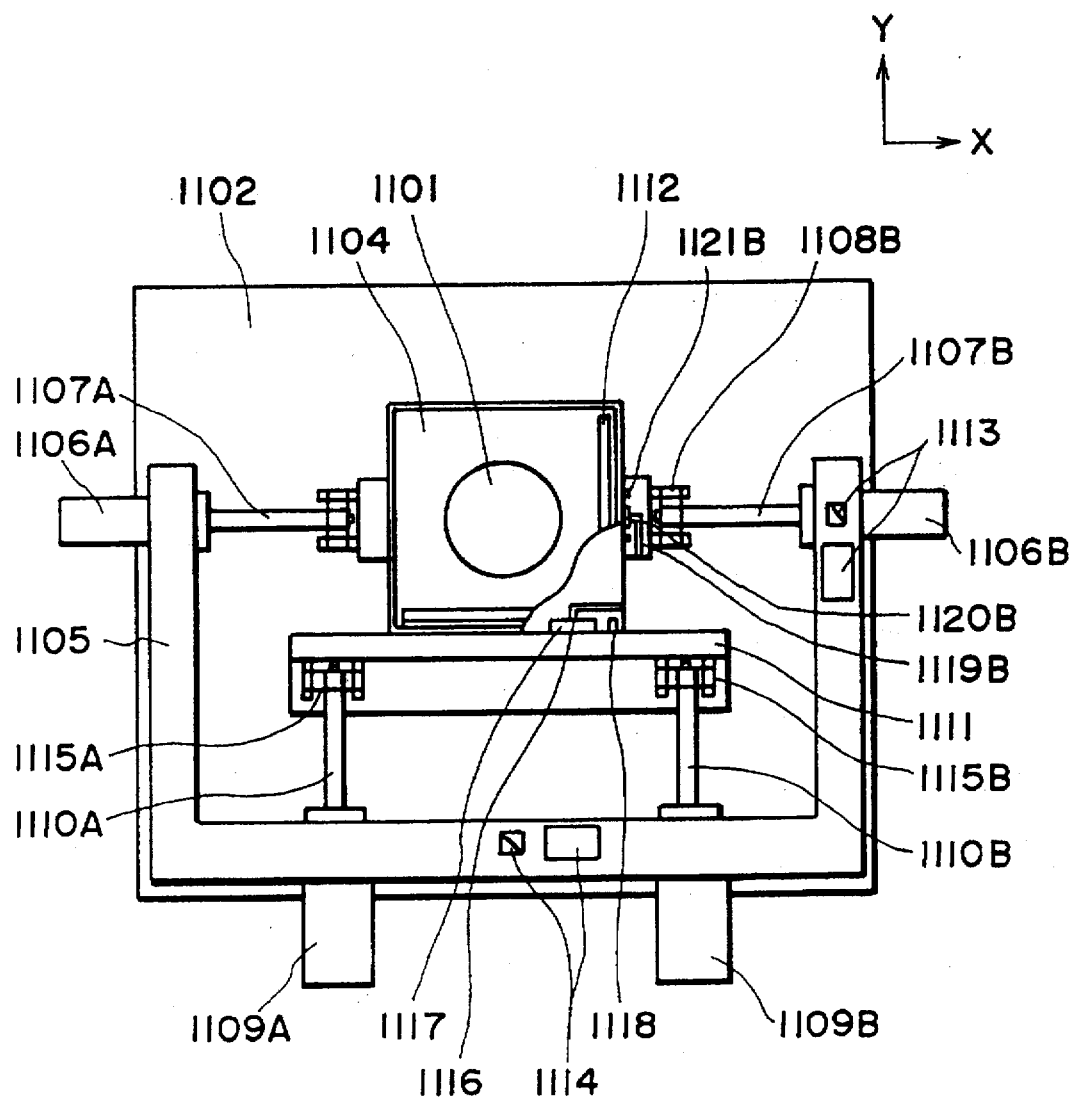
FIG. 12 is a front view of the movable stage device of FIG. 11.

Referring to FIGS. 11–13, a second embodiment of the present invention will be explained.

Figure 13A:
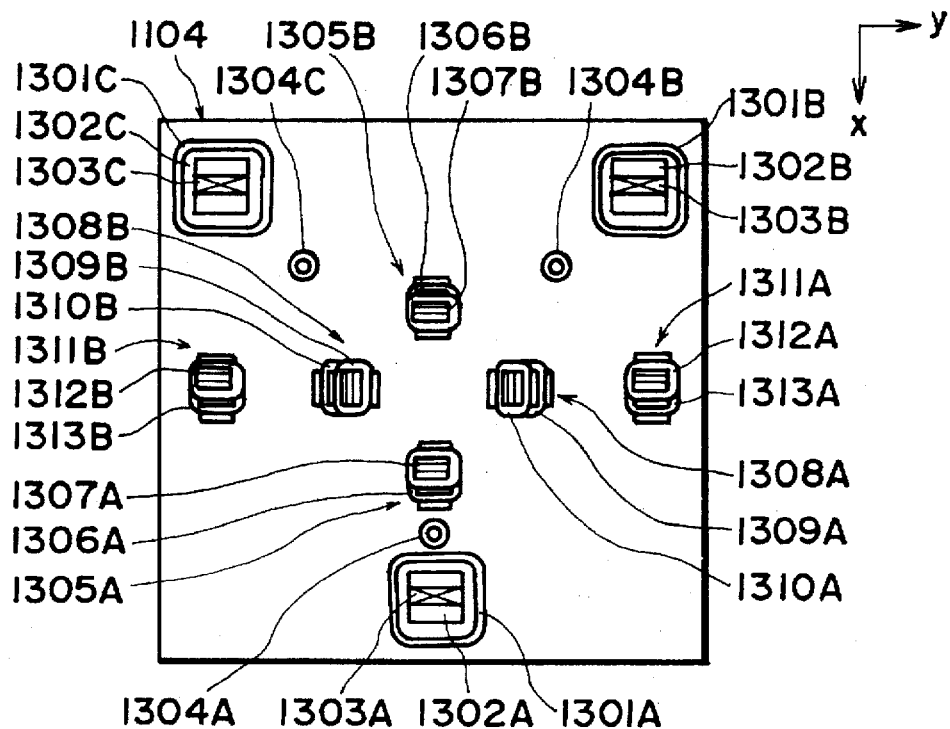
Figure 13B:
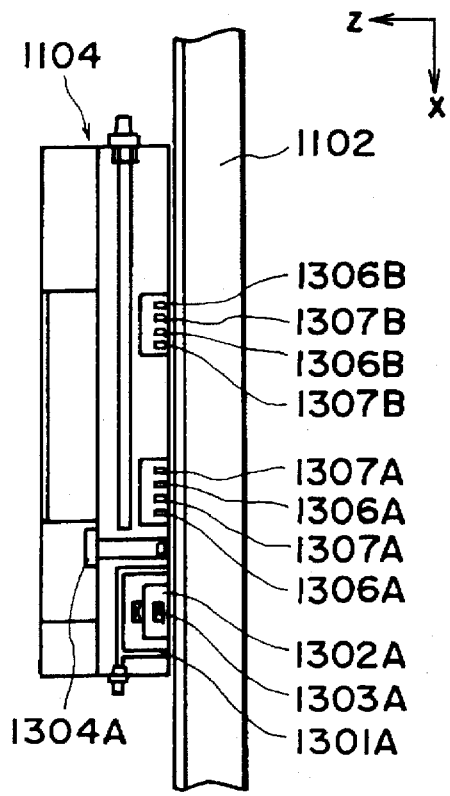

FIG. 11 is a perspective view of a movable stage device of this embodiment. FIG. 12 is a front view of the movable stage device of FIG. 11. FIGS. 13A and 13B show a first driving means of this embodiment, wherein FIG. 13A is a front view and FIG. 13B is a longitudinal section.

Like the first embodiment, the movable stage device of the present embodiment is incorporated as an alignment device into an SOR X-ray exposure apparatus, for positioning a wafer 1101 with respect to SR light emitted from an SOR ring (X-ray source) 1000 and passed through a mask 1100.

In this embodiment, the stage device comprises first driving means including X induction motors 1305A and 1305B, Y induction motors 1308A and 1308B and θ induction motors 1311A and 1311B, for position adjustment with respect to X, Y and θ ($w_X$, $w_Y$ and $w_Z$) directions, as well as second driving means including X electric cylinders 1106A and 1106B and Y electric cylinders 1109A and 1109B.

The wafer 1101 is held by attraction by a wafer chuck 1103 which is disposed on an X-Y stage 1104 mounted on an X assist base 1111.

The X assist base 1111 is supported in the Y direction, through Y parallel leaf springs 1115A and 1115B, by Y electric cylinder rods 1110A and 1110B of the Y electric cylinders 1109A and 1109B which are mounted on the bottom of a cylinder mounting base 1105 which in turn is mounted on a stage base 1102.

The X-Y stage 1104 is supported at its opposite sides through X parallel leaf springs 1108A and 1108B by X electric cylinder rods 1107A and 1107B of X electric cylinders 1106A and 1106B mounted to the opposite sides of the cylinder mounting base 1105, respectively.

Mounted on the face of the X-Y stage 1104 contacting with the X assist base 1111, is an X static pressure bearing 1117 having an X static pressure bearing pressurizing system 1116 and an X preloading magnet 1118. Further, mounted to the portions of the X electric cylinder rods 1107A and 1107B contacting the X-Y stage 1104, are Y static pressure bearings 1120A and 1120B, respectively, having Y static pressure bearing pressurizing systems 1119A and 1119B and Y preloading magnets 1121A and 1121B, respectively (elements 1119A, 1120A and 1121A are not shown).

Also in this embodiment, for measurement of the position of the X-Y stage 1104, the movable stage device is provided with a square mirror 1112, an X-axis laser interferometer unit 1113 and a Y-axis laser interferometer unit 1114.

Now, the first driving means of this embodiment will be explained.

The X induction motors 1305A and 1305B, the Y induction motors 1308A and 1308B, and the θ induction motors 1311A and 1311B, constituting the first driving means, are mounted on the face of the X-Y stage 1104 contacting with the stage base 1102.

The X induction motors 1305A and 1305B are of the same structure, and they include first coils 1306A and 1306B and second coils 1307A and 1307B, respectively. Similarly, the Y induction motors 1308A and 1308B comprise first coils 1309A and 1309B and second coils 1310A and 1310B, respectively. The θ induction motors 1311A and 1311B comprise first coils 1312A and 1312B and second coils 1313A and 1313B, respectively.

Mounted at three sites on the face of the X-Y stage 1104 contacting with the stage base 1102, are static pressure bearings having pressurized air discharging pads 1301A, 1301B and 1301C, electromagnet cores 1302A, 1302B and 1302C, and coils 1303A, 1303B and 1303C. Also, in association with these elements, three gap sensors 1304A, 1304B and 1304C are provided. These components cooperate with each other to maintain a predetermined gap to the X-Y stage, in the Z direction.

The final positioning through the induction motors 1305A, 1305B, 1308A, 1308B, 1311A and 1311B of X, Y and θ directions, is executed after the stepwise motion through the electric cylinders 1106A, 1106B, 1109A and 1109B of the X and Y directions. Since they operate substantially in the same manner, only the operation of the X induction motor 1305 will now be explained.

AC current is applied to the first coil 1306A, and AC current having a phase delay of 90 deg. to the current applied to the first coil is applied to the second coil 1307A. On that occasion, the peak of magnetic flux produced at each of the first and second coils 1306A and 1307A advances in the negative X direction. In response, an eddy current is generated in a good conductor of the stage base 1102. Due to cooperative action of this eddy current and the magnetic flux produced in response to the application of AC current to the first and second coils 1306A and 1307A, the X-Y stage 1104 moves in the positive X direction. On the other hand, the motion in the negative X direction is attainable by inverting the phase of the electric current to be applied to the first and second coils 1306A and 1307A.

For controlling the position in the X and Y directions and the angle in the θ direction, the difference between the target position and the current position as well as the angle, as measured by using laser interferometers 1113 and 1114 of the X, Y and θ axes (the one related to the θ axis is not shown), are calculated and fed back to the associated induction motors described above.

While in this embodiment three gap sensors are used for adjusting the gap in the Z direction while detecting the same, an autofocusing type sensor means may be provided between a mask and a wafer so as to directly measure the gap.

Third Embodiment

Figure 15:
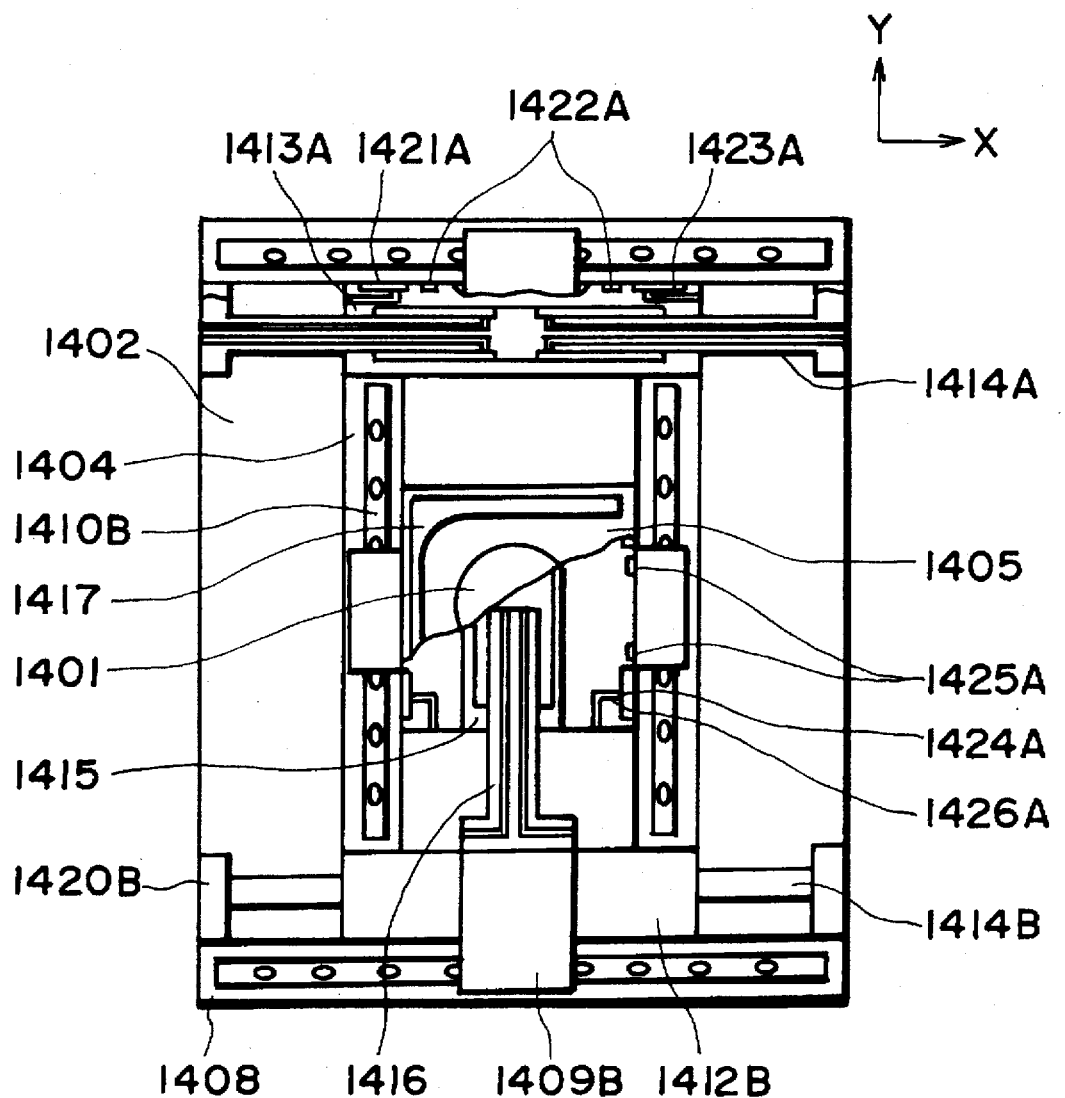
FIG. 15 is a front view of the movable stage device of FIG. 14.

Referring now to FIGS. 14 and 15, a third embodiment of the present invention will be explained.

FIG. 14 is a perspective view of a movable stage device of this embodiment, and FIG. 15 is a front view thereof.

Like the preceding embodiments, in this embodiment the invention is applied to an alignment system in an SOR X-ray exposure apparatus, for positioning a wafer 1401 with respect to SR light emitted from an SOR ring (X-ray source) 1000 and passed through a mask 1400.

The movable stage device of this embodiment comprises a first driving means including X linear motors 1406A and 1406B and Y linear motors 1407A and 1407B, of similar structure as of the first embodiment, and a second driving means including two X non-contact air cylinders 1413A and 1413B reciprocally movable in the X direction and a Y non-contact air cylinder 1415 with respect to the Y direction.

Figure 16:
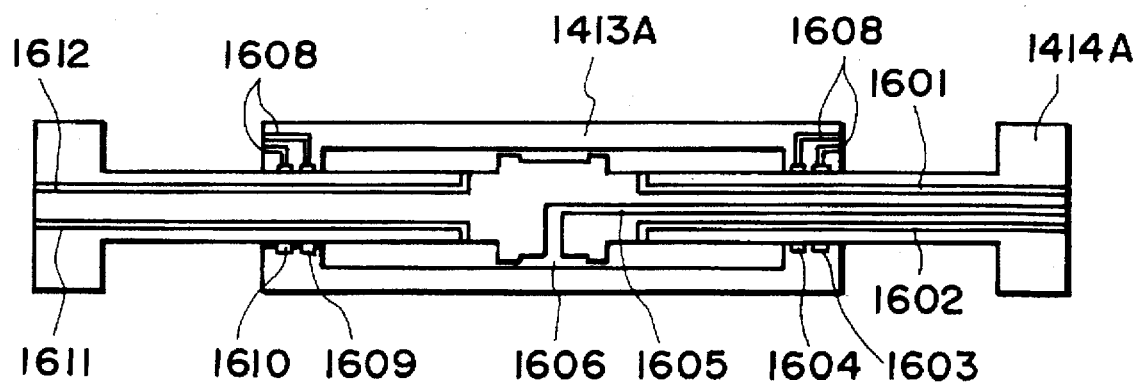
FIG. 16 is a sectional view, showing an example of second X-axis driving means of the movable stage device of FIG. 14.
Figure 17:
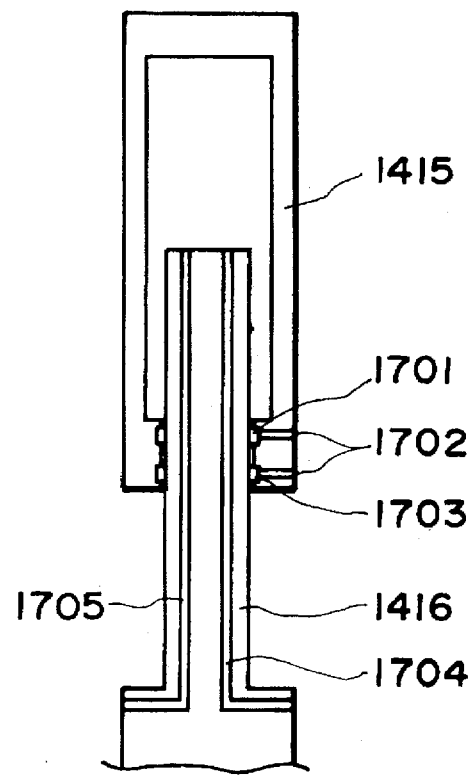
FIG. 17 is a sectional view, showing an example of second Y-axis driving means of the movable stage device of FIG. 14.

FIGS. 16 and 17 each show an example of the structure of the X non-contact air cylinder 1413A (1413B) or the Y non-contact air cylinder 1415.

In this embodiment, an X stage 1404 and a Y stage 1405 are moved approximately up to their target positions through stepwise motion of the X non-contact air cylinders 1413A and 1413B and the Y non-contact air cylinder 1415. After this, the X linear motors 1406A and 1406B and the Y linear motors 1407A and 1407B operate to execute the final positioning. Here, while this embodiment does not use leaf spring means such as of the first or second embodiment, resiliency is provided between the X and Y stages 1404 and 1405 due to the air within the X non-contact air cylinders 1413A and 1413B and the Y non-contact air cylinder 1415. As a result, within a range counteractable to the compressiveness/expansiveness of the air, the X linear motors 1406A and 1406B as well as the Y linear motors 1407A and 1407B can operate to execute the positioning. Namely, the air in the air cylinders serve as a spring means.

The principle of positioning operation in this embodiment will be explained with reference to FIG. 18.

For stepwise motion and positioning, for example, first, air is supplied to a second driving means 1806 so as to move a movable stage 1805 stepwise. In response, the second driving means produces a drive corresponding to the amount of supplied air, and moves the movable stage 1805 stepwise. Here, the output of a first driving means 1807 is intercepted by a switch so that it does not produce a drive at all or, alternatively, a small drive limited to very low level is produced. Thus, heat generation is suppressed sufficiently to a level that can be neglected. Since the second driving means 1806 is an air cylinder, no heat is generated thereby.

During the stepwise motion, an air cylinder control system provides an open loop control wherein the stage position is not directly fed back or a semi-closed loop control wherein the flow rate of air or the cylinder inside pressure is fed back. Thus, stable stepwise motion is assured. Accelerating an air cylinder needs supply of air and, on the other hand, decelerating it needs discharge of the air. For this reason, in the air cylinder, an interchange valve 1803 is used to interchange a pressure source and a vacuum source appropriately during the stepwise motion to control the direction of air flow.

As the stepwise motion is coming to the end, the switch having intercepted the output of the first driving means 1807 is turned to the side connecting that output. In response, the first driving means 1807 begins to produce a drive for the positioning (as a trigger for switching this switch, the stage position or the time may be used). Alternatively, the drive having been limited to a very low level becomes contributable to the positioning. On the other hand, since up to this moment the flow of air into and out of the air cylinder has been reduced substantially to zero, it is possible to control the position of the first driving means 1807 within a range counteractable to the compressiveness/expansiveness of air. Also, the control system executes closed loop control in which the stage position is fed back, and the first driving means 1807 comprises a linear motor. Thus, it is easily possible to provide a system of high mechanical rigidity and to assure high gain (high precision) and stable position control.

As regards the heat generation during the positioning operation, the air cylinder does not generate heat as so during the stepwise motion. While the linear motor needs a force counteractable to disturbance causing vibration of the stage as well as a force counteractable to the compressiveness/expansiveness of the cylinder inside air, since the amount of displacement during the positioning operation is very small (e.g., about 0.1 micron), heat generation resulting from production of such forces is very small. Thus, it does not adversely affect the movable stage 1805.

Further, the force counteractable to the compressiveness/expansiveness of air can be reduced by communicating the air cylinder with a constant pressure large capacity chamber, in the positioning operation.

Next, drive control means for the first driving means (X linear motors 1406A and 1406B and Y linear motors 1407A and 1407B) and the second driving means (X non-contact air cylinders 1413A and 1413B and Y non-contact air cylinder 1415) of the present embodiment will be explained.

Since essentially the same explanation applies to the drive control in both of the X and Y directions, only the drive control in the X direction will now be explained.

First, referring to FIGS. 19 and 20(a) through 20(c), an example wherein drive control is executed with reference to the movement distance of the X stage 1404 in the X direction, will be explained.

Figure 19:
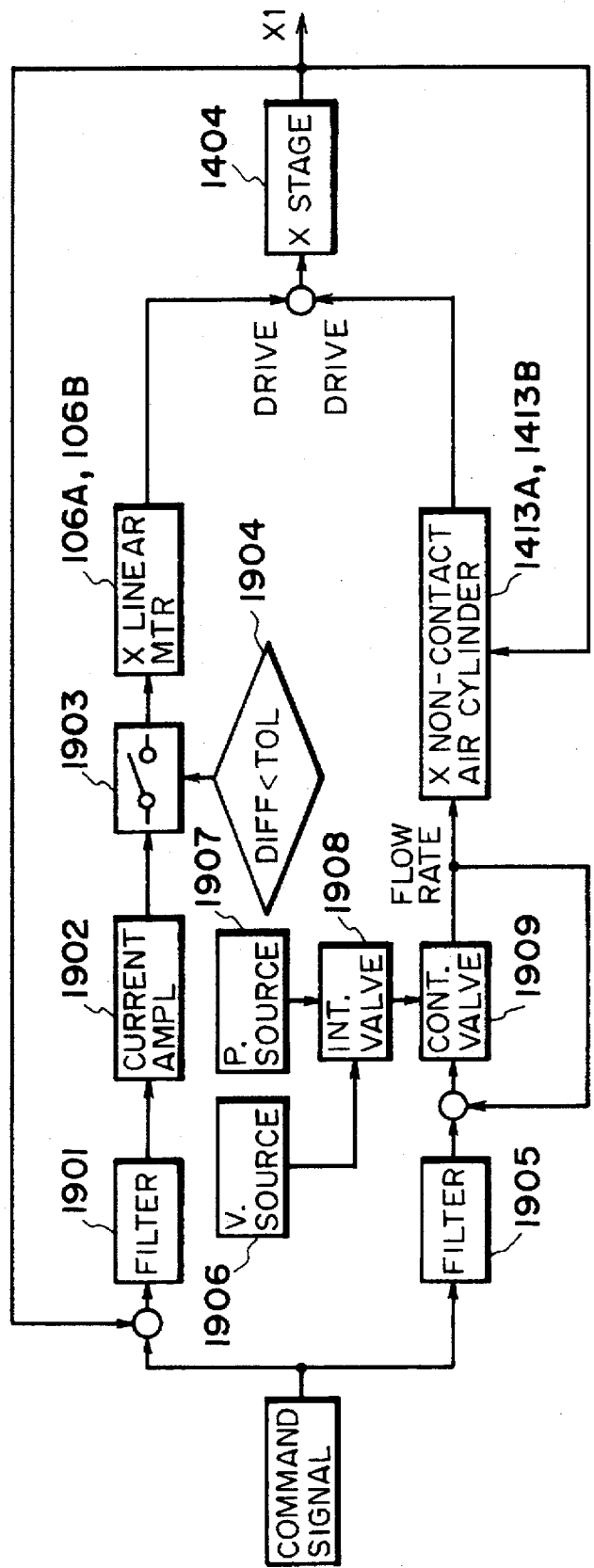
FIG. 19 is a block diagram of a first example of drive control in the movable stage device of FIG. 14.
Figure 20A:
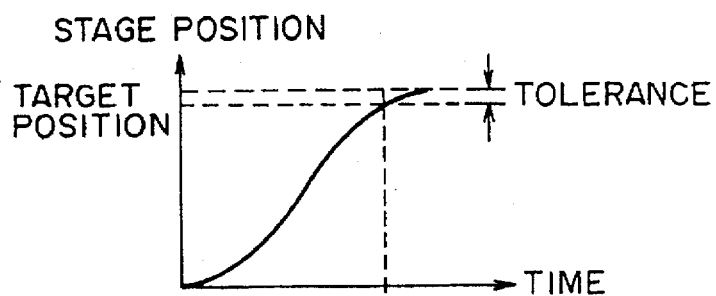
FIGS. 20(a) through 20(c) are time charts for explaining the operation of the drive control of the FIG. 19 example, wherein the portion (a) shows the position of the movable stage with respect to driving time, the portion (b) shows the timing for switching an interchange switch, and the portion (c) shows an applied current to a linear motor.
Figure 20B:
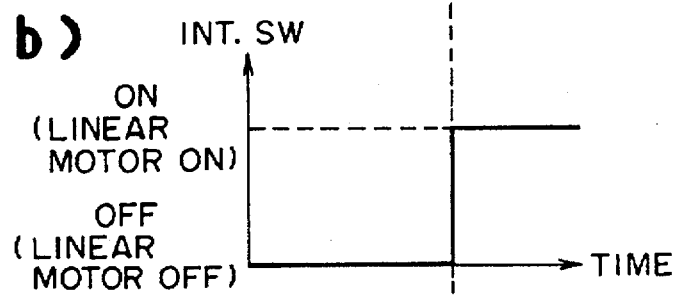
Figure 20C:
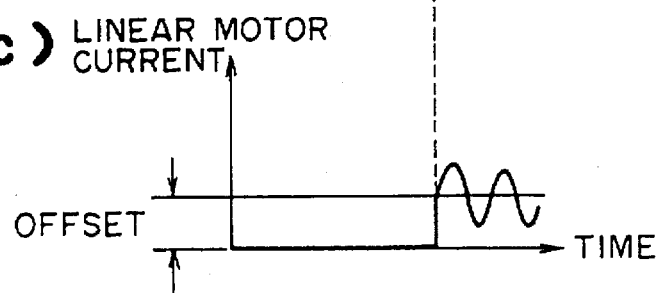

FIG. 19 is a block diagram of drive control means of this example. FIGS. 20(a) through 20(c) are time charts, showing an example of control operation of the drive control means of FIG. 19, wherein the portion (a) shows the movement distance of the X stage 1404 with respect to time, the portion (b) shows the timing of switching an interchange switch 1903, and the portion (c) shows applied currents to the X linear motors 1406A and 1406B.

In this example, the stepwise motion is provided by supplying/discharging air to or out of the X non-contact air cylinders 1413A and 1413B, from a vacuum source 1906 or a pressure source 1907 through an interchange valve 1908 and a control valve 1909. During the stepwise motion, the position of the X stage 1404 is compared with the target position by a comparator 1904 and, as the difference therebetween comes into a predetermined tolerable range, a switch 1903 is turned into its connected state, whereby application of currents to the X linear motors 1406A and 1406B is started.

In this example, the tolerance to the X stage with respect to the target position is determined in accordance with the compressiveness/expansiveness of air inside the X noncontact air cylinders 1413A and 1413B. Thus, the motion for the final positioning by the X linear motors 1406A and 1406B can be done easily. Here, while compressing/expanding the air and couteracting the reactive force thereof, the X linear motors 1406A and 1406B should also provide a force effective to absorb any disturbance tending to cause vibration of the X stage 1404. In the portion (c) of FIG. 20, the offset corresponds to the force acting against the air pressure, and the amplitude of the current wave after the switching of the switch 1903 corresponds to the force effective to absorb the disturbance. The same applies to some examples to be described later.

Referring now to FIGS. 21 and 22(a) through 22(c), an example wherein drive control is executed with reference to the driving time of the X stage 1404 in the X direction, will be explained.

Figure 21:
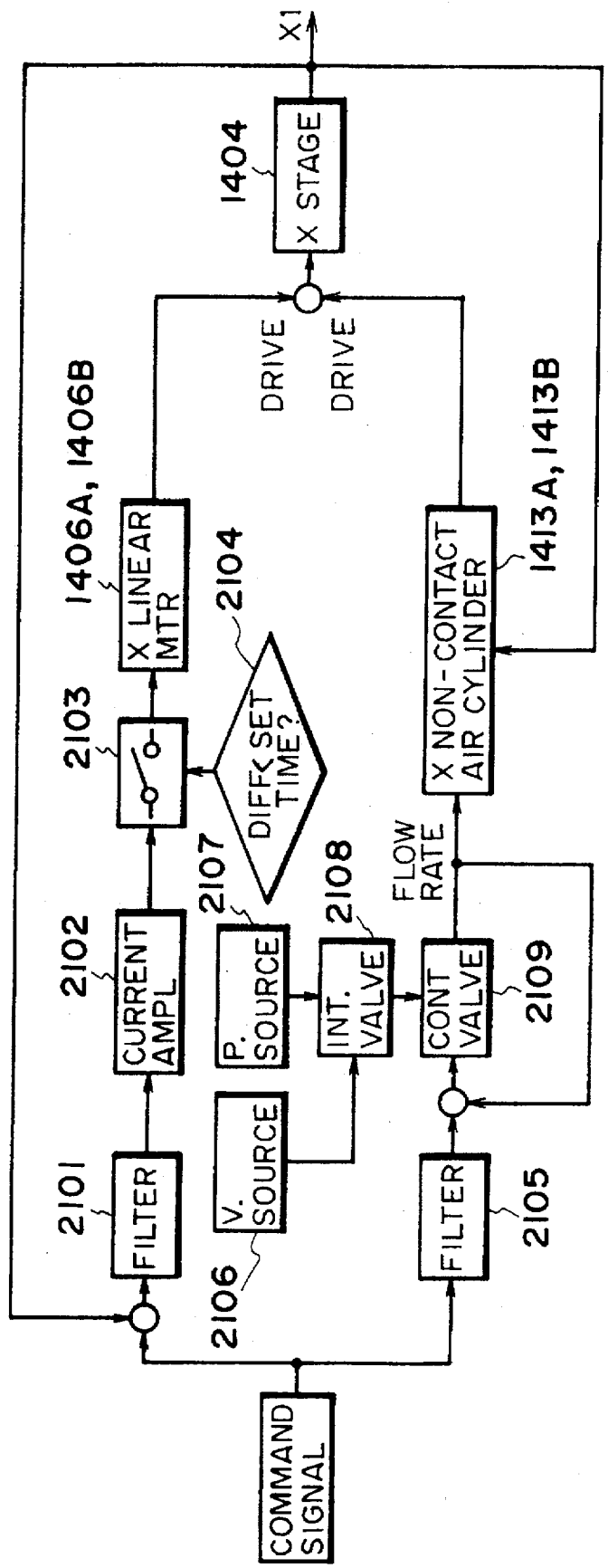
FIG. 21 is a block diagram of a second example of drive control in the movable stage device of FIG. 14.
Figure 22A:
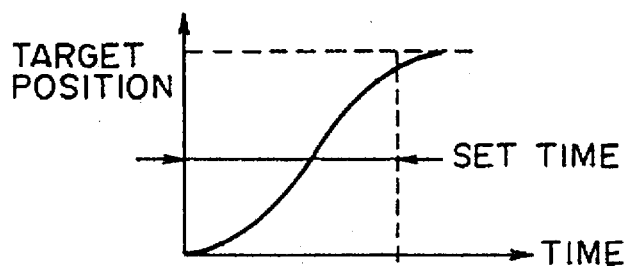
FIGS. 22(a) through 22(c) are time charts for explaining the operation of the drive control of the FIG. 21 example, wherein the portion (a) shows the position of the movable stage with respect to driving time, the portion (b) shows the timing for switching an interchange switch, and the portion (c) shows an applied current to a linear motor.
Figure 22B:
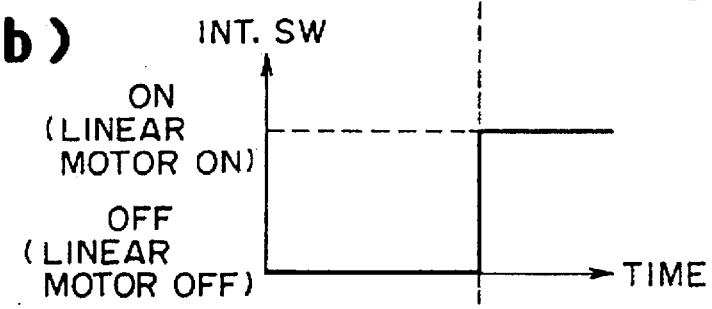
Figure 22C:
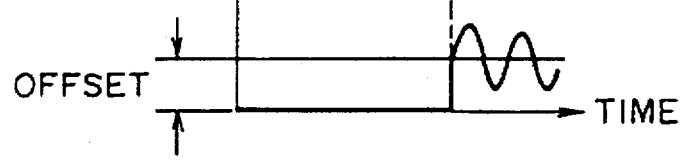

FIG. 21 is a block diagram of drive control means of this example. FIG. 22(a) through 22(c) are time charts showing an example of control operation of the drive control means of FIG. 21, wherein the portion (a) shows the movement distance with respect to driving time, the portion (b) shows the timing for switching an interchange switch 2103, and the portion (c) shows applied currents to the X linear motors 1406A and 1406B.

In this example, the stepwise motion is provided substantially in the same manner as the preceding example wherein the motion is controlled with reference to the movement distance.

In this example, the switch 2103 is turned to apply drive currents to the X linear motors 1406A and 1406B, in response to discrimination by a comparator 2104 which compares the driving time of the X stage 1404 with a predetermined set time (in which it is expected that the stage reaches the target position) and which discriminates, on the basis of the comparison, that the driving time exceeds the set time. This enables transition to the final positioning operation, at the moment whereat the X stage 1404 comes approximately to the target position. Also in this example, the set time is determined in accordance with the compressiveness/expansiveness of air inside the X noncontact air cylinders 1413A and 1413B.

Next, referring to FIGS. 23 and 24(a) and 24(b), an example wherein the X linear motors 1406A and 1406B are driven continuously until the X stage 1404 reaches the target position, will be explained.

FIG. 23 is a block diagram of drive control means of this example. FIGS. 24(a) and 24(b) are time charts showing an example of control operation of the drive control means of FIG. 23, wherein the portion (a) shows the movement distance with respect to driving time, and the portion (b) shows applied currents to the X linear motors 1406A and 1406B.

The drive control means of this example operates in a similar way as the drive control means of the first embodiment, described with reference to FIG. 8. During the stepwise motion, drive currents are continuously applied to the X linear motors 1406A and 1406B while the currents are limited by a current limiter 2303. As the X stage 1404 comes approximately to the target position and the stepwise motion is finished, the drives of the X linear motors 1406A and 1406B become contributable to the positioning operation.

Next, a modified form of this embodiment will be explained with reference to FIG. 25.

Figure 18:
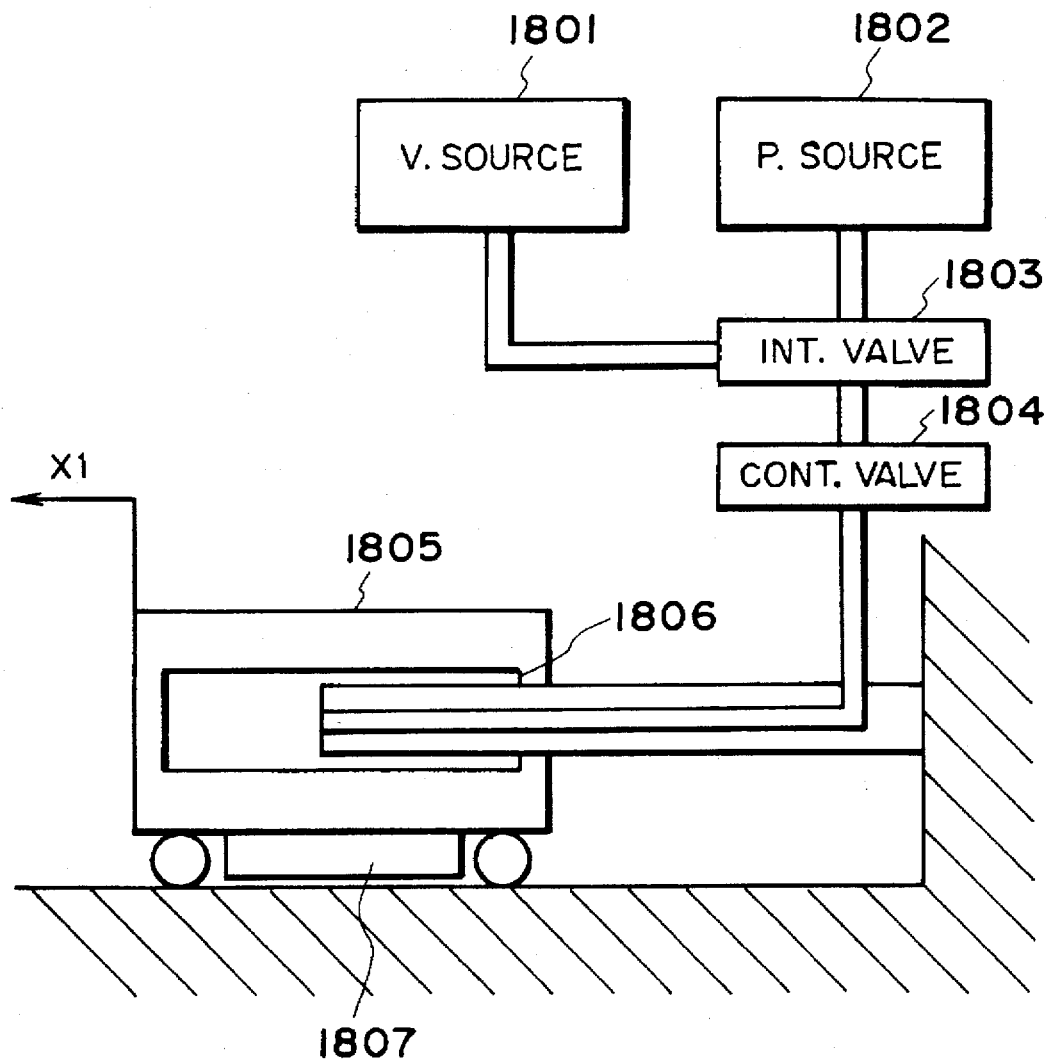
FIG. 18 is a schematic view for explaining the principle of operation of the movable stage device of FIG. 14.

In this example, a constant pressure large capacity chamber 2509 is connected through an interchange valve 2508 to the counter air-cylinder (counter second driving means) side of the movable stage as shown in FIG. 18. By opening the valve 2508, the chamber 2509 can be communicated with an air cylinder 2506.

Referring now to FIGS. 26 and 27(a) through 27(f), drive control means for air cylinders and linear motors such as those of the movable stage device of the structure described above, will be explained.

Figure 26:
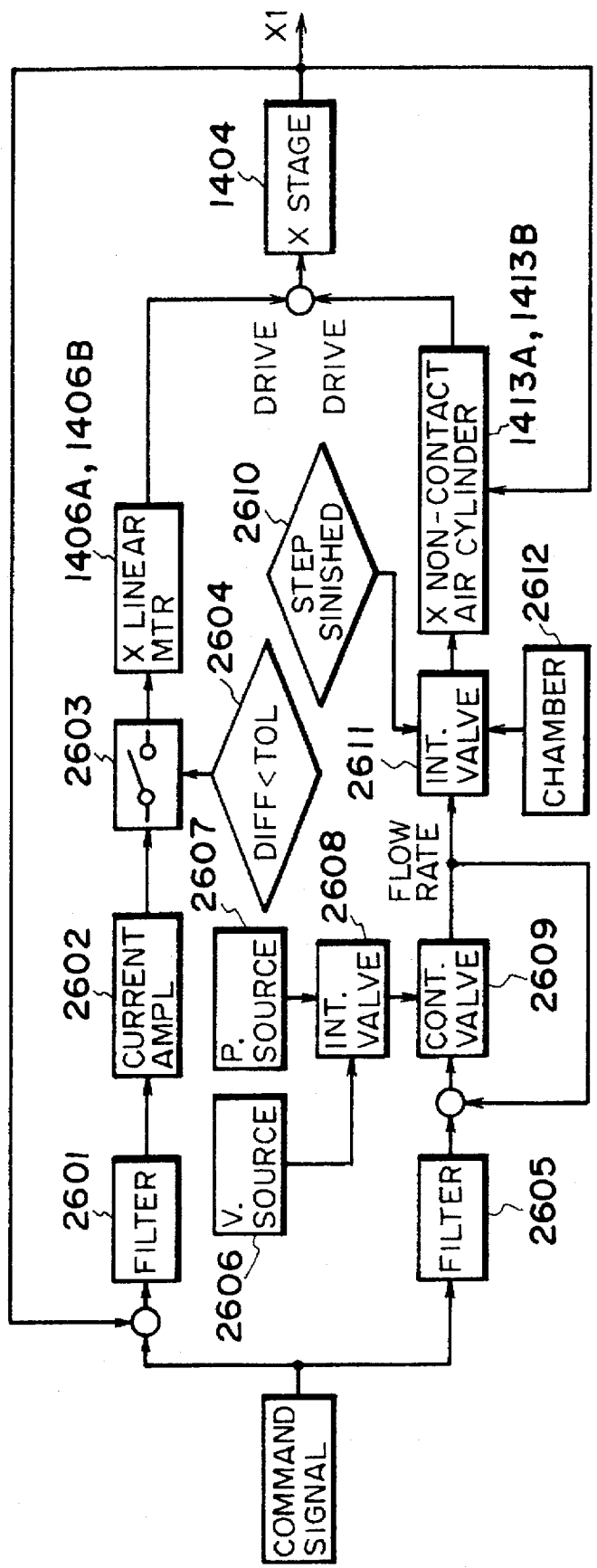
FIG. 26 is a block diagram of an example of drive control in the movable stage device of FIG. 25.
Figure 27A:
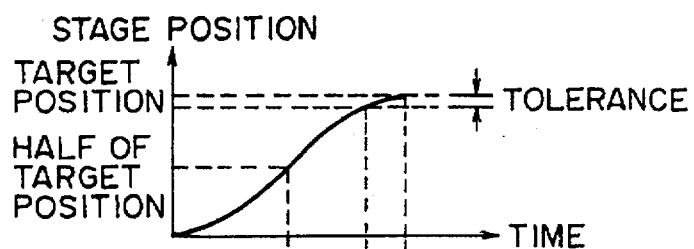
FIGS. 27(a) through 27(f) are time charts for explaining the operation of the drive control of the FIG. 26 example, wherein the portion (a) shows the position of the movable stage with respect to driving time, the portion (b) shows the timing for switching an interchange switch, the portion (c) shows an applied current to a linear motor, the portion (d) shows changes in pressure within an air cylinder, the portion (e) shows the timing for switching an interchange valve, and the portion (f) shows changes in rigidity of the air cylinder.
Figure 27B:
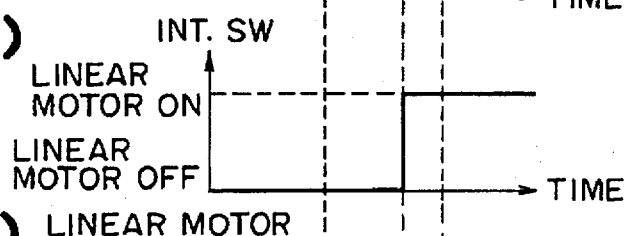
Figure 27C:
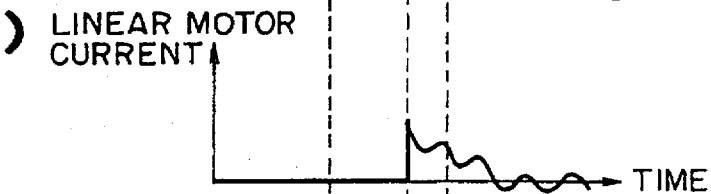
Figure 27D:
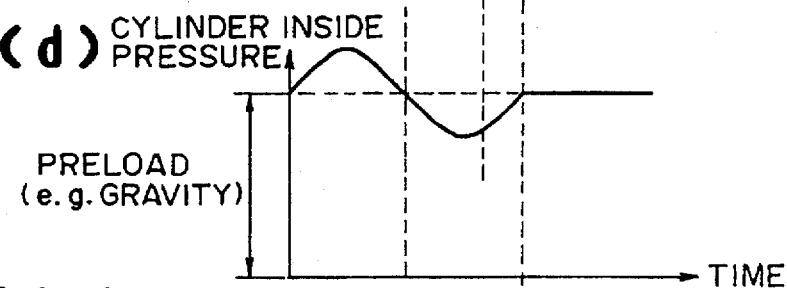
Figure 27E:
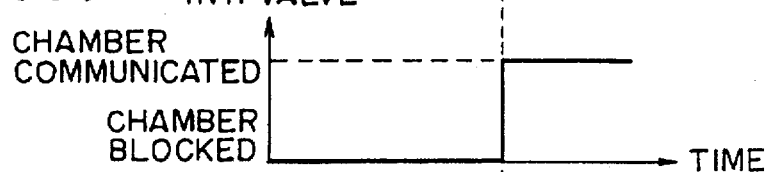
Figure 27F:
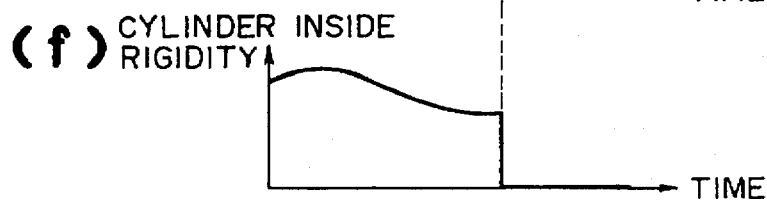

FIG. 26 is a block diagram of drive control means of this example. FIGS. 27(a) through 27(f) are time charts showing an example of control operation of the drive control means of FIG. 26, wherein the portion (a) shows the movement distance of the X stage 1404 with respect to driving time, the portion (b) shows the timing for switching an interchange switch 2603, the portion (c) shows applied currents to the linear motors, the portion (d) shows changes in air cylinder inside pressure, the portion (e) shows the timing for switching an interchange valve 2611, and the portion (f) shows changes in air cylinder inside rigidity.

In the drive control means of this example, switching the interchange switch 2603 for applying drive currents to the X linear motors 1406A and 1406B is controlled essentially in the same manner as in the example wherein it is controlled with reference to the movement distance of the X stage 1404.

Also, the opening of the valve 2611 for providing communication between the chamber 2616 and the X non-contact air cylinders 1413A and 1413B, is made under the control of a comparator 2610 which discriminates whether the stepwise motion is finished or not.

First, when as the stepwise motion proceeds the X stage 1404 comes approximately to the target position and thus the difference comes into a predetermined tolerable range, the switch 2603 is turned into a connected state. Thus, drive currents are applied to the X linear motors 1406A and 1406B and, in response, the final positioning operation starts.

During the stepwise motion, the inside pressure of the X non-contact air cylinders 1413A and 1413B rises just after start of the stepwise motion and, after this, it decreases gradually. Also, the rigidity of these air cylinders 1413A and 1413B changes similarly as the pressure change.

As the final positioning operation starts, in response to discrimination of the stop of the stepwise motion in the comparator 2610 the valve 2611 is opened to provide communication between the chamber 2612 and the X non-contact air cylinders 1413A and 1413B. Thus, in each air cylinder, the volume thereof increases apparently. This assures that, of the drive of the linear motors 1406A and 1406B, the reaction force in compressing/expanding the air is neglected. Thus, the currents to be applied to the linear motors 1406A and 1406B need only to correspond to a force capable of absorbing disturbance.

While in this example the timing is so set that the valve 2611 is opened after the switch 2603 is turned, the order may be inverted with substantially the same advantageous effect, provided that the switching of them is made approximately concurrently.

Fourth Embodiment

Figure 28:
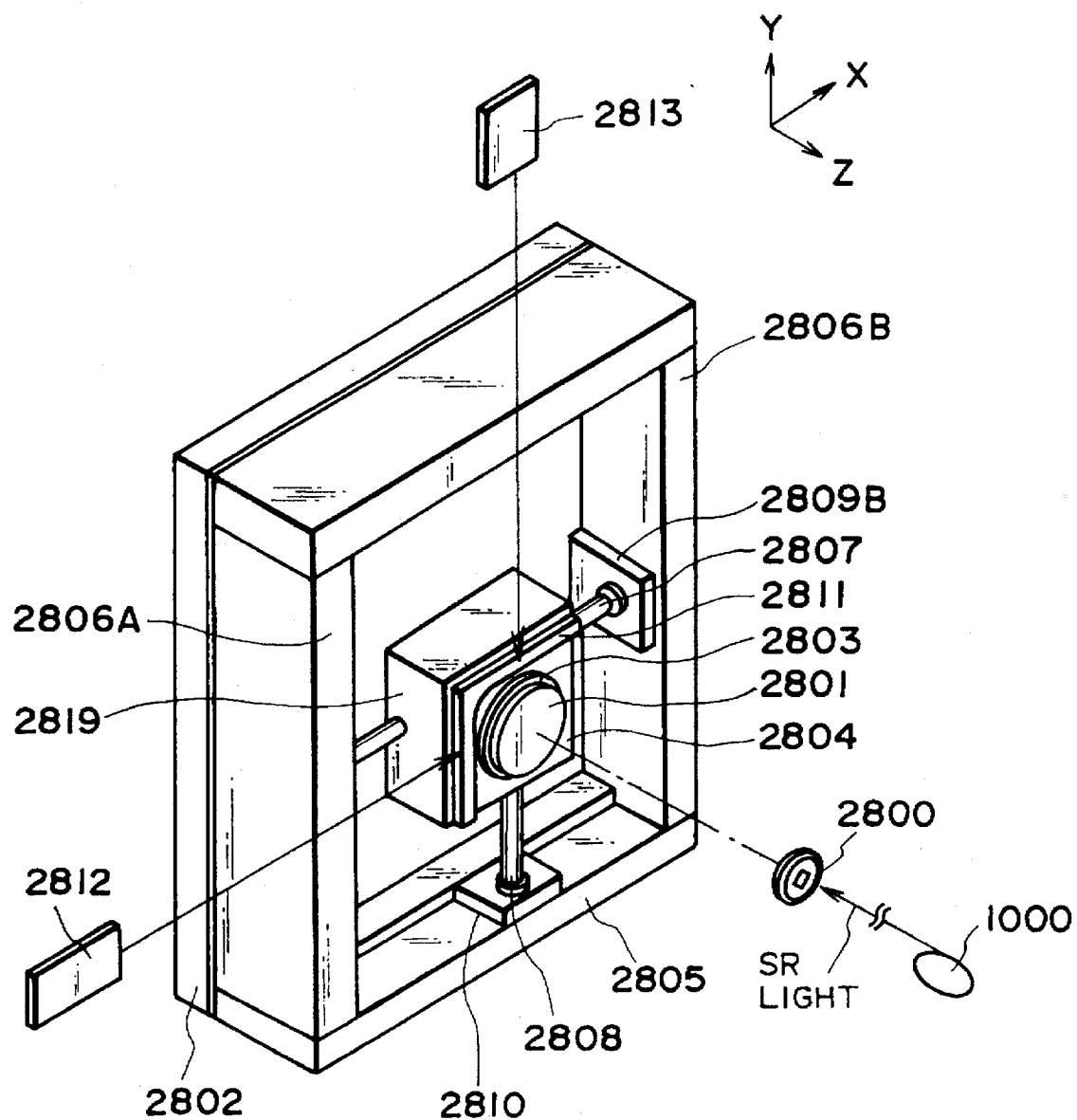
FIG. 28 is a perspective view of a movable stage device according to a fourth embodiment of the present invention.
Figure 29:
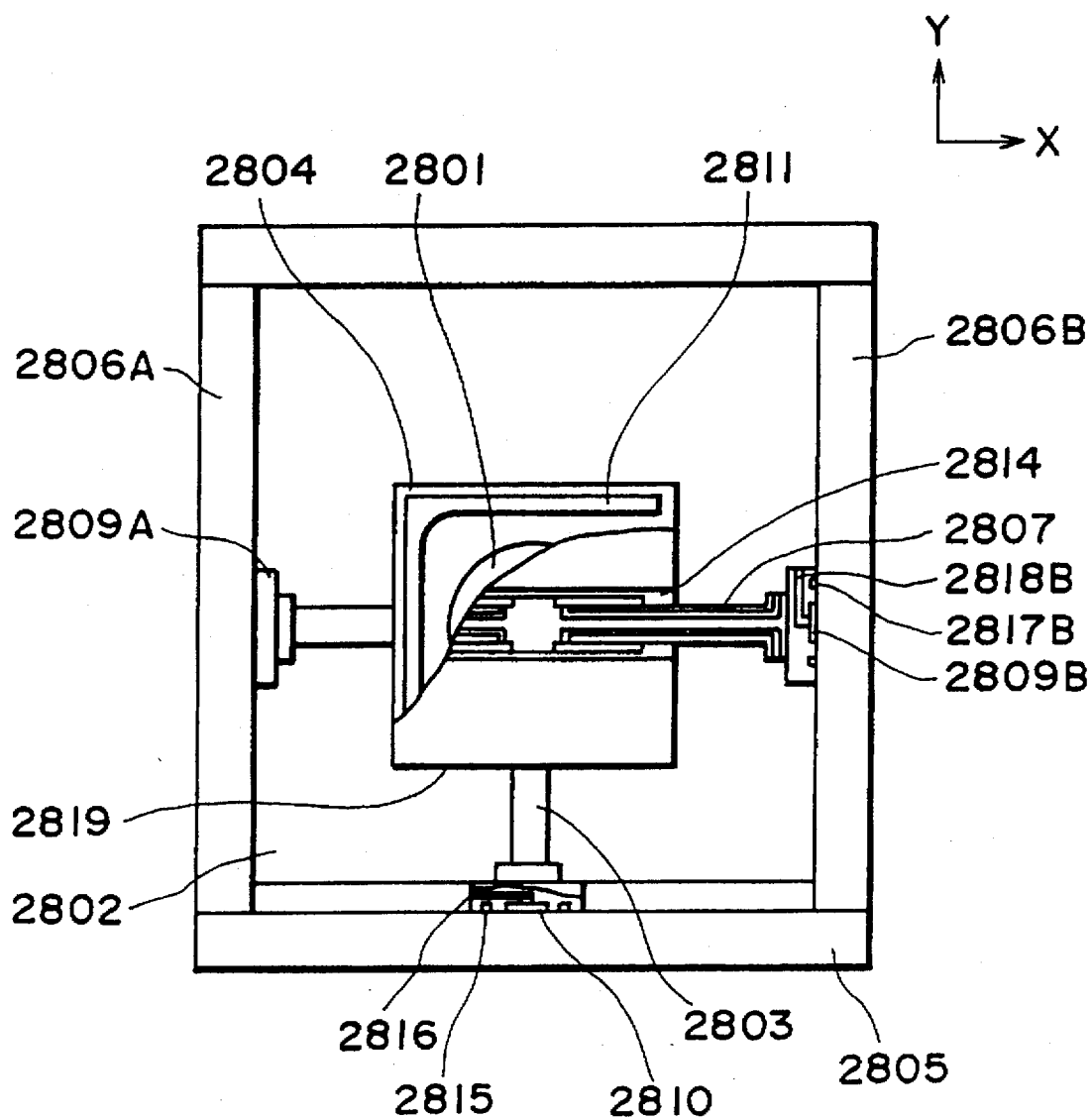
FIG. 29 is a front view of the movable stage device of FIG. 28.

Referring to FIGS. 28 and 29, a fourth embodiment of the present invention will be explained.

FIG. 28 is a perspective view of a movable stage device of this embodiment. FIG. 29 is a front view of the movable stage device of FIG. 28.

Like the preceding embodiment, the movable stage device of the present embodiment is incorporated as an alignment device into an SOR X-ray exposure apparatus, for positioning a wafer 2801 with respect to SR light emitted from a SOR ring (X-ray source) 1000 and passed through an mask 2800.

In this embodiment, the stage device comprises first driving means including X, Y and θ induction motors, like those shown in FIG. 13, for motion in the X, Y and θ directions, which are provided on the face of an X-Y stage contacting with a stage base 2802. The stage device further comprises second driving means including an X non-contact air cylinder 2814, reciprocally movable in the X direction like that of FIG. 16, as well as a Y non-contact air cylinder 2819 like that of FIG. 17.

Mounted to end portions of an X non-contact air cylinder rod 2807 engaging with the X non-contact air cylinder 2814 which portions contact with Y assist bases 2806A and 2806B, respectively, are Y-axis static pressure bearings 2809A and 2809B including Y preloading magnets 2817A and 2817B and Y static pressure bearing pressurizing systems 2818A and 2818B (elements 2817A and 1818A are not shown), respectively. This allows that, in the motion of the X-Y stage 2801 in the Y direction, it moves without contact to the Y assist bases 2806A and 2806B.

Similarly, mounted on the face of a Y non-contact air cylinder rod 2808 engaging with the Y non-contact air cylinder 2819 which face contacts with an X assist base 2805, is an X static pressure bearing 2801 including an X preloading magnet 2815 and an X static pressure bearing pressurizing system 2816. For motion of the X-Y stage 2804 in the X direction, it can move without contact to the X assist base 2805.

It is to be noted that drive control for the X and Y non-contact air cylinders 2814 and 2819 and X and Y induction motors can be done essentially in the same way as that of the preceding embodiment.

Fifth Embodiment

Figure 30:
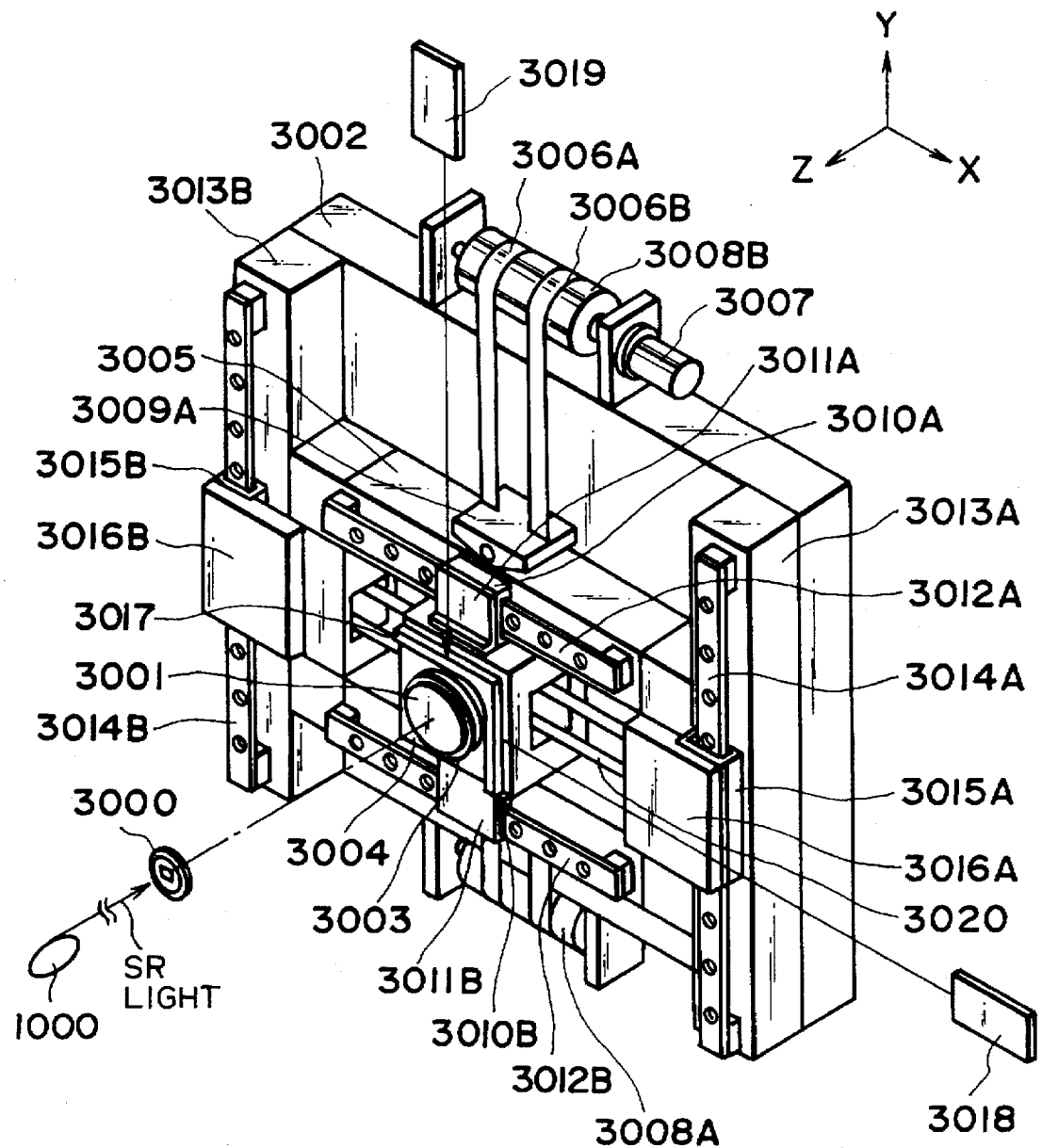
FIG. 30 is a perspective view of a movable stage device according to a fifth embodiment of the present invention.
Figure 31A:
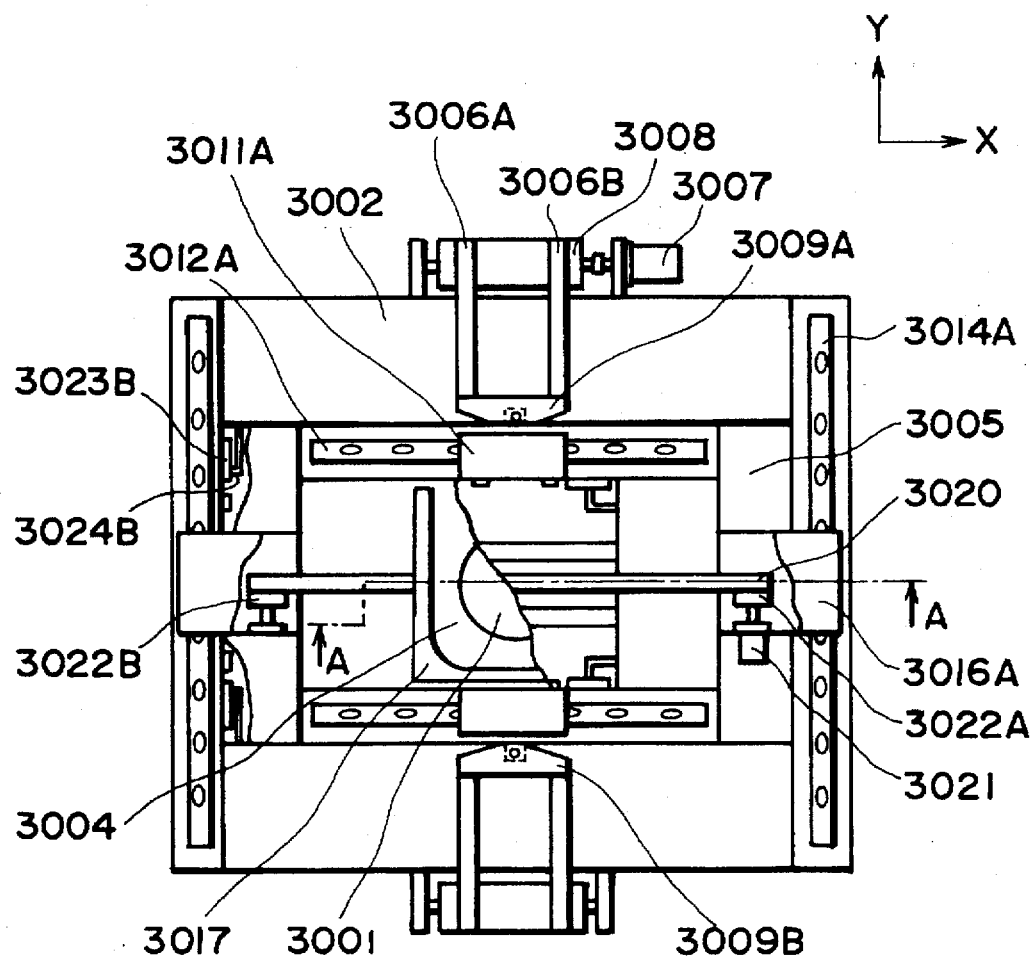
FIG. 31A is a front view of the movable stage device of FIG. 30.
Figure 31B:
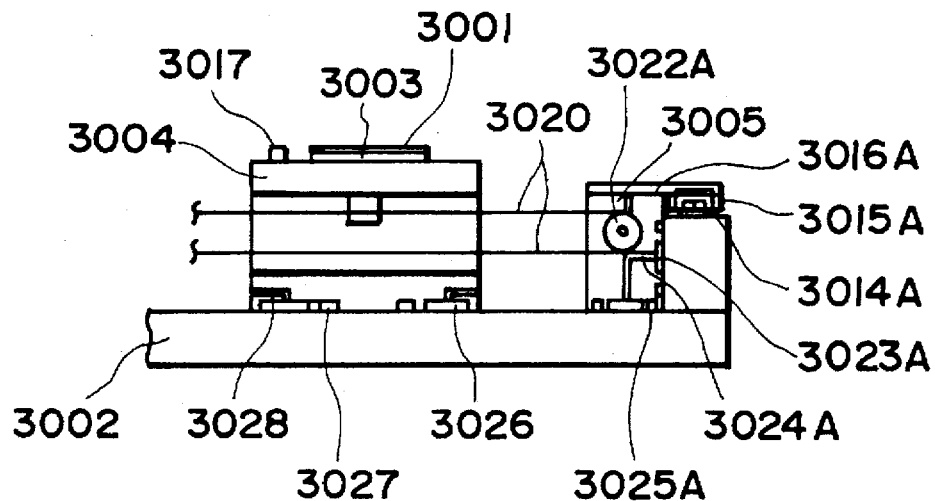
FIG. 31B is a sectional view taken on line 31B—31B in FIG. 31A.

Referring to FIGS. 30, 31A and 31B, a fifth embodiment of the present invention will be explained.

FIG. 30 is a perspective view of a movable stage device of this embodiment. FIG. 31A is a front view of the movable stage device of FIG. 30, and FIG. 31B is a sectional view taken on line 31B—31B of FIG. 31A.

Like the preceding embodiments, the movable stage device of the present embodiment is incorporated as an alignment device into an SOR X-ray exposure apparatus, for positioning a wafer 3001 with respect to SR light emitted from an SOR ring (X-ray source) 1000 and passed through a mask 3000.

In this embodiment, the stage device comprises first driving means including X linear motors 3010A and 3010B and Y linear motors 3015A and 3015B, like those in the preceding embodiment. Also, it comprises second driving means including first and second moving mechanisms. The first moving mechanism is arranged to hold a Y stage 3005 with Y belts 3006A and 3006B, stretched between two Y drum units 3008A and 3008B, and through equalizer 3009A and 3009B, and also to rotate the Y drum unit 3008B by a drive of a Y motor 3007 to move the Y stage 3005 in the Y direction. The second moving mechanism is so arranged that an X belt stretched between two X drum units 3022A and 3022B is connected to an X stage 3004 and that, with a drive of an X motor 3021, the X drum unit 3022A is rotated to move the X stage 3004 in the X direction.

At the face contacting with a stage base 3002, the X stage 3004 is provided with a static pressure bearing means including an X static pressure pad 3026, an X preloading magnet 3027 and an X static pressure bearing pressurizing system 3028. Similarly, at the face contacting with the Y stage 3005, it is provided with a static pressure bearing means of similar structure. Thus, it can move without contact to the stage base 3002 and to the Y stage 3005.

On the other hand, at the face contacting with Y yaw guides 3013A and 3013B mounted on the stage base 3002, the Y stage is provided with static pressure bearing means including Y static pressure pads 3023A and 3023B, Y static pressure bearing pressurizing systems 3024A and 3024B and Y preloading magnets 3025A and 3025B (elements 302B, 3024B and 3025B are not shown). Further, at the face contacting with the stage base 3002, it is provided with static pressure bearing means of similar structure. Thus, it can move without contact to the stage base 3002 and to the Y yaw guides 3013A and 3013B.

Figure 32:
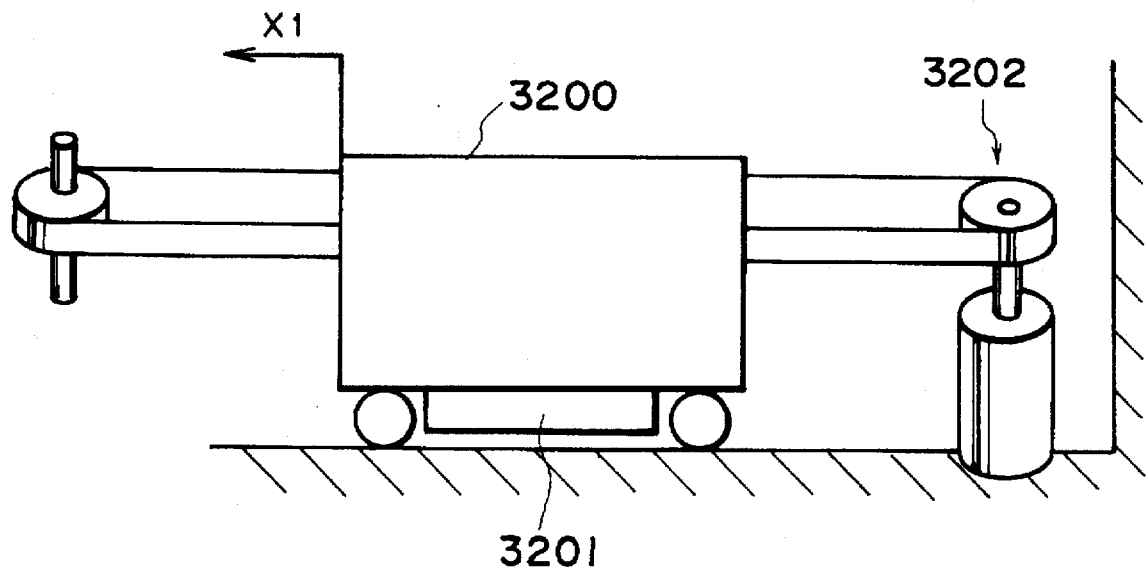
FIG. 32 is a schematic view for explaining the principle of operation of the movable stage device of FIG. 30.

Now, the principle of positioning in the present embodiment will be explained with reference to FIG. 32.

For stepwise motion and positioning, for example, first energy such as a voltage for the stepwise motion of the stage is applied to the second driving means 3202. In response, the second driving means produces a drive corresponding to the received energy, which drive is directly transmitted to the movable stage 3000, whereby the movable stage 3200 is moved stepwise. At this time, the output of a first driving means 3201 is intercepted by a switch so that it produces no drive or, alternatively, it produces a limited, very small drive. Therefore, heat generation is sufficiently suppressed to a level that can be neglected. Also, a cooling means is provided for the second driving means 3202 so to absorb any heat. Thus, substantially no thermal energy is transmitted to the movable stage 3200.

During the stepwise motion, a control system for the second driving means executes closed loop control wherein the position is fed back. However, by decreasing the gain, stable stepwise motion is assured.

Close to completion of the stepwise motion, the switch having intercepted the output of the first driving means 3201 is turned to a side connecting the output. In response, the first driving means 3201 begins to produce a drive for the positioning (as a trigger for turning the switch, the stage position or the time may be used) or, alternatively, the drive having been limited to a very low level becomes contributable to the positioning.

Also, at this moment, the second driving means 3202 is shut off the closed loop control and, in place thereof, it is driven by a constant current (in the Y direction, a current effective to provide a torque balancing the weight of the movable stage 3200; whereas in the X direction, it is zero). In response, the force of the second driving means 3202 becomes ineffective to the movable stage 3200, and thus the position of the movable stage 3200 can be controlled only by the first driving means 3201. Since the control system executes closed-loop control wherein the stage position is fed back and since the first driving means 3201 comprises a linear motor, a high mechanical rigidity system can easily be assured and high gain (high precision) and stable position control is ensured.

As regards heat generation during the positioning operation, the second driving means 3202 is cooled and it does not generate heat (essentially it does not generate heat since the current is zero in the X direction). While the first driving means 3201 needs a force effective counteract to any disturbance, vibrating the movable stage 3200, since the amount of displacement during the positioning operation is very small (e.g., about 0.1 micron), heat generation resulting from production of such force is very small. Thus, it does not have an adverse effect on the stage 3200.

Now, drive control means for driving linear motors and X and Y motors in this embodiment will be explained.

Since essentially the same explanation applies to the drive control in both of the X and Y directions, only the drive control in the X direction will now be explained.

First, referring to FIGS. 33 and 34(a) through 34(c), an example wherein drive control is executed with reference to the movement distance of the X stage 104 in the X direction, will be explained.

Figure 33:
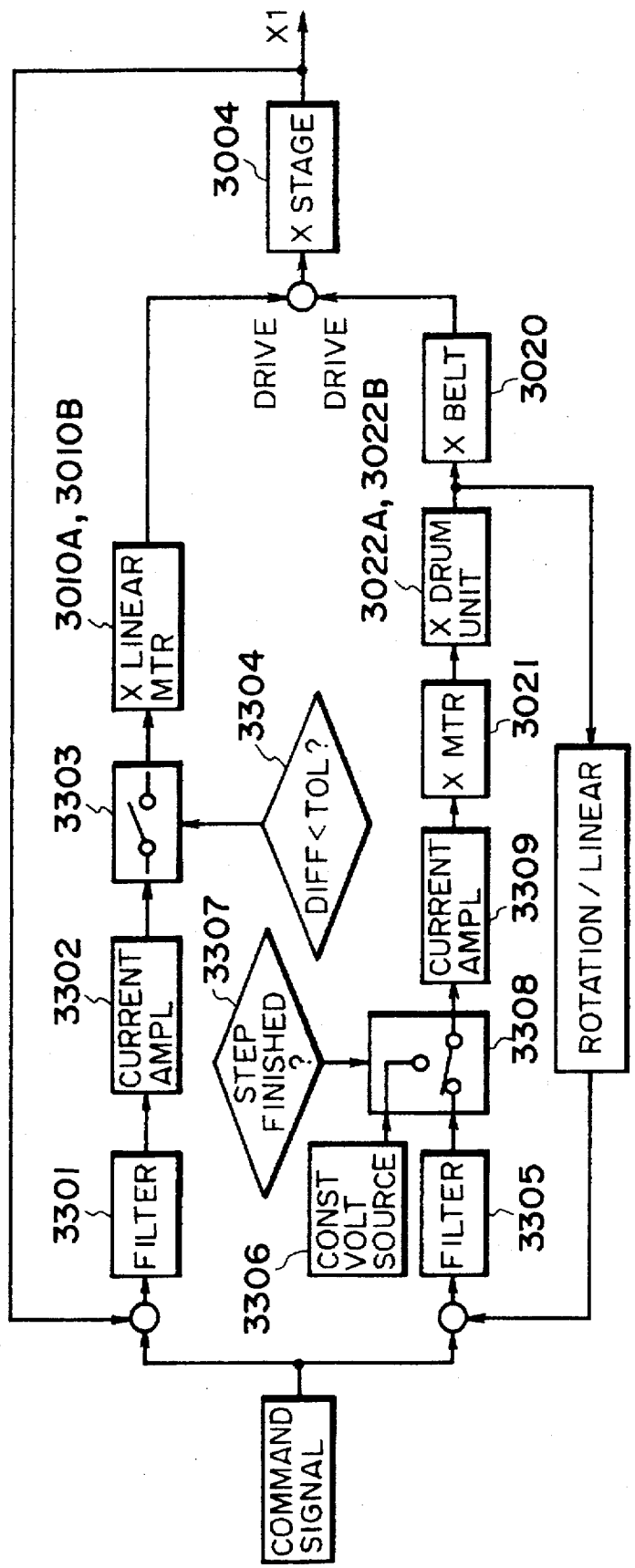
FIG. 33 is a block diagram of a first example of drive control in the movable stage device of FIG. 30.
Figure 34A:
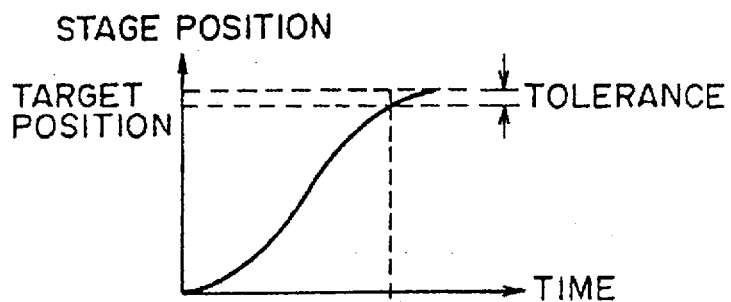
FIGS. 34(a) through 34(e) are time charts for explaining the operation of the drive control of the FIG. 33 example, wherein the portion (a) shows the position of the movable stage with respect to driving time, the portion (b) shows the timing for switching a first interchange switch, the portion (c) shows an applied current to a linear motor, the portion (d) shows the timing for switching a second interchange switch, and the portion (e) shows changes counteracting to the linear motor.
Figure 34B:
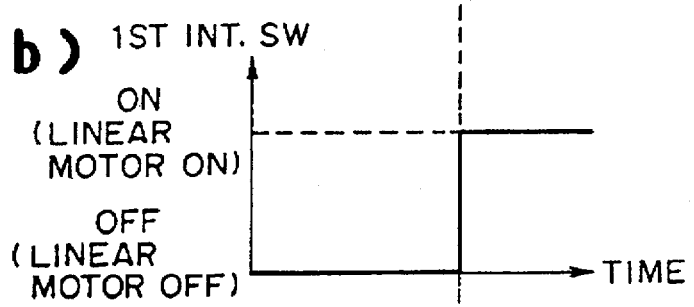
Figure 34C:
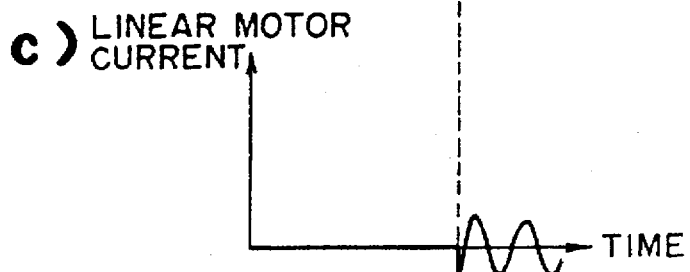
Figure 34D:
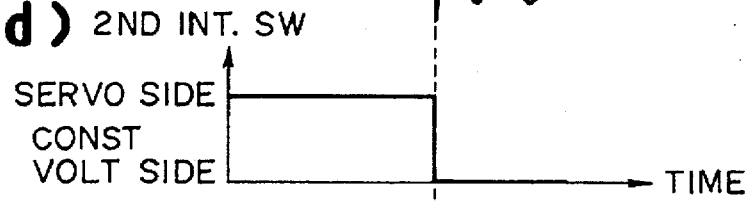
Figure 34E:
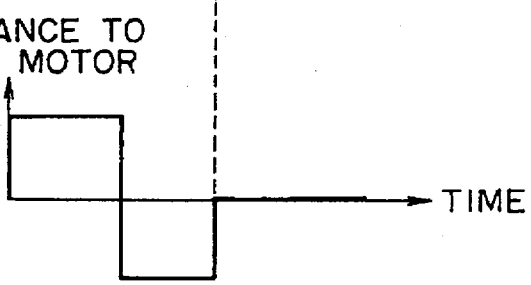

FIG. 33 is a block diagram of drive control means of this example. FIGS. 34(a) through 34(c) are time charts showing an example of control operation of the drive control means of FIG. 336, wherein the portion (a) shows the movement distance of the X stage 3004 with respect to driving time, the portion (b) shows the timing for switching a first interchange switch 3303, the portion (c) shows applied currents to X linear motors 3010A and 2010B, the portion (d) shows the timing for switching a second interchange switch 3308, the portion (e) shows changes in resistance to the X linear motors 3010A and 3010B.

In the drive control means of this example, the first interchange switch 3303 for applying drive currents to the X linear motors 3010A and 3010B is turned into its connecting state in response to discrimination by a comparator 3304 which serves to compare the difference between the position of the X stage 3004 and the target position with a predetermined tolerance and to discriminate, on the basis of the comparison, that the difference comes into the tolerable range.

On the other hand, the application of current to the X motor 3021 is changed, between that in the stepwise motion and after the stepwise motion. During the stepwise motion, a drive current corresponding to a supplied instruction signal is applied to the X motor 3021 through a filter 3305, a second interchange switch 3508 and a current amplifier 3309. After the stepwise motion, a constant current is applied to the. X motor 3021 from a constant voltage source 3306 through the second switch 3508 and the current amplifier 3309, so as to hold the X stage 3004 at the position assumed at the completion of the stepwise motion. However, in the case of the X direction, the applied current may be "zero". In the case of the Y direction, because of the weight of the X stage 3005, for example, it is necessary to apply to the Y motor 3007 such constant current balancing thereto.

Switching of current application to the X motor 3021 is made by the second switch 3508, and its control is made by the comparator 3307 which discriminates whether the stepwise motion is completed or not.

In the drive control means of this example, during the stepwise motion, the rotational motion of the X motor 3021 is converted through drum units 3022A and 3022B into rectilinear motion, by which the X stage 3004 is moved in the X direction. The subsequent final positioning operation with the X linear motors 3010A and 3010B, may be done essentially in the same manner as the preceding embodiment. The resisting force to the X linear motors 3010A and 3010B in this operation is substantially "zero" since substantially no force acts on the X stage 3004. Thus, it can be moved easily. Here, in this example, the X linear motors 3010A and 3010B need only to produce a force absorbing disturbance, tending to cause vibration of the X stage 3004. This force corresponds to the amplitude of a current wave, after switching the first switch 3303, shown in the portion (c) of FIG. 34.

Figure 35:
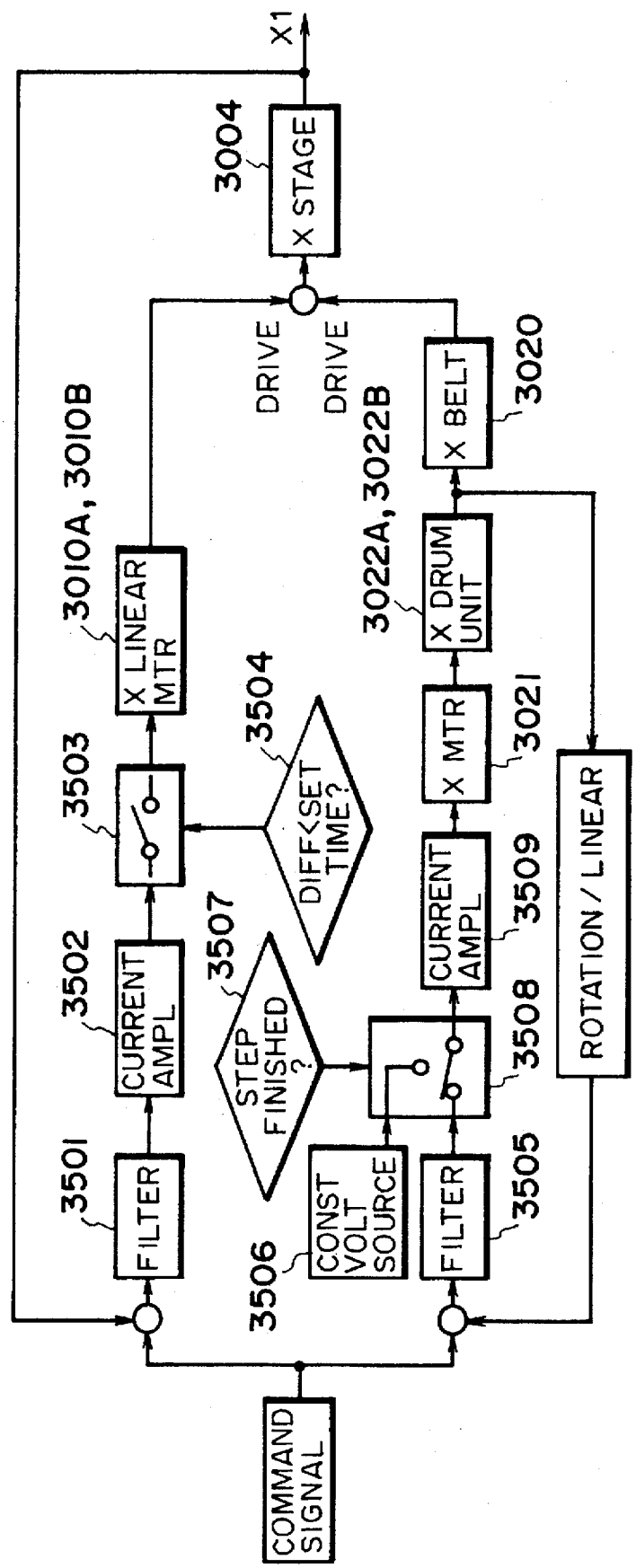
FIG. 35 is a block diagram of a second example of drive control in the movable stage device of FIG. 30.

Referring now to FIG. 35, an example wherein drive control is executed with reference to the driving time of the X stage 3004 in the X direction, will be explained.

FIG. 35 is a block diagram of drive control means of this example.

In the drive control means of this example, the first interchange switch 3503 for applying drive currents to the X linear motors 3010A and 3010B is switched in response to the moment at which the driving time of the X motor 3021 after start of stepwise motion goes beyond a predetermined set time (in which it is expected that the X stage 3004 reaches the target position). The remaining portion is substantially the same as that of the FIG. 33 example. In this example, the driving time is compared with the set time by a comparator 3504 and, on the basis of which, the comparator 3504 controls the switching of the first switch 3503.

Next, referring to FIGS. 36 and 37(a) through 37(d), an example wherein the X linear motors 3010A and 3010B are driven continuously until the X stage 3004 reaches the target position, will be explained.

Figure 36:
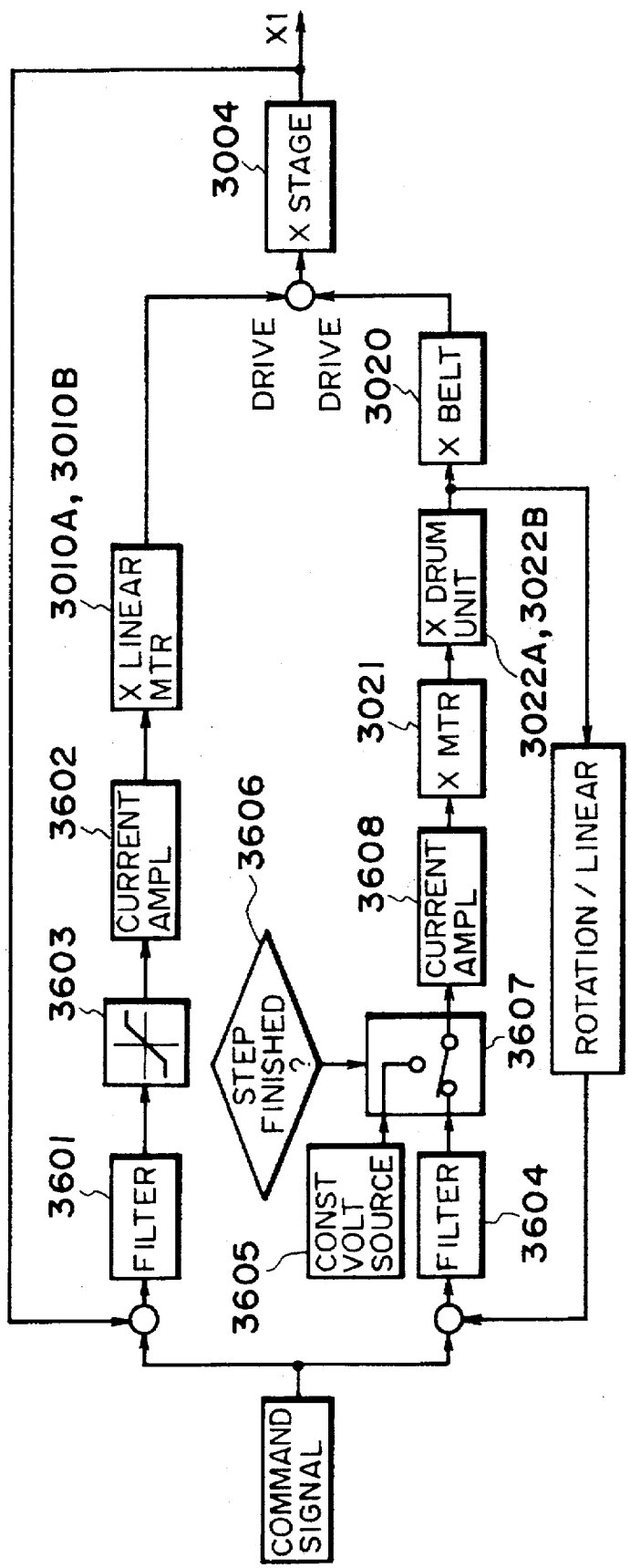
FIG. 36 is a block diagram of a third example of drive control in the movable stage device of FIG. 30.
Figure 37A:
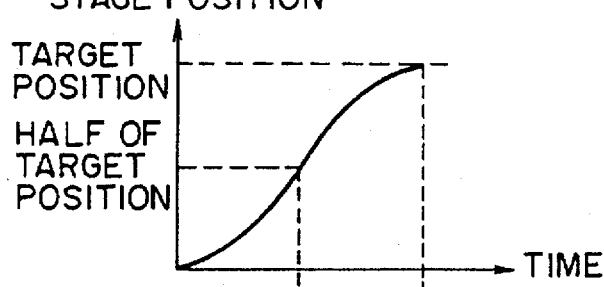
FIGS. 37(a) through 37(d) are time charts for explaining the operation of the drive control of the FIG. 36 example, wherein the portion (a) shows the position of the movable stage with respect to driving time, the portion (b) shows the timing for switching an interchange switch, the portion (c) shows an applied current to a linear motor, and the portion (d) shows changes counteracting to the linear motor.
Figure 37B:
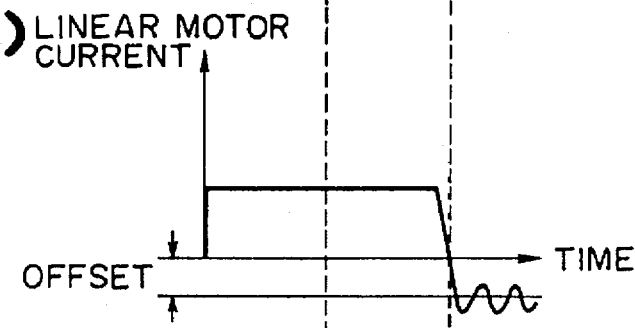
Figure 37C:
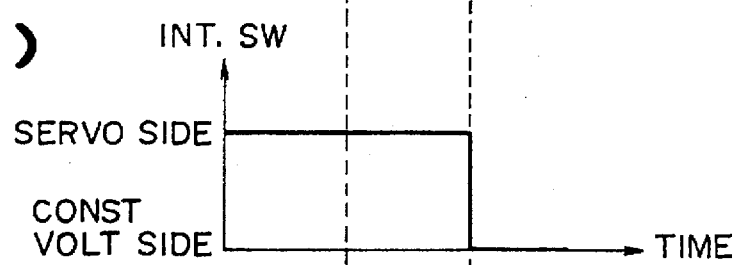
Figure 37D:
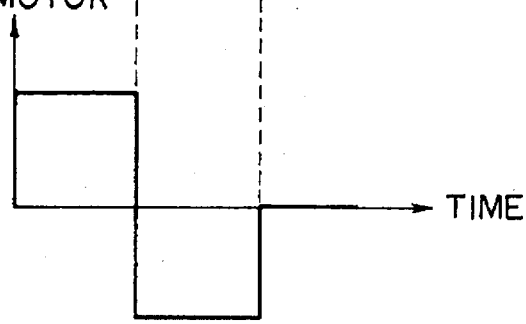

FIG. 36 is a block diagram of drive control means of this example. FIGS. 37(a) through 37(d) are time charts showing an example of control operation of the drive control means of FIG. 36,.wherein the portion (a) shows the movement distance of the X stage 3004 with respect to driving time, the portion (b) shows applied currents to the X linear motors 3010A and 3010B, the portion (c) shows the timing for switching an interchange switch, and the portion (d) shows changes in resisting force to the X linear motors 3010A and 3010B.

In the drive control means of this example, the X linear motors 3010A and 3010B are driven and controlled in a similar manner as by the drive control means of the first embodiment described with reference to FIG. 8. Since in the final positioning operation through the linear motors 3010A and 3010B, the resisting force to them becomes substantially "zero" as described, it is easy to move the X stage 3004. Here, in this example, the X linear motors 3010A and 3010B need only to produce a force effective to absorb disturbance, tending to cause vibration of the X stage 3004. This force corresponds to the amplitude of the current wave after the switching of the switch 3608, as shown in the portion (c) of FIG. 37.

Sixth Embodiment

Figure 39:
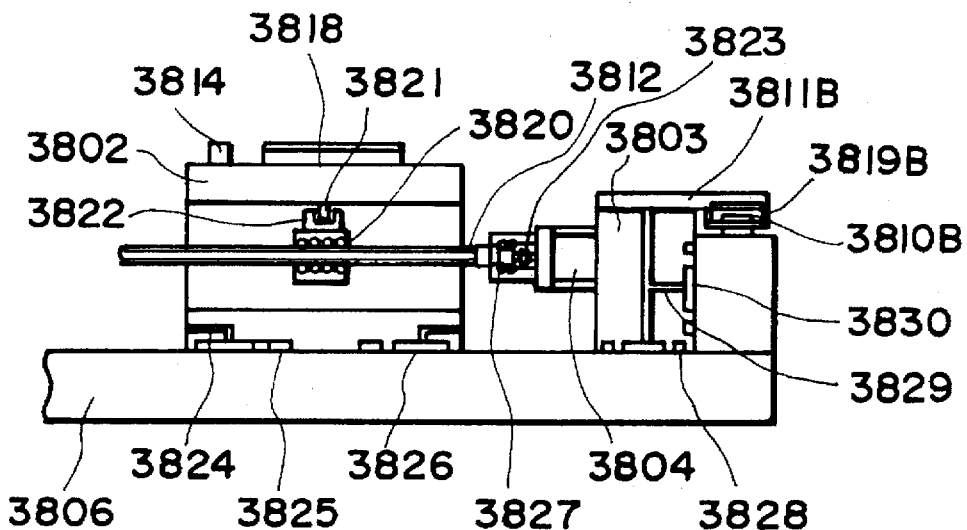
FIG. 39 is a sectional view taken on line 39—39 of FIG. 38.
Figure 40:
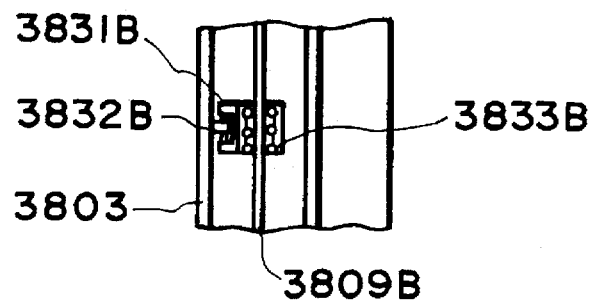
FIG. 40 is a sectional view taken on line 40—40 of FIG. 38.

Referring to FIGS. 38–40, a sixth embodiment of the present invention will be explained.

FIG. 38 is a front view of a movable stage device of this embodiment. FIG. 39 is a sectional view of the movable stage device of FIG. 38, taken on line 39—39. FIG. 40 is a sectional view taken on line 40—40 of FIG. 38.

Like the preceding embodiments, the movable stage device of the present embodiment is incorporated as an alignment device into an SOR X-ray exposure apparatus, for positioning a wafer 3801 with respect to SR light projected thereto through a mask, not shown.

Figure 2A:
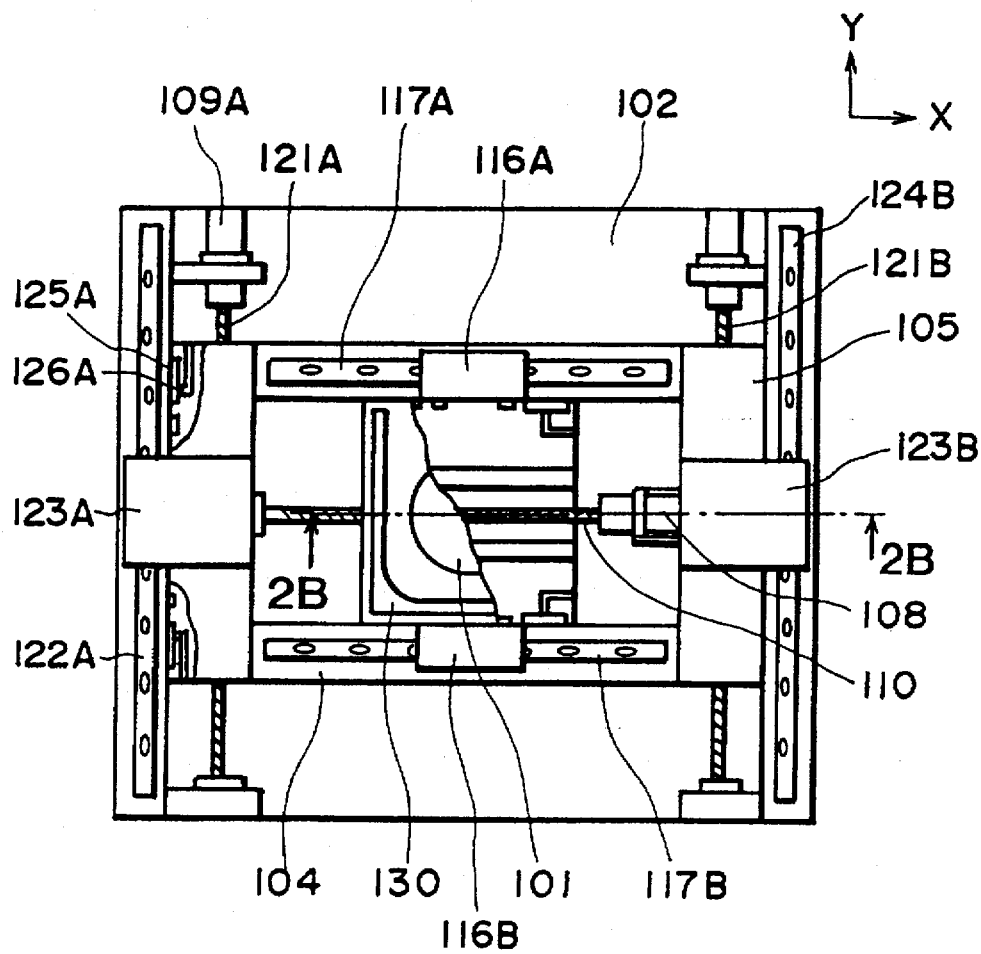
FIG. 2A is a front view of the movable stage device of FIG. 1.
Figure 2B:
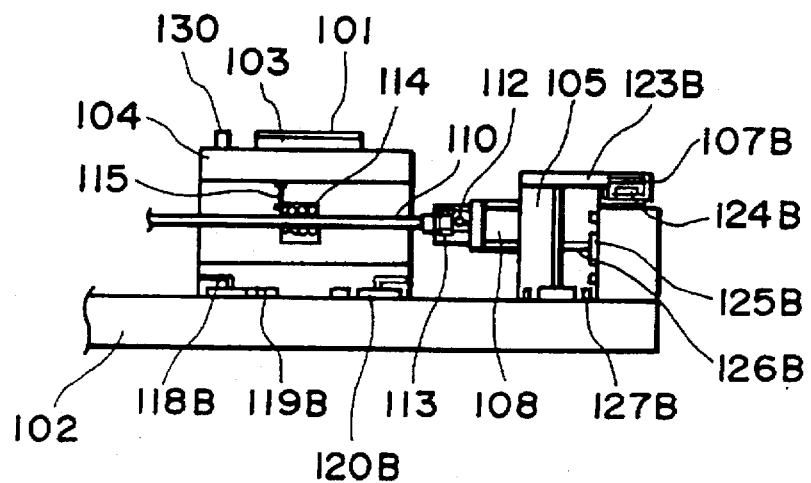
FIG. 2B is a sectional view taken on line 2B—2B of FIG. 2A.

In this embodiment, the stage device comprises first driving means including an X linear motor (not shown) and Y linear motors 3810A and 3810B (motor 3810a is not shown), like those in the first embodiment (see FIGS. 1 and 2A). Also, it comprises second driving means for transmitting drives of an X motor 3804 and Y motors 3805A and 3805B to an X stage 3802 and a Y stage 3803 through an X screw shaft 3812 and Y screw shafts 3809A and 3809B.

The Y stage 3803 is held in suspension, through an equalizer 3813, by two constant tension springs 3808 which are wound around a constant tension spring drum 3817, mounted on a stage base 3806. The constant tension springs 3808 serve to zero-balance the weight of the X stage 3802 and the Y stage 3803, and they continuously produce a constant force in the positive Y direction. The constant tension springs 3808 are taken up or rewound by the drum 3817, with the motion of the Y stage 3803 in the Y direction.

X nut 3802 engaging with the X screw shaft 3812 is rigidly coupled to the X stage 3802 during the stepwise motion, by an X clutch 3822 provided between it and the X stage 3802. For the final positioning, it is disengaged to release the X stage 3802. This is also the case with the relationship between the Y screw shafts 3809A and 3809B and the Y stage 3803, and there are provided Y clutches 3831A and 3831B (clutch 3831A is not shown).

Figure 41:
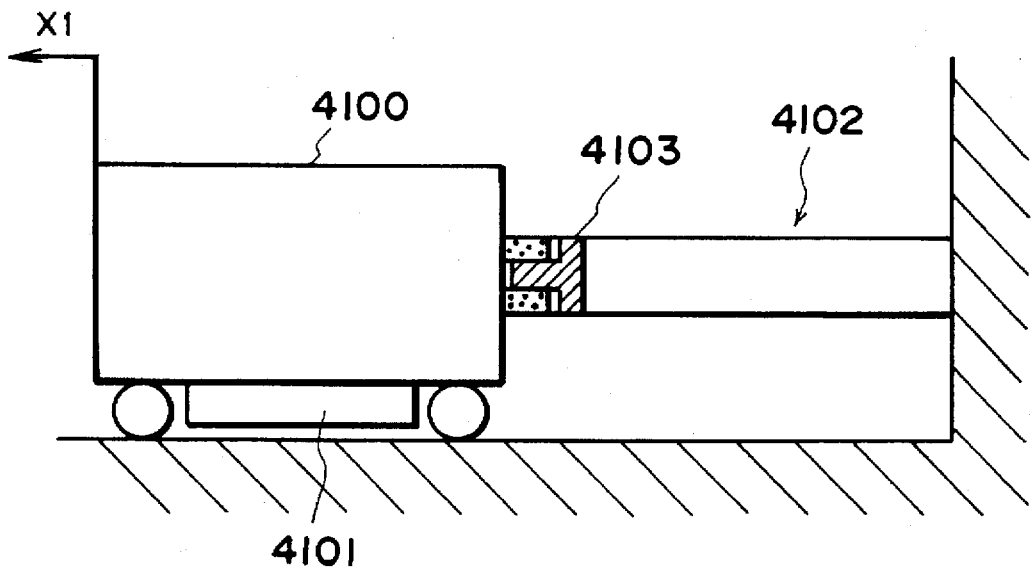
FIG. 41 is a schematic view for explaining the principle of operation of the movable stage device of FIG. 38.

Now, the principle of positioning in the present embodiment will be explained with reference to FIG. 41.

For stepwise motion and positioning, for example, first energy such as a voltage for the stepwise motion of the stage 4100 is applied to the second driving means 4102. In response, the second driving means produces a drive corresponding to the received energy, which drive is transmitted to the movable stage 4100 through a clutch 4103, whereby the movable stage 4100 is moved stepwise. At this time, the output of a first driving means 4101 is intercepted by a switch so that it produces no drive or, alternatively, it produces a limited, very small drive. Therefore, heat generation is sufficiently suppressed to a level that can be neglected. Also, the second driving means 4102 does not generate heat or, alternatively, a cooling means is provided therefor. Thus, substantially no thermal energy is transmitted to the movable stage 4100.

During the stepwise motion, a control system for the second driving means 4102 executes closed loop control wherein the stage position is fed back. However, by decreasing the gain, stable stepwise motion is assured.

Close to completion of the stepwise motion, the switch having intercepted the output of the first driving means 4101 is turned to a side, connecting the output. In response, the first driving means 4101 begins to produce a drive for the positioning (as a trigger for turning the switch, the stage position or the time may be used) or, alternatively, the drive having been limited to a very low level becomes contributable to the positioning.

Also, at this moment, the clutch 4103 disengages to intercept the coupling between the second driving means 3412 and the movable stage 4100. Thus, no force of the second driving means 4102 acts on the movable stage 4100, and only the first driving means 4101 can control the position of the movable stage 4100. Since the control system executes closed-loop control wherein the stage position is fed back and since the first driving means 4101 comprises a linear motor, a high mechanical rigidity system can easily be assured and high gain (high precision) and stable position control is ensured.

As regards heat generation during the positioning operation, the second driving means 4102 does not generate heat or it is cooled. Further, the stepwise motion has already been finished. Therefore, heat generation is yet lower than during the stepwise motion. While the first driving means 4101 needs a force effective to counteract to any disturbance, vibrating the movable stage 4100, since the amount of displacement during the positioning operation is very small (e.g., about 0.1 micron), heat generation resulting from production of such force is very small. Thus, it does not have an adverse effect on the stage 4100.

Now, drive control means for driving linear motors and X and Y motors in this embodiment will be explained.

Since essentially the same explanation applies to the drive control in both of the X and Y directions, only the drive control in the Y direction will now be explained.

First, referring to FIGS. 42 and 43(a) through 43(e), an example wherein drive control is executed with reference to the movement distance of the Y stage 3803 in the X direction, will be explained.

Figure 42:
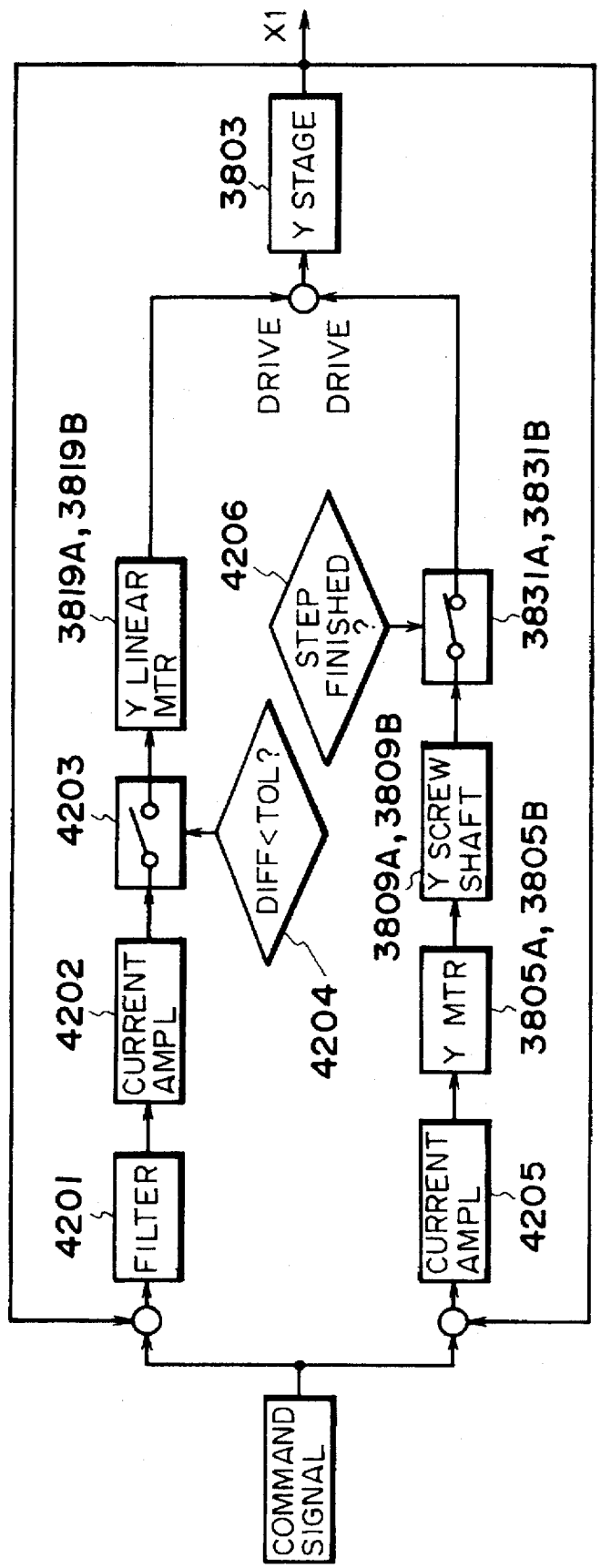
FIG. 42 is a block diagram of a first example of drive control in the movable stage device of FIG. 38.
Figure 43A:
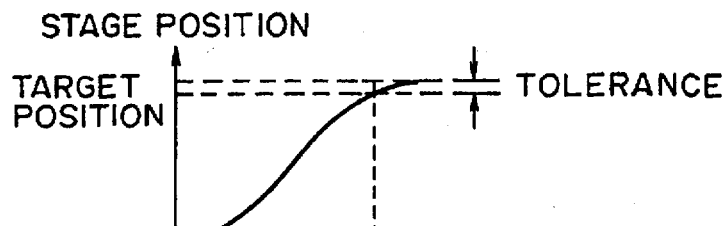
FIGS. 43(a) through 43(e) are time charts for explaining the operation of the drive control of the FIG. 42 example, wherein the portion (a) shows the position of the movable stage with respect to driving time, the portion (b) shows the timing for switching an interchange switch, the portion (c) shows an applied current to a linear motor, the portion (d) shows the timing for switching an interchange clutch, and the portion (e) shows changes counteracting to the linear motor.
Figure 43B:
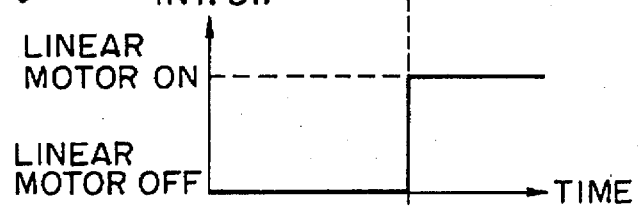
Figure 43C:
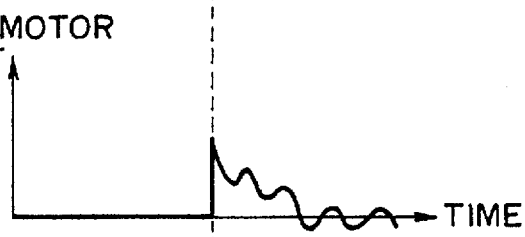
Figure 43D:
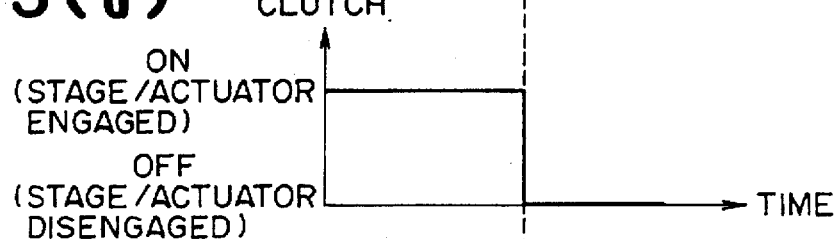
Figure 43E:
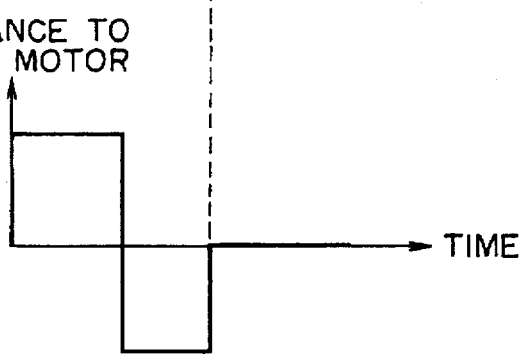

FIG. 42 is a block diagram of drive control means of this example. FIGS. 43(a) through 43(e) are time charts showing an example of control operation of the drive control means of FIG. 42, wherein the portion (a) shows the movement distance of the Y stage 3803 with respect to driving time, the portion (b) shows the timing for switching an interchange switch 4203, the portion (c) shows applied currents to Y linear motors 3819A and 3819B, the portion (d) shows the timing for switching Y clutches 3831A and 3831B, and the portion (e) shows changes in resistance to the Y linear motors 3819A and 3819B.

In the drive control means of this example, the interchange switch 4203 for applying drive currents to the Y linear motors 3819A and 3819B is turned into its connecting state in response to discrimination by a comparator 4204 which serves to compare the difference between the position of the Y stage 3803 and the target position with a predetermined tolerance and to discriminate, on the basis of the comparison, that the difference comes into the tolerable range.

On the other hand, during the stepwise motion, drive currents corresponding to a supplied instruction signal are applied to the Y motors 3805A and 3805B through a current amplifier 4205. Further, a comparator 4206 discriminates whether the stepwise motion is finished or not, and it controls the switching of Y clutches 3831A and 3831B.

With this comparator 4206, the Y clutches 3831a and 3831B are disengaged upon completion of the stepwise motion. This releases the Y stage 3803 at the position as assumed at the time of stopping of the stepwise motion (approximately at the target position), and it is held in a balanced state with the weight of the X stage 3802 and the Y stage 3803 by the constant tension springs 3808. Since there is substantially no resisting force to the Y linear motors 3819A and 3819B, motion for the final positioning can be easily done. Here, in this example, the Y linear motors 3819A and 3819B need only to produce a force absorbing disturbance, tending to cause vibration of the Y stage 3803. This force corresponds to the amplitude of current wave, after switching the switch 4203, shown in the portion (c) of FIG. 43. The same applies to some examples to be described below.

Referring now to FIGS. 44 and 45(a) through 45(e), an example wherein drive control is executed with reference to the driving time after input of an instruction signal, will be explained.

Figure 44:
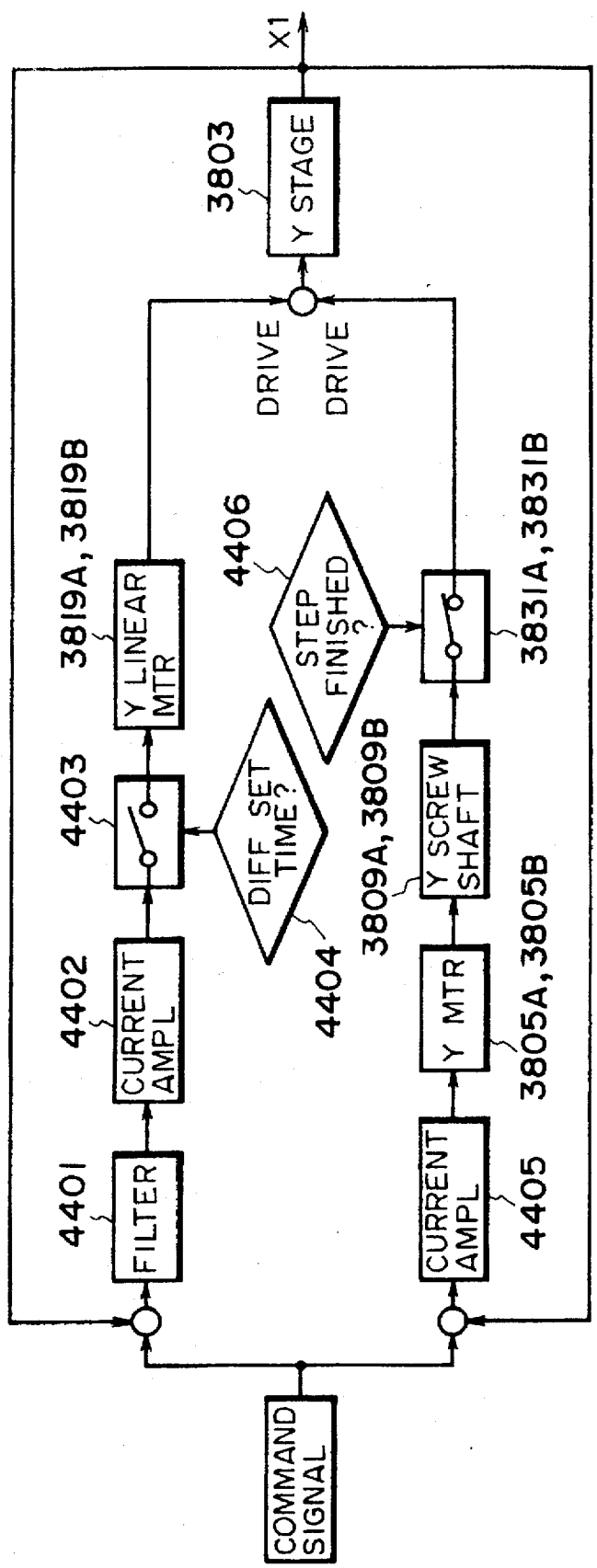
FIG. 44 is a block diagram of a second example of drive control in the movable stage device of FIG. 38.

FIG. 44 is a block diagram of drive control means of this example. FIGS. 45(a) through 45(e) are time charts showing an example of control operation of the drive control means of FIG. 44, wherein the portion (a) shows the movement distance of the Y stage 3803 with respect to driving time, the portion (b) shows the timing for switching an interchange switch 4403, the portion (c) shows applied currents to the Y linear motors 3819A and 3819B, the portion (d) shows the timing for switching the Y clutches 3831A and 3831B, and the portion (e) shows changes in resistance to the Y linear motors 3819A and 3819B.

In the drive control means of this example, the interchange switch 4403 for applying drive currents to the Y linear motors 3819A and 3819B is switched in response to the moment at which the driving time of the Y motors 3805A and 3805B after start of stepwise motion goes beyond a predetermined set time (in which it is expected that the Y stage 3803 reaches the target position). The remaining portion is substantially the same as that of the FIG. 42 example. In this example, the driving time is compared with the set time by a comparator 4404 and, on the basis of which, the comparator 4404 controls the switching of the switch 4403.

Next, referring to FIGS. 46 and 47(a) through 47(d), an example wherein the Y linear motors 3819A and 3819B are driven continuously until the Y stage 3803 reaches the target position, will be explained.

Figure 46:
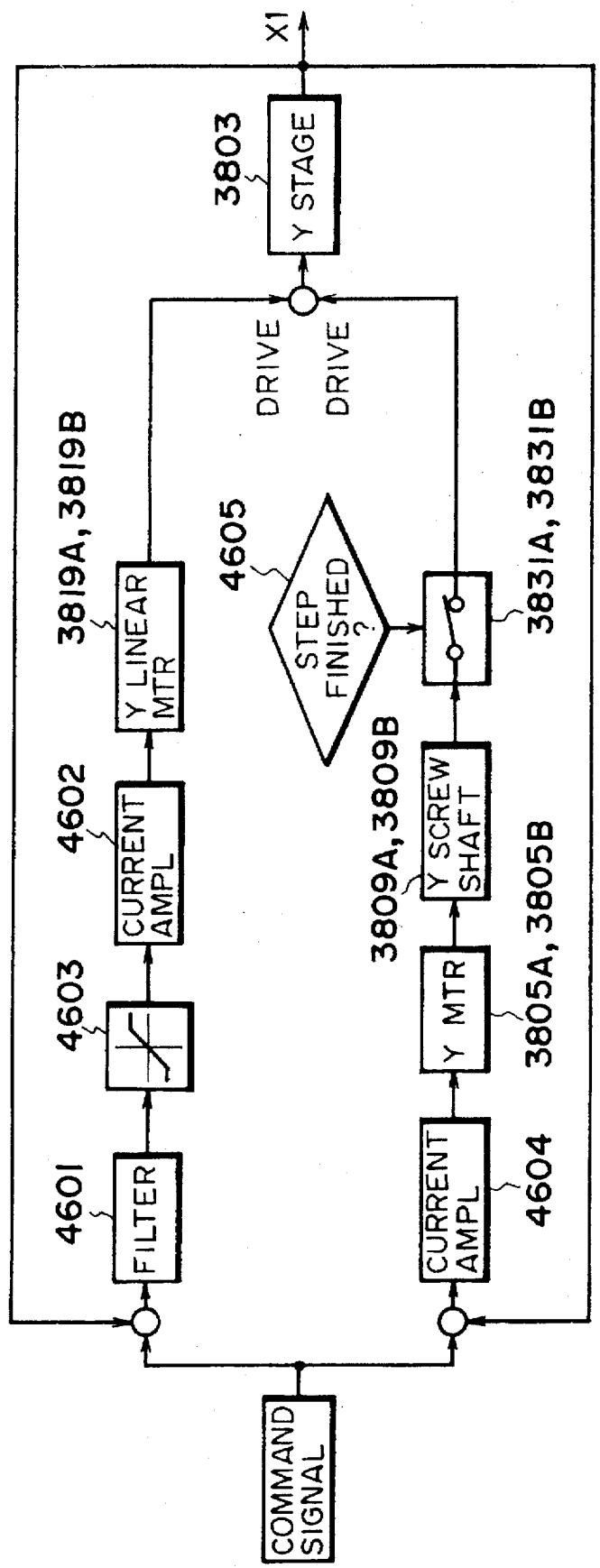
FIG. 46 is a block diagram of a third example of drive control in the movable stage device of FIG. 38.
Figure 47A:
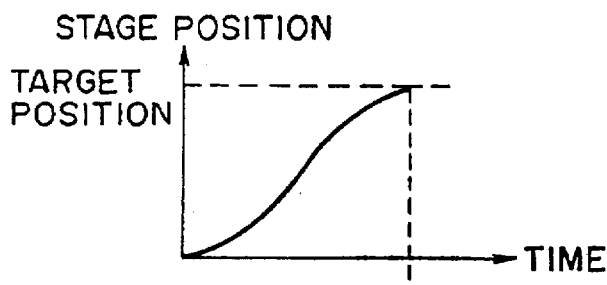
FIGS. 47(a) through 47(d) are time charts for explaining the operation of the drive control of the FIG. 46 example, wherein the portion (a) shows the position of the movable stage with respect to driving time, the portion (b) shows an applied current to a linear motor, the portion (c) shows the timing for switching a clutch, and the portion (d) shows changes counteracting to the linear motor.
Figure 47B:
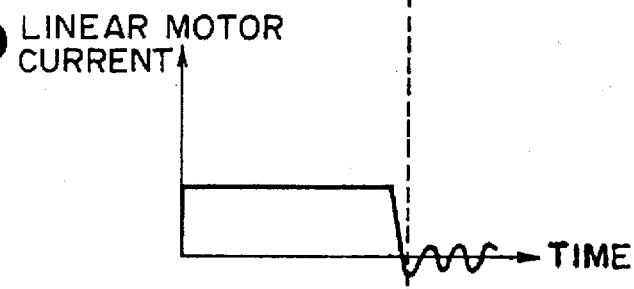
Figure 47C:
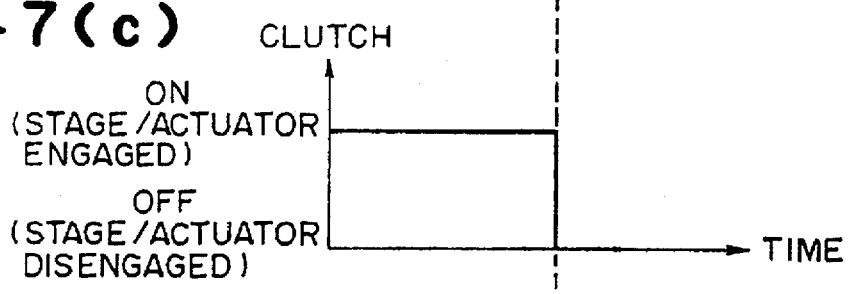
Figure 47D:
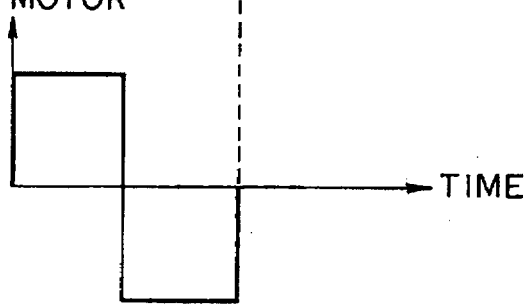

FIG. 46 is a block diagram of drive control means of this example. FIGS. 47(a) through 47(d) are time charts showing an example of control operation of the drive control means of FIG. 46, wherein the portion (a) shows the movement distance of the Y stage 3803 with respect to driving time, the portion (b) shows applied currents to the Y linear motors 3819A and 3819B, the portion (c) shows the timing for switching Y clutches 3831A and 3831B, and the portion (d) shows changes in resisting force to the Y linear motors 3819A and 3819B.

In the drive control means of this example, the Y linear motors 3819A and 3819B are driven and controlled in a similar manner as by the X linear motor drive control means of the first embodiment described with reference to FIG. 8. Since in the final positioning operation through the Y linear motors 3819A and 3819B, the resisting force to them becomes substantially "zero" as described, it is easy to move the Y stage 3803.

Seventh Embodiment

A seventh embodiment will now be explained. Since the general structure of the stage device is similar to that of the first embodiment (FIGS. 1–3), description of the structure will be omitted here. An important feature of this embodiment resides in that: the amount of displacement of leaf spring means is detected, and the detected displacement is fed back to the drive control of the stage.

When a linear motor is positioned at a desired position, since the drive control system for the second driving means does not feed back the stage position, there is a possibility that flexure (offset) occurs in the spring element. If this occurs, then the linear motor has to produce a drive to continuously counteract to the force corresponding to this offset and produced by the spring. This causes a possibility of increased heat generation.

In the the present embodiment, in consideration thereof, any displacement of a spring element is detected and the detected displacement is fed back to be added to an instruction signal to the control system of the second driving means, to thereby remove or cancel the offset. As described hereinbefore, the stage device of this embodiment is provided with a sensor (strain gauge or gap sensor) for detecting displacement of each of X and Y leaf springs. Thus, by using this sensor, the amount of displacement of spring means can be detected.

Figure 48:
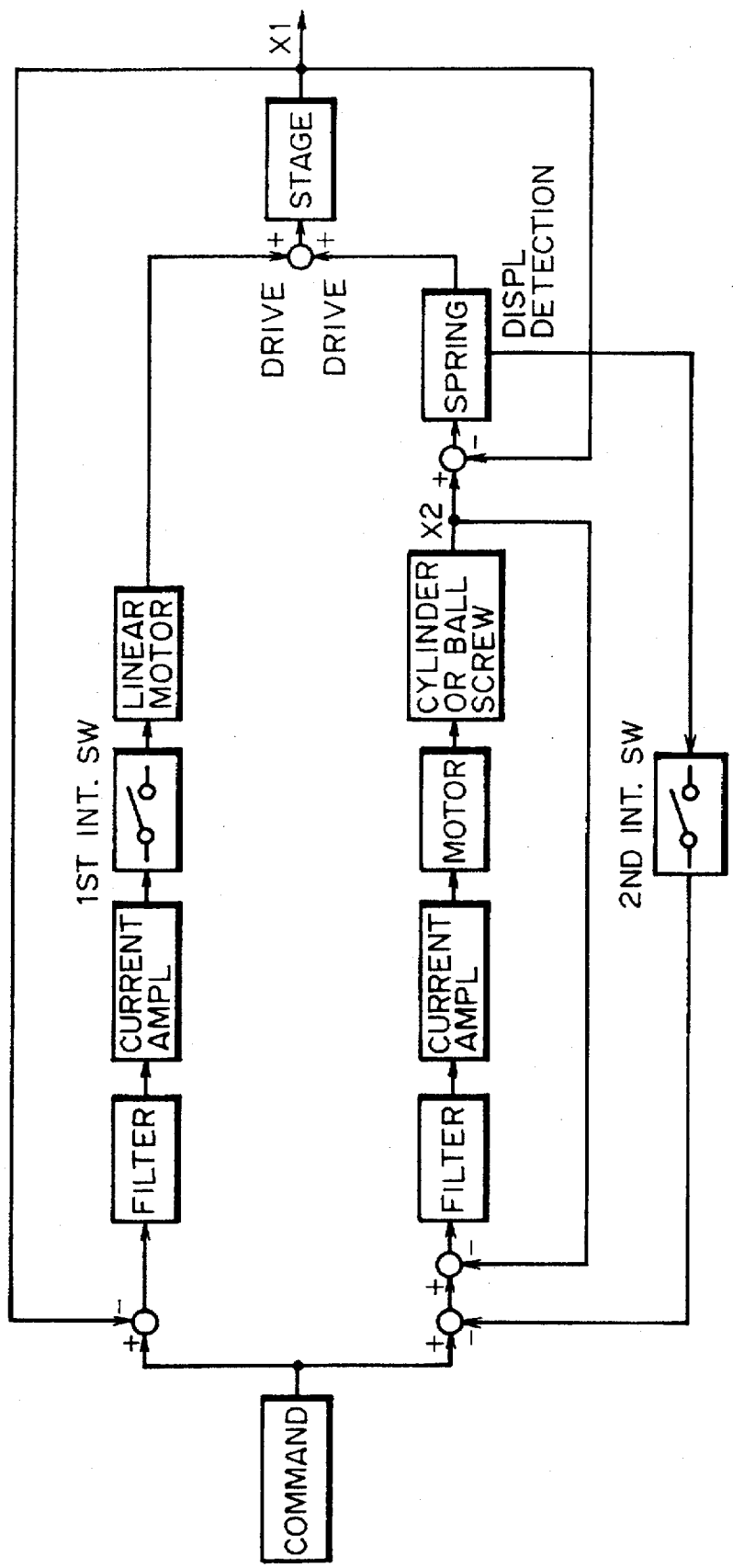
FIG. 48 is a block diagram of a control system of a seventh embodiment of the present invention.

FIG. 48 is a block diagram, showing in detail the structure of the control system of this embodiment. By turning on an interchange switch 2, the feedback control is enabled. The timing of trigger for the sensor output feedback may be the moment just when both the positional difference of the control system of the linear motor and the positional difference of the control system of the second driving means come into a certain tolerable range. Alternatively, it may be determined on the basis of the time lapse from generation of a positioning drive by the linear motor. Since the control system of the linear motor is based on high gain feedback, any displacement of the second driving means does not affect the positioning precision. Also, the current flowing to the linear motor reduces with decreasing offset. Thus, it is possible to suppress heat generation sufficiently.

Figure 49:
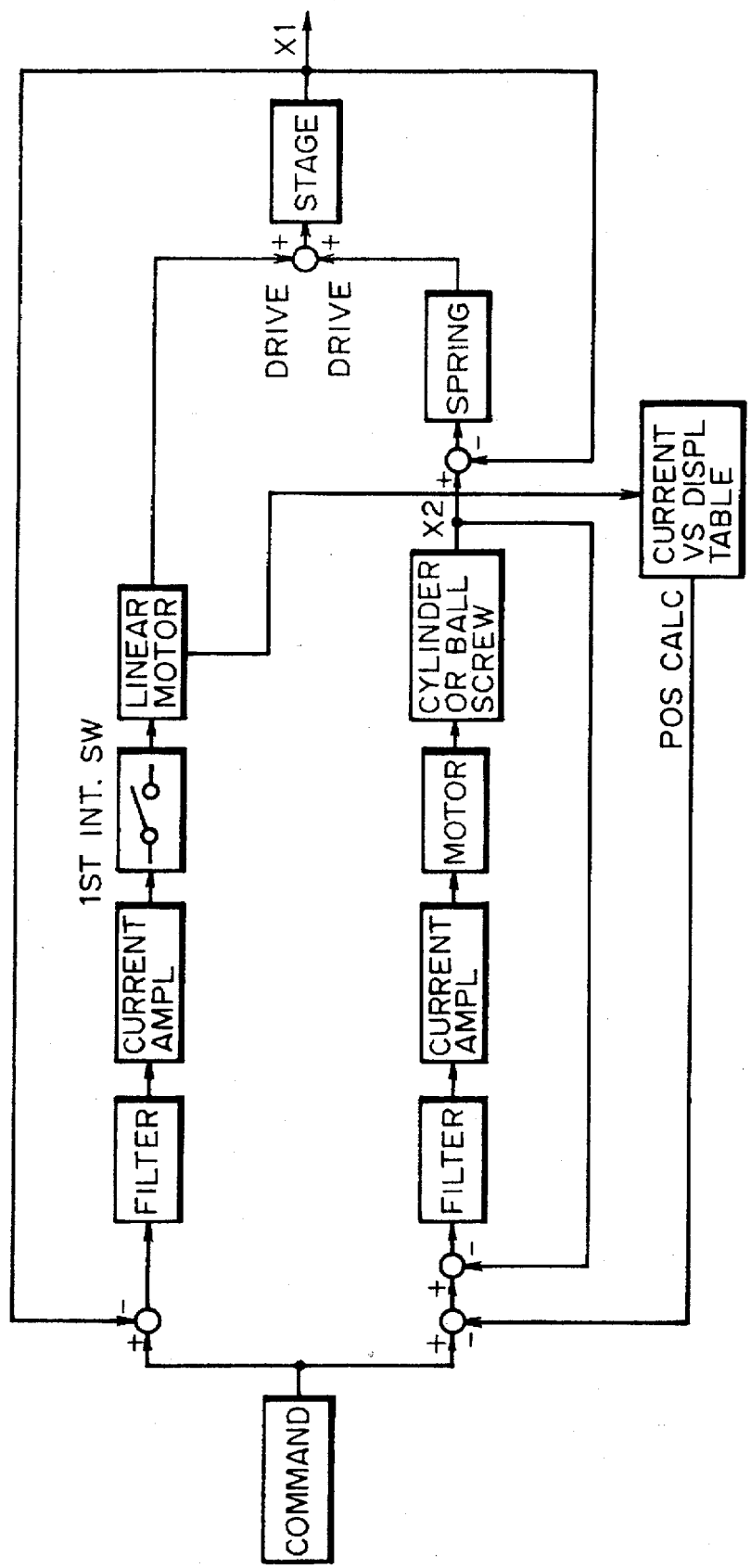
FIG. 49 is a block diagram of a modified form of the control system.

FIG. 49 is a block diagram, showing a modified form of the preceding embodiment. A contrast table of the spring displacement versus the corresponding electric current level flowing to the linear motor, is prepared beforehand. Then, the current flowing to the linear motor is detected and, from the detected current and this table, the amount of spring displacement is calculated. The calculated displacement is then fed back to the instruction signal to the second driving means. By this, substantially the same function as of the FIG. 48 example is assured. This removes the necessity of using a sensor for detecting the spring displacement.

In accordance with this embodiment wherein the spring displacement is fed back to the control, the linear motor only need to suppress vibration due to disturbance during the positioning operation. Thus, there is an additional advantage of minimized heat generation.

It is to be noted that the concept of this embodiment is not limited to a system having a leaf spring means such as the FIG. 1 example, but it is similarly applicable also to a system having an air cylinder such as the third embodiment (FIGS. 14–18) wherein the inside air of the air cylinder corresponds to the spring).

Eighth Embodiment

An eighth embodiment will now be explained. Since the general structure of the stage device is similar to that of the first embodiment (FIGS. 1–3), description of the structure will be omitted here.

If during the stepwise motion quick acceleration is provided by the second driving means, there occurs residual vibration since a spring means is interposed. For reducing a force which cause flexure to the spring, use of a smaller spring constant is desirable. However, it causes a high possibility of residual vibration. If residual vibration occurs, it takes a longer time until the vibration is suppressed. Quick suppression results in an increase in heat generation of the linear motor.

In the present embodiment in consideration thereof, an acceleration signal which can be differentiated is applied to the stage, to thereby avoid generation of residual vibration. This will be explained below in more detail. In the model of FIG. 3, the equation of motion of the X stage is as follows:

$$m[(d^2x_1)/(dt^2)]=k(x_2-x_1)$$

wherein $x_1$ is the position of the X stage; $x_2$ is the position of the end of the X screw shaft (representative position of the nut engaging with the screw); k is the spring constant of the leaf spring; and m is the mass of the stage.

Namely, the acceleration $d^2x_1/d$ of the X stage is proportional to the quantity of strain $(x_2-x_1)$ of the X leaf spring. Modifying this equation, the movement displacement $x_2$ of the X screw shaft end can be expressed as follows:

$$x_2=(m/k)[x_1+(d^2x_1)/d]$$

$$(x^2)'=(m/k)\{x_1'+[(d^2x_1)/d]'\}$$

$$(x^2)''=(m/k)\{x_1''+[(d^2x_1)/d]''\}$$

The quantity $x_2$ is proportional to the amount of rotation of the motor, and it is fed back to a semi-closed control system and is controlled. In order to suppress residual vibration, following the semi-closed control system, it is necessary that in the equations above at least the screw end speed $(x_2)'$ is continuous. Preferably, $(x_2)''$ should be continuous, too. In order to provide continuous screw end speed $(x_2)'$, it is necessary that the differentiation of stage acceleration as represented by $(d^2x_1/d)'$ is continuous. Namely, it is necessary that the stage acceleration $(d^2x_1/d)$ can be differentiated. This is summarized in FIG. 50.

Figure 50:
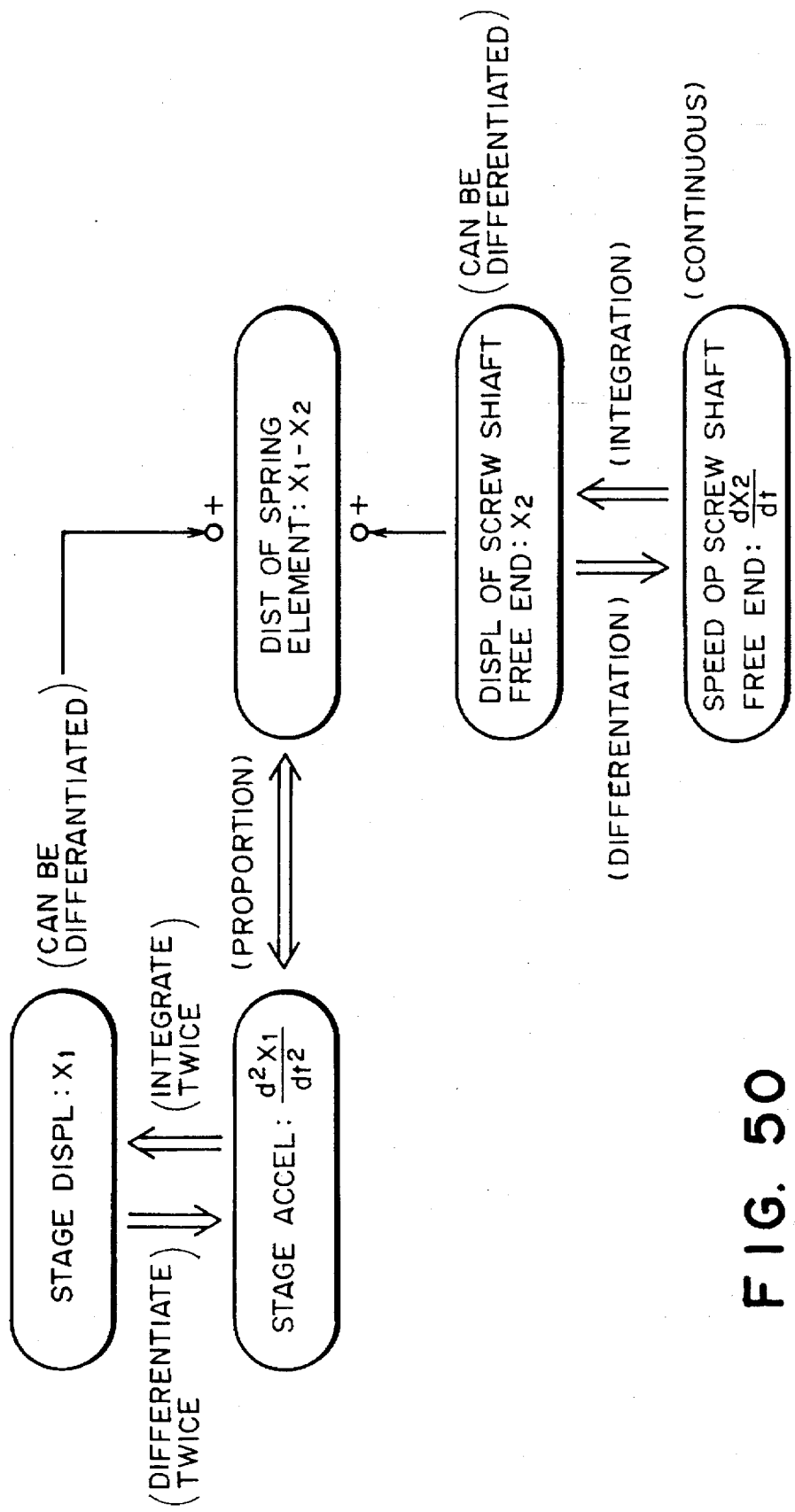
FIG. 50 is a schematic view for explaining the concept according to an eighth embodiment of the present invention.

FIG. 50 shows an example of a control system having an acceleration pattern such as above. First, a stage acceleration instruction signal ($d^2x_1/d$) is generated and, on the basis of this, the following is produced:

$$x_2=(m/k)[x_1+(d^2x_1)/d]$$

Then, this is converted into the amount of rotation of the X motor and, subsequently, the difference between it and the actual amount of rotation of the X motor is detected. On the basis of the detection, the motor is driven by using a control system such as a PLL, for example.

Figure 52:
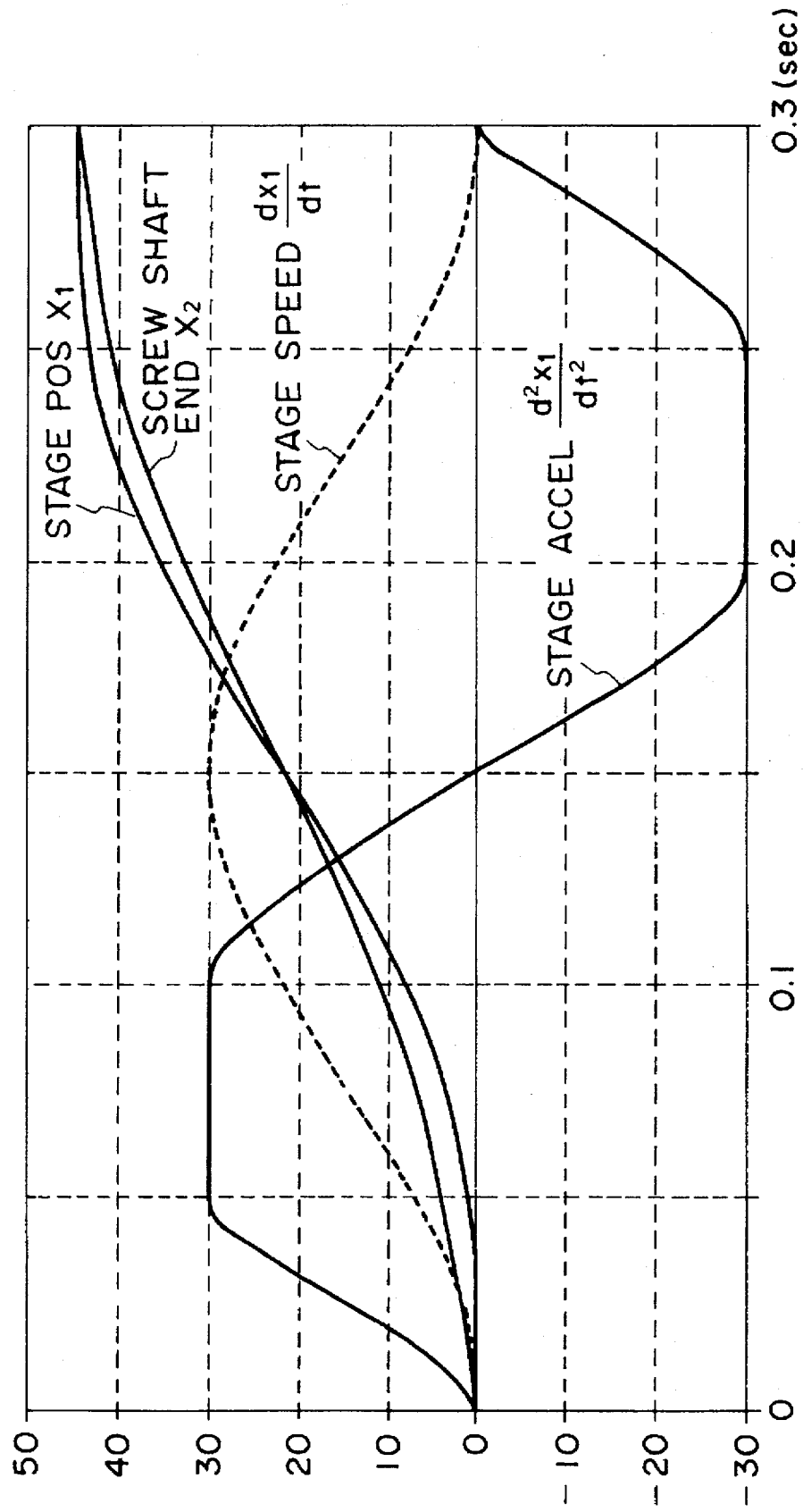
FIG. 52 is a graph of stage movement curves.

FIG. 52 shows movement curves of the stage. As illustrated, when the motor stops, the acceleration $d^2x_1/d$ and the speed $dx_1/dt$ of the X stage and the distortion ($x_1-x_2$) of the X leaf spring becomes zero. Namely, the motor stops, with no kinetic energy for producing vibration and with no distortion energy of the spring element.

There may occur an error in the stop position of movement, of an amount corresponding to the product of the X stage speed at the initiation of movement with the movement time period. Since however the stationary state has been held by the linear motor just before the initiation of movement, the stage speed at the initiation of movement is close to zero such that such a positional error at the time of completion of the movement is almost zero.

The above relates to the control with respect to the X direction, and the control with respect to the Y direction can be done similarly.

Figure 53:
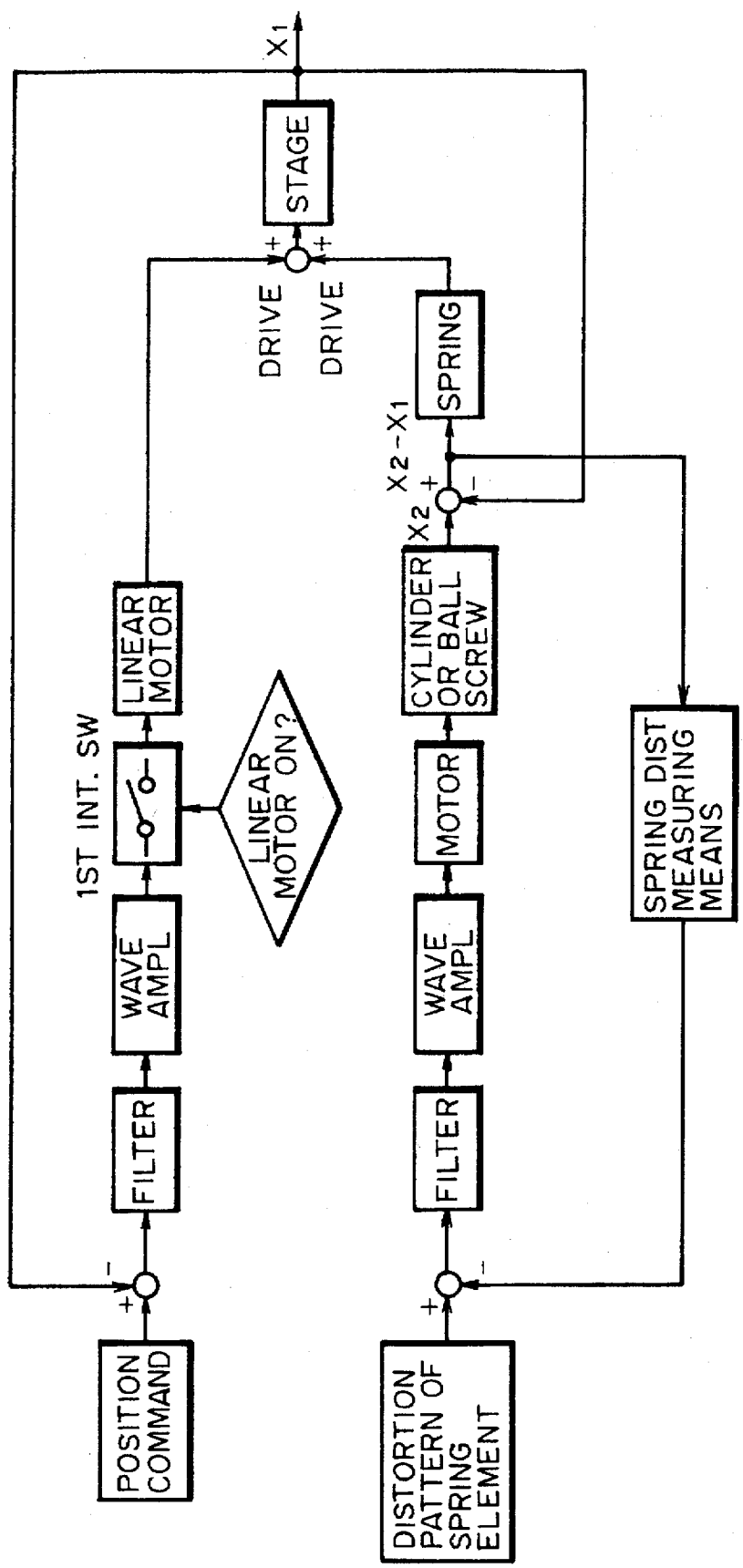
FIG. 53 is a block diagram of a modified form of the control system of FIG. 51.

FIG. 53 is a diagram, showing a modified form of the control system of this embodiment. This example provides a semi-closed control system wherein the amount of flexure or deflection of a spring is controlled in accordance with the following equation:

$$m[(d^2x_1)/d]=k(x_2-x_1)$$

First, like the preceding embodiment, an acceleration signal ($d^2x_1/d$) to the stage which can be differentiated is generated. Then, in accordance with the equation above, a spring flexure instruction pattern ($x_2-x_1$) is determined. The stage device of this embodiment is provided with a sensor (strain gauge or gap sensor) for detecting displacement of the spring, as described hereinbefore, and therefore it is possible to measure the amount of deflection continuously.

Here, the differences between the flexure instruction pattern and the amounts of actual deflection as measured successively by the sensor is detected. The result is computed by a control system such as a PLL, for example, and on the basis of which the motor is driven.

Figure 51:
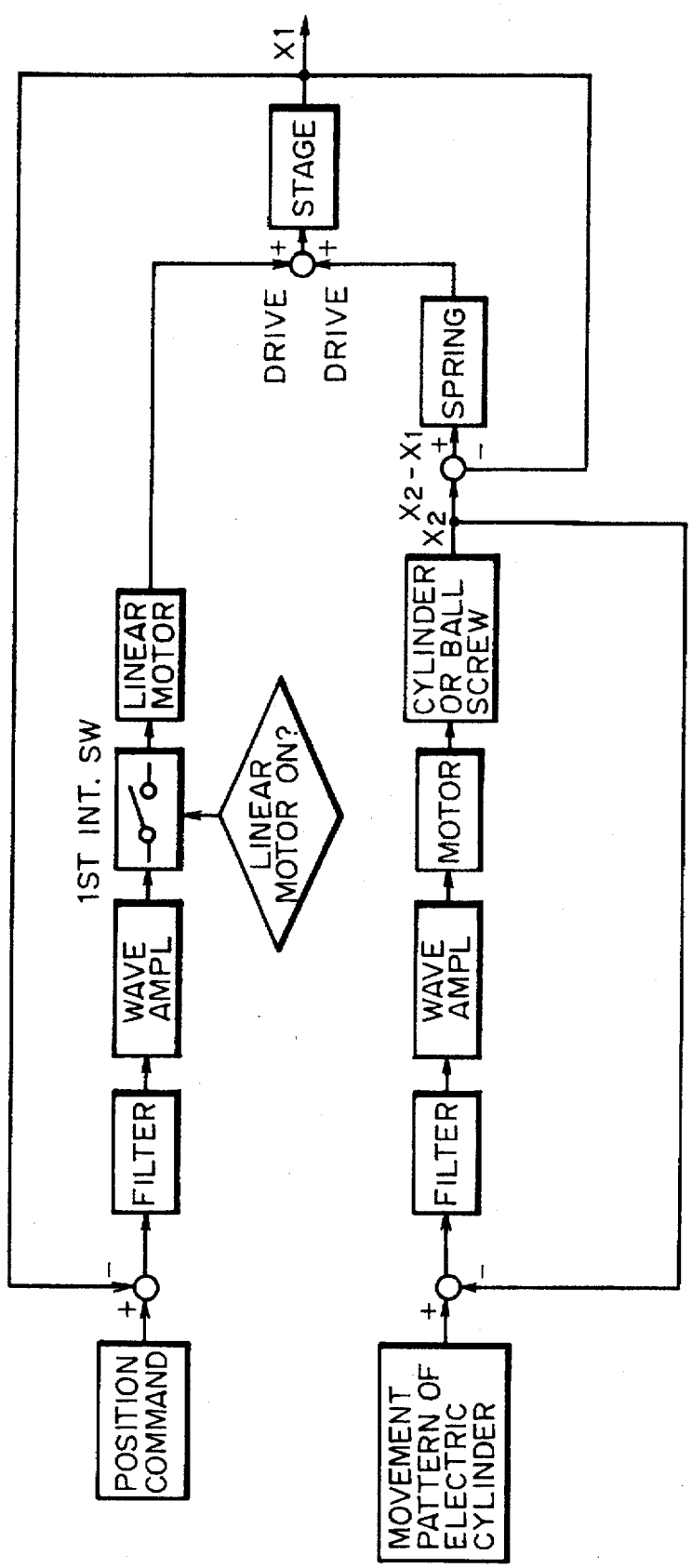
FIG. 51 is a block diagram of a control system of the eighth embodiment.

The differentiatable function patterns shown in FIGS. 51 and 53 each is defined on the basis of an exponential function, a trigonometric function or a power series. This function pattern may be memorized beforehand within an inside memory of the controller, or it may be inputted appropriately from an outside controller.

Ninth Embodiment

A ninth embodiment will now be explained. Since the general structure of the stage device is similar to that of the third embodiment (FIGS. 14–18), description of the structure will be omitted here.

Figure 54:
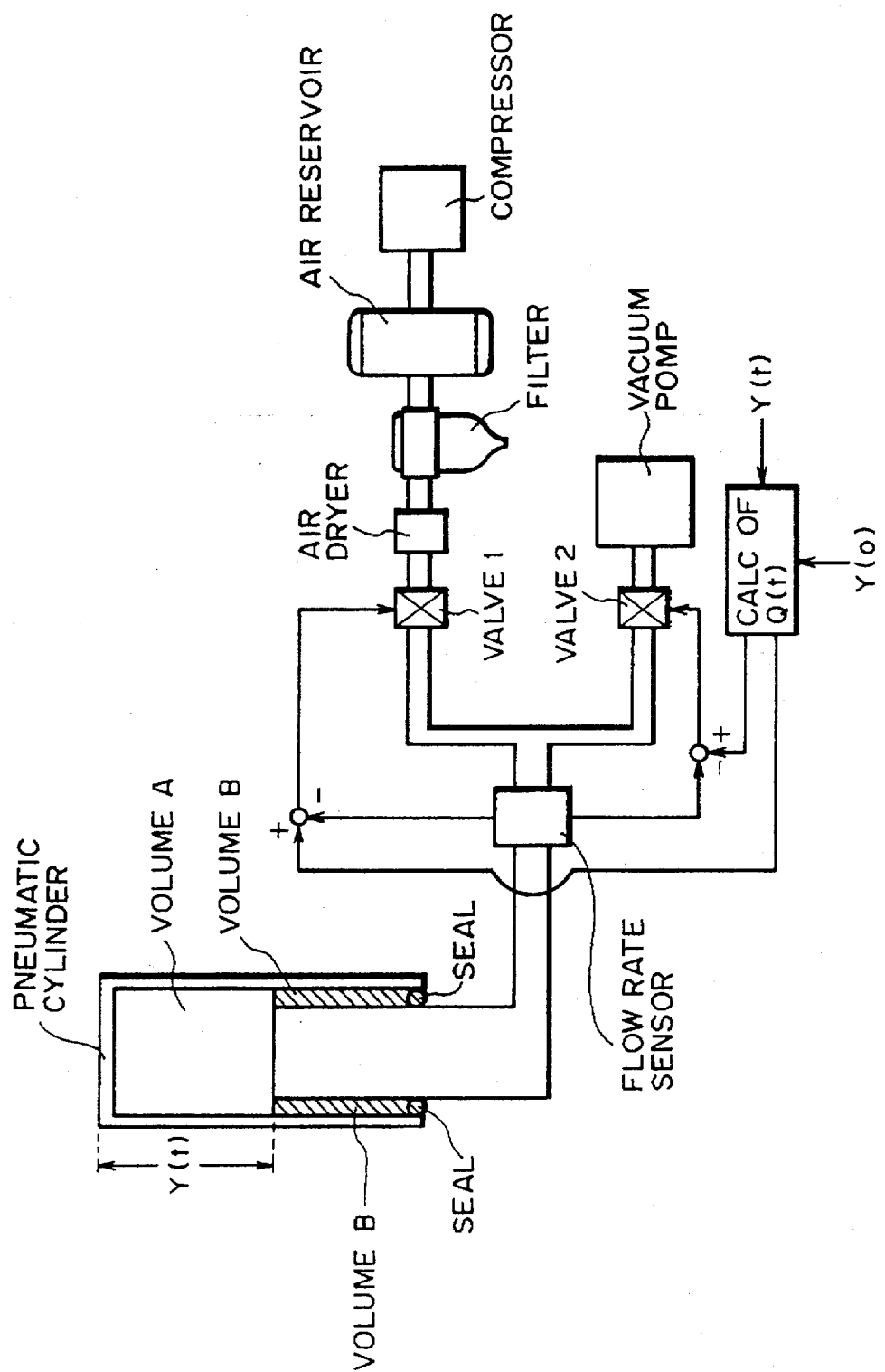
FIG. 54 is a schematic and diagrammatic view of a driving system for a vertical type air cylinder.
Figure 55:
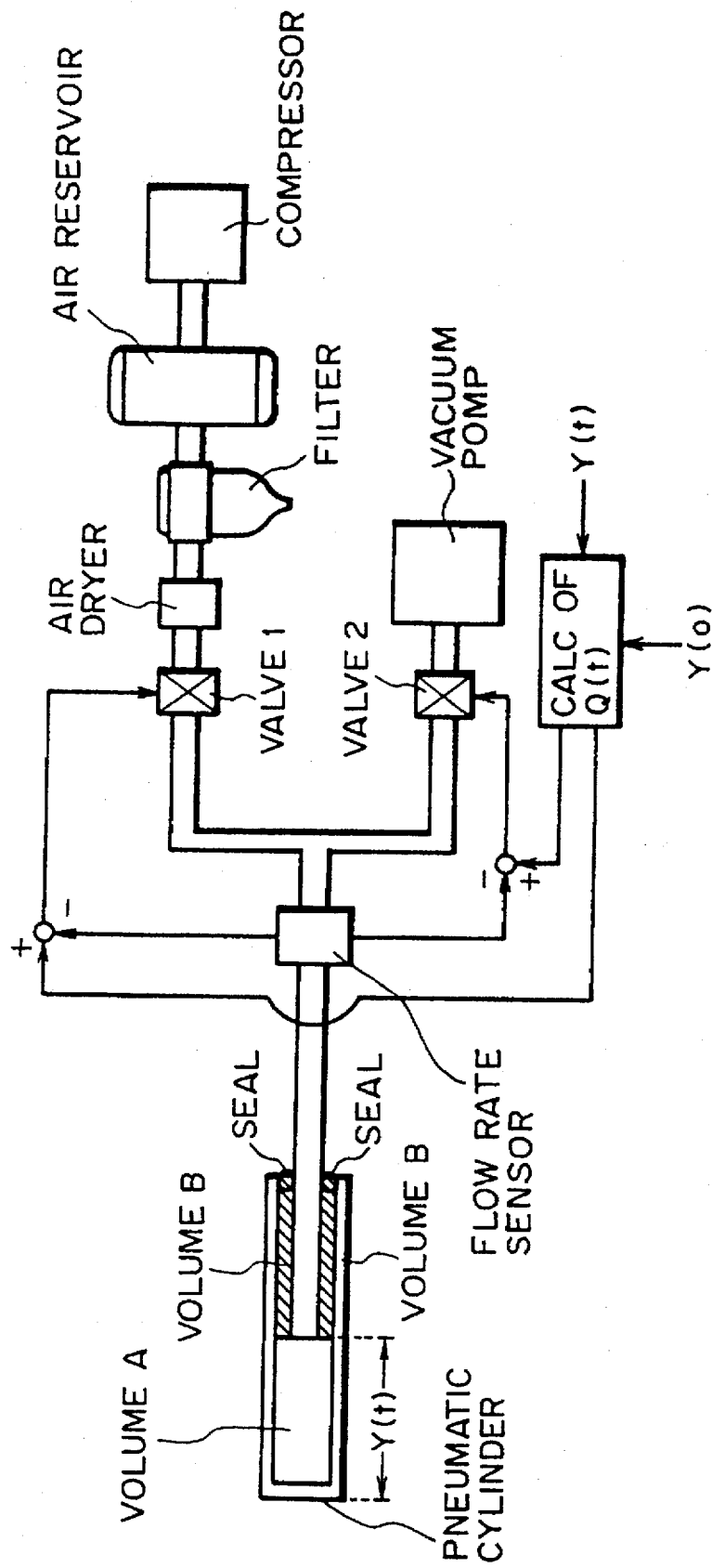
FIG. 55 is a schematic and diagrammatic view of a driving system for a lateral type air cylinder.

FIGS. 54 and 55 show a driving system for an air cylinder in examples where the air cylinder of FIG. 14 is of vertical type (Y direction) and lateral type (X direction), respectively. In FIGS. 54 and 55, since as compared with the volume A the volume B can be considered as being very small, it is now assumed that the volume B can be neglected.

Figure 56:
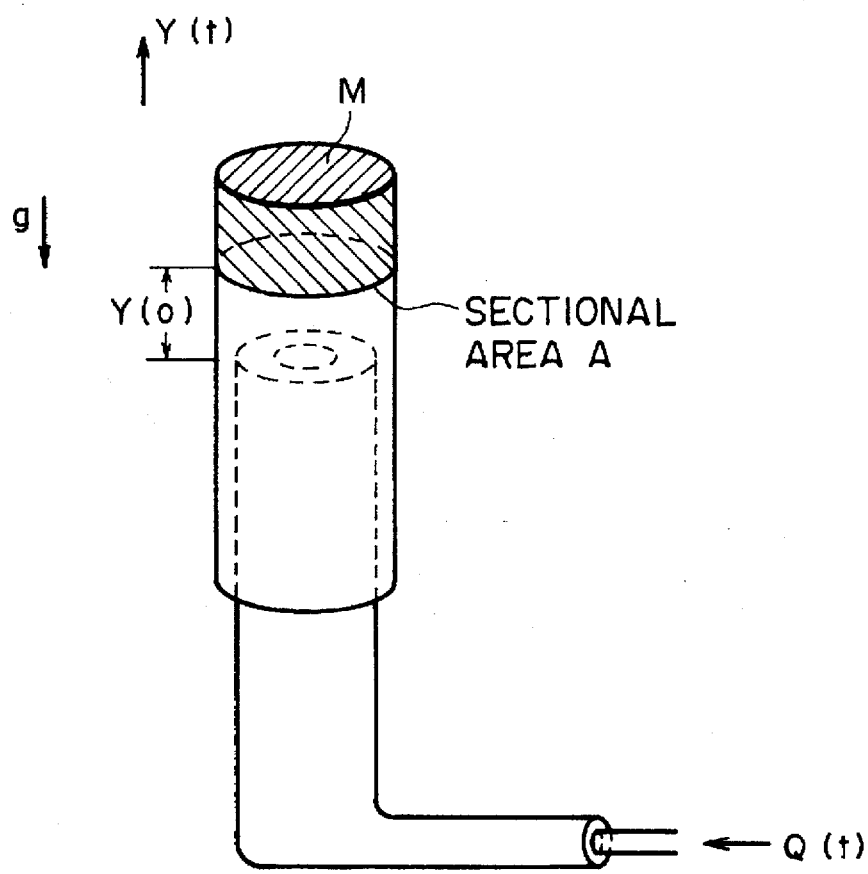
FIG. 56 is a schematic view for explaining the principle of drive of an air cylinder.

Now, the principle of drive of an air cylinder will first be explained. FIG. 56 is a model for explaining the principle of driving an air cylinder. While FIG. 56 shows an example of a vertical type air cylinder, the same principle applies to a lateral type air cylinder. However, in the case of lateral type, the weight term g is irrelevant and can be neglected. In the drawing, the flow rate Q(t) of inside air of the air cylinder is given by:

$$Q(t)=[MY(t)Y(t)+MY(t)Y(t)+MgY(t)+MY(t)Y(0)+PAY(t)]/RT \quad \text{(vertical type)}$$

$$Q(t)=[MY(t)Y(t)+MY(t)Y(t)+MY(t)Y(0)+PAY(t)]/RT \quad \text{(lateral type)}$$

From these equations, the position shift curve of the air cylinder can be differentiated successively three times and, if the initial position of the air cylinder (i.e., the current position thereof) is measured constantly, it is possible to determine the flow rate pattern of air to be supplied to the air cylinder. Further, it is possible to control the air cylinder in accordance with the flow rate pattern, by monitoring the flow rate continuously. Thus, it is possible to move the air cylinder to a desired position correctly.

Figure 57:
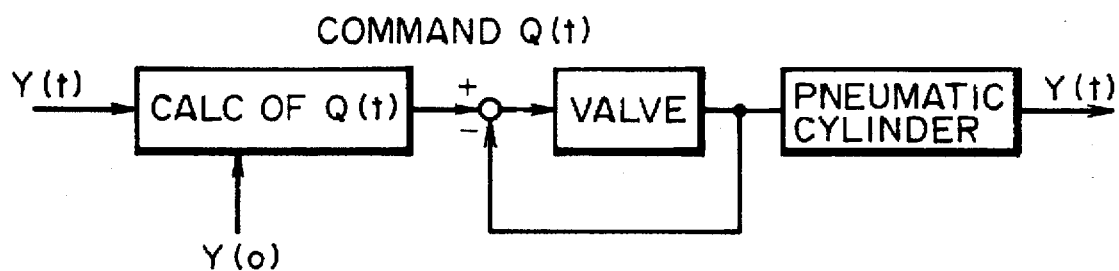
FIG. 57 is a block diagram of a control system for an air cylinder.
Figure 58A:
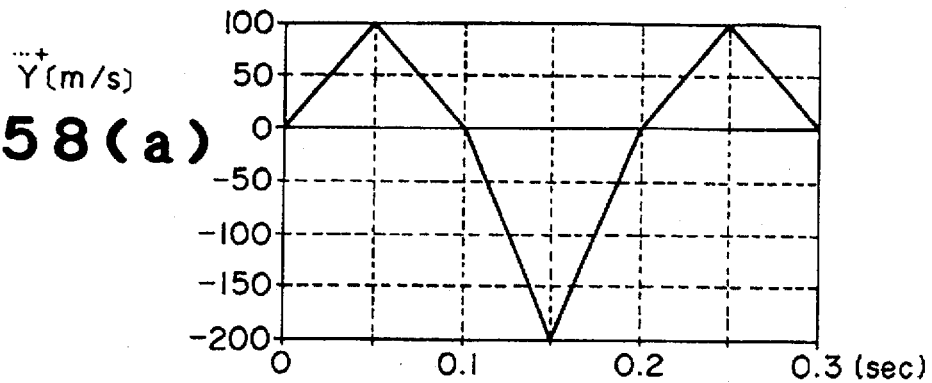
FIGS. 58(a) through 58(d) are graphic views for explaining drive control of an air cylinder.
Figure 58B:
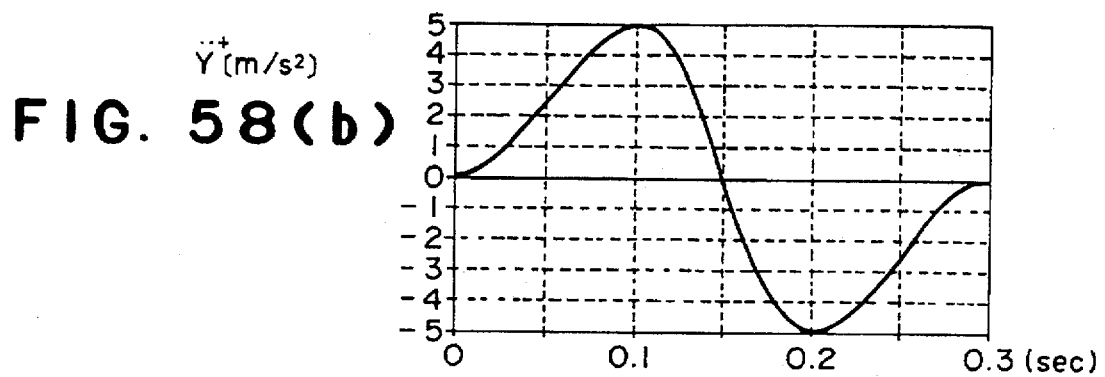
Figure 58C:
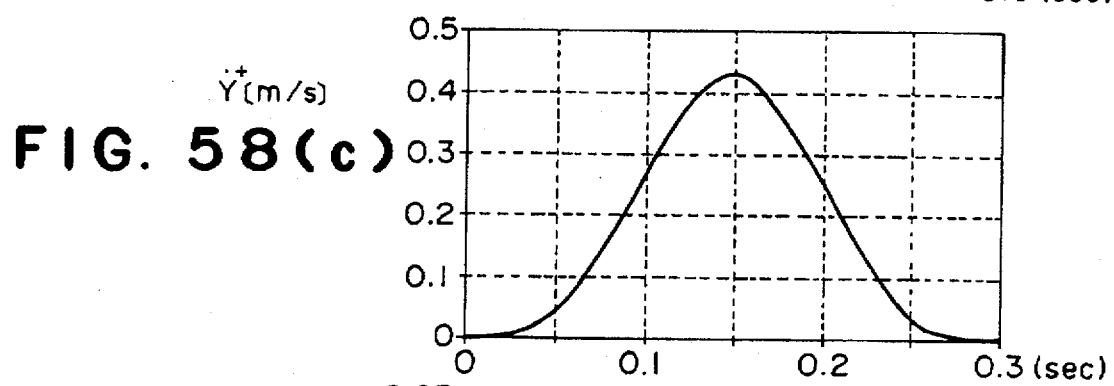
Figure 58D:
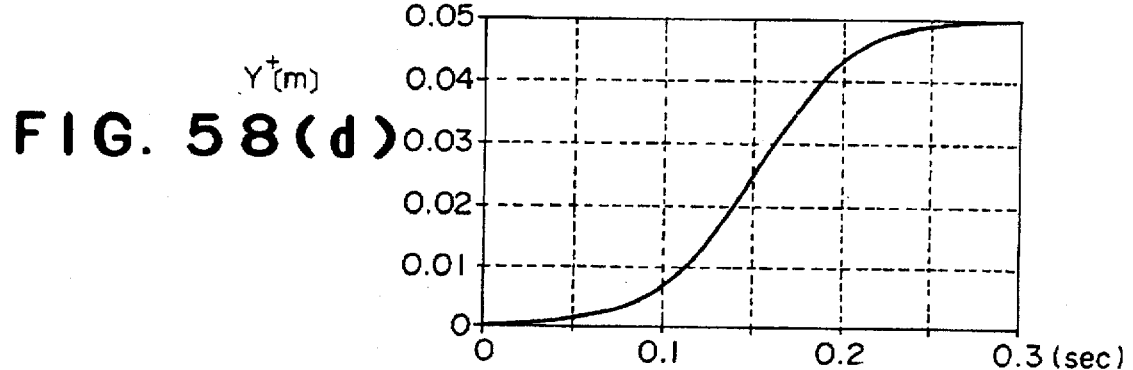

FIG. 57 is a block diagram of a control system for controlling drive of an air cylinder. FIG. 58 shows examples of position shift curves of the air cylinder which can be differentiated successively three times. As seen from FIGS. 58(a) through 58(d), it is possible to avoid residual vibration due to drive of an air cylinder, by making equal to "zero" each of the speed Y(t), acceleration Y(t) and a change Y(t) of acceleration of the air cylinder at the moment of stoppage of the air cylinder.

Figure 59:
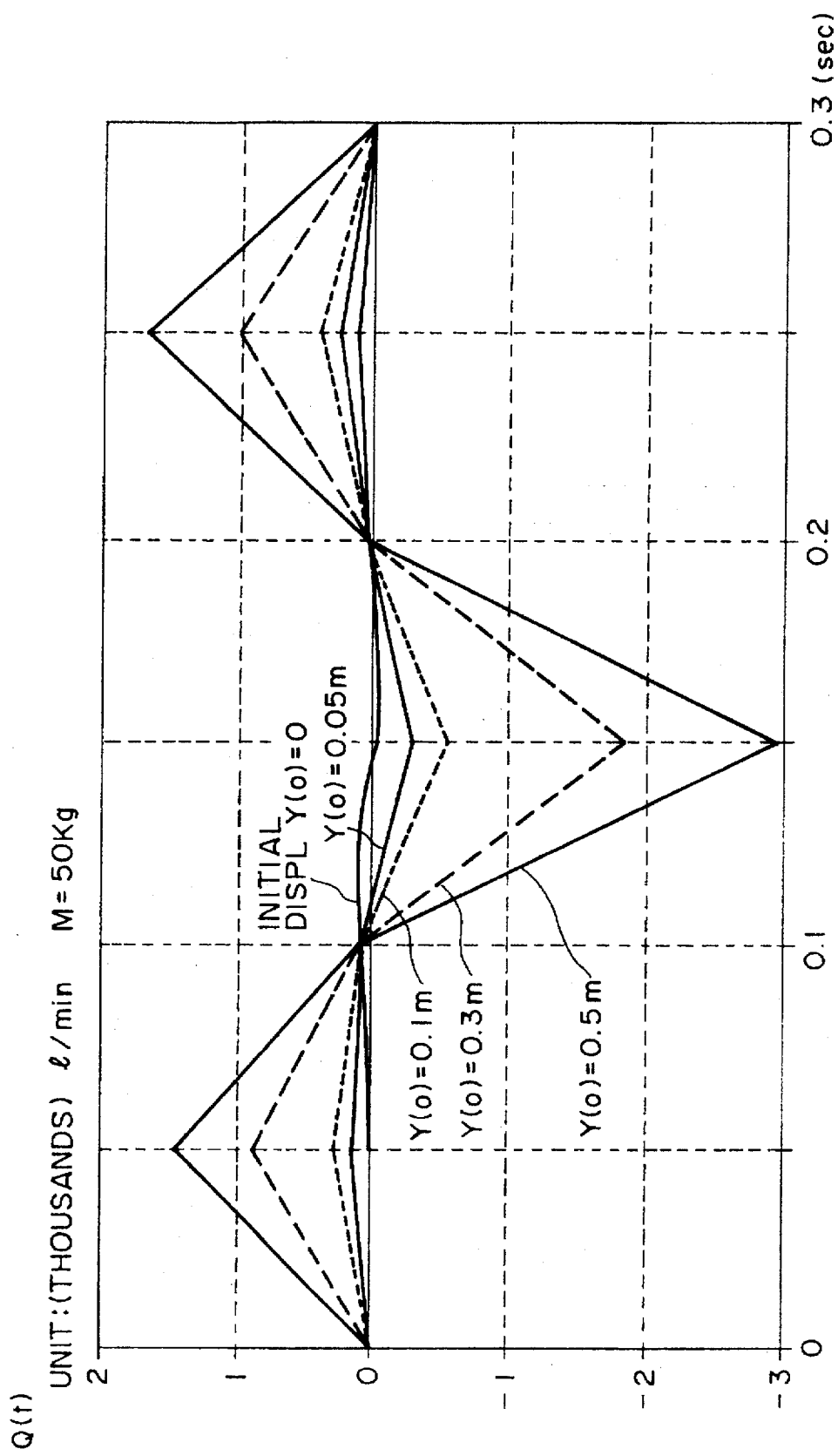
FIG. 59 is a further graphic view for explaining drive control of an air cylinder.
Figure 60:
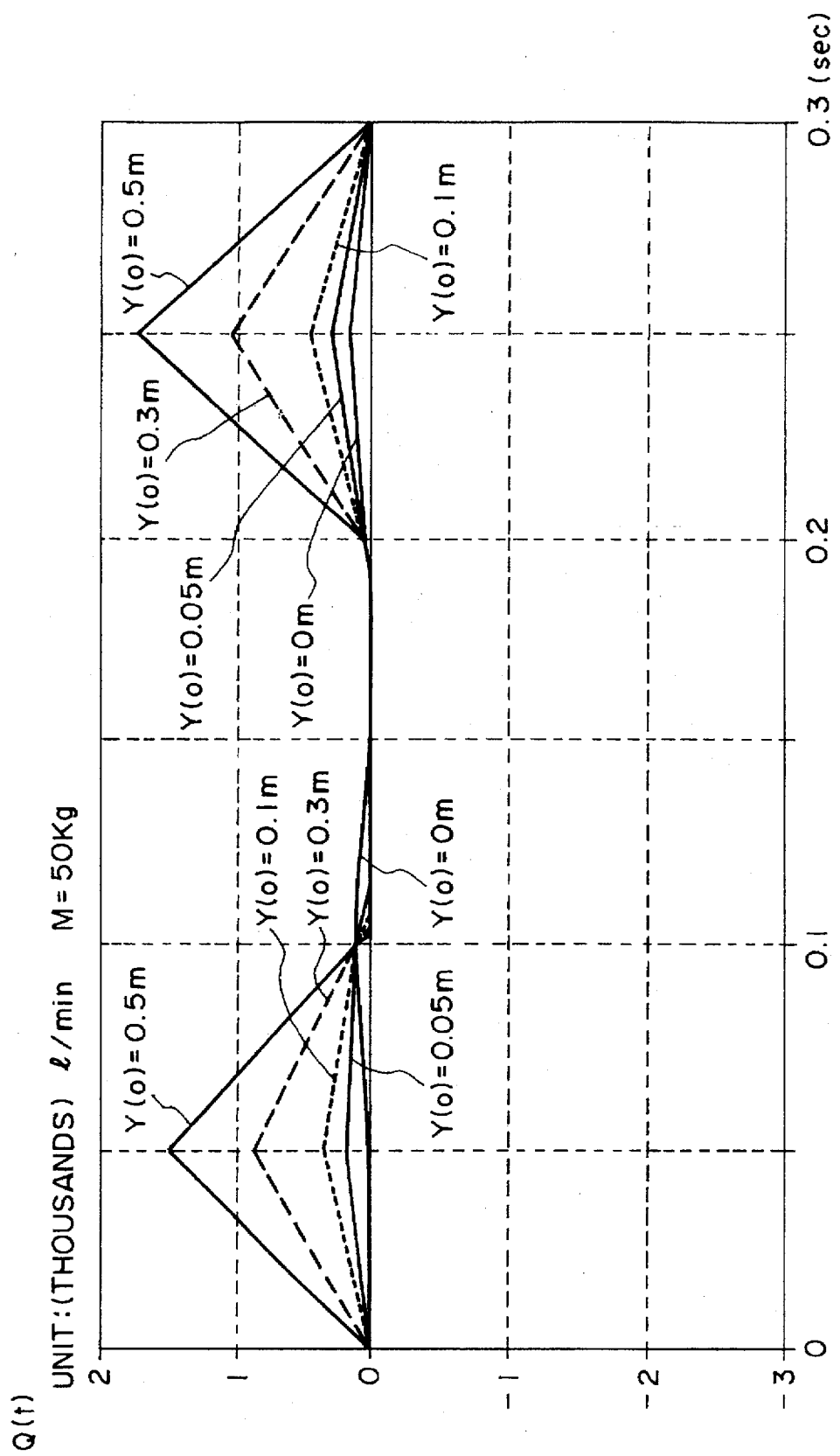
FIG. 60 is a still further graphic view for explaining drive control of an air cylinder.
Figure 61:
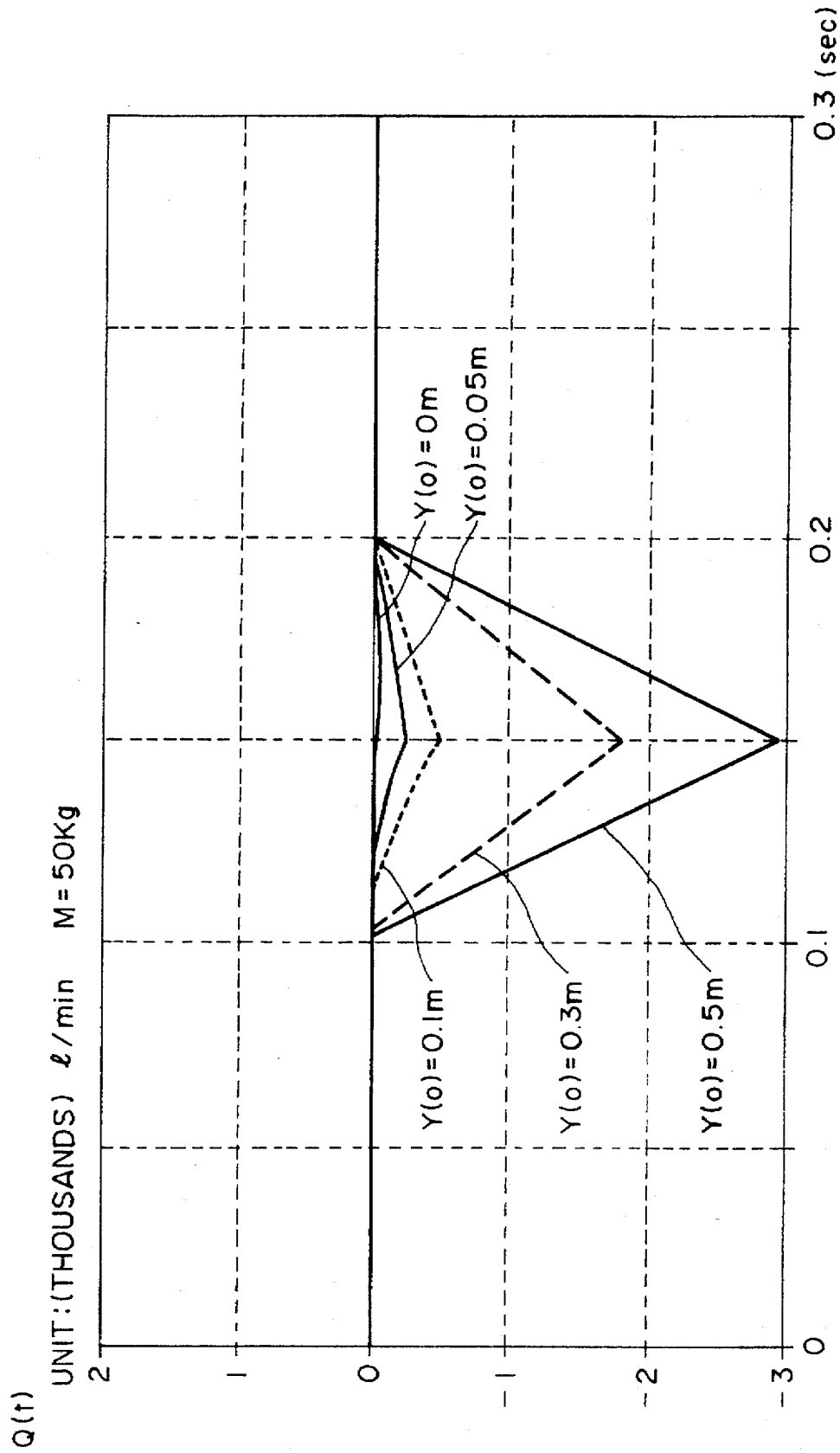
FIG. 61 is a yet further graphic view for explaining drive control of an air cylinder.

FIG. 59 shows air flow rate curves in a case where the initial position of the air cylinder changes variously, relative to the position shift curves (FIG. 58) of the air cylinder which can be differentiated successively three times. FIGS. 60 and 61 are graphs corresponding to a case where the flow rate curves of FIG. 59 are positive and a case where they are negative. FIGS. 60 and 61 if combined correspond to the graph of FIG. 59.

In accordance with the principle of drive of an air cylinder described above, the manner of driving the air cylinders of FIGS. 54 and 55 will now be explained. As a common feature, the current position of the air cylinder is measured continuously and, when a position shift curve which can be differentiated successively three times and by which the speed, the acceleration and the acceleration once differentiated of the air cylinder as it is at the target position in the drive, are all made equal to zero are given, the flow rate curve of the air to be supplied to the air cylinder is calculated while taking into account the initial position. Then, by controlling the supply of air into the cylinder in accordance with the flow rate curve, it is possible to drive the air cylinder to the target position. Here, the flow rate to the air cylinder is measured by a flow rate sensor continuously.

First, the timing of opening/closing valves 1 and 2 for driving the air cylinder in accordance with a specified flow rate curve (see FIG. 59) will be explained. In the flow rate curve graph (FIG. 60), the valve 1 is opened and it is controlled in accordance with the positive flow rate curve. On this occasion, the valve 2 is held closed. Also, when the flow rate curve is negative (FIG. 61), the valve 2 is opened and it is controlled in accordance with the negative flow rate curve so that the air is discharged by a pump. On this occasion, the valve i is held closed. By opening/closing the valves and controlling them in this manner, it is possible to make the air cylinder drive to its desired value. In order to stop it, both the valves 1 and 2 are closed.

In accordance with this embodiment, when air to the cylinder stops, it has no kinetic energy. Further, the linear motor is being stopped or, alternatively, only a drive limited to a very low level acts. Thus, substantially no residual vibration occurs to the movable stage. Consequently, it is possible to provide a high speed stage device of small heat generation.

Tenth Embodiment

Figure 62:
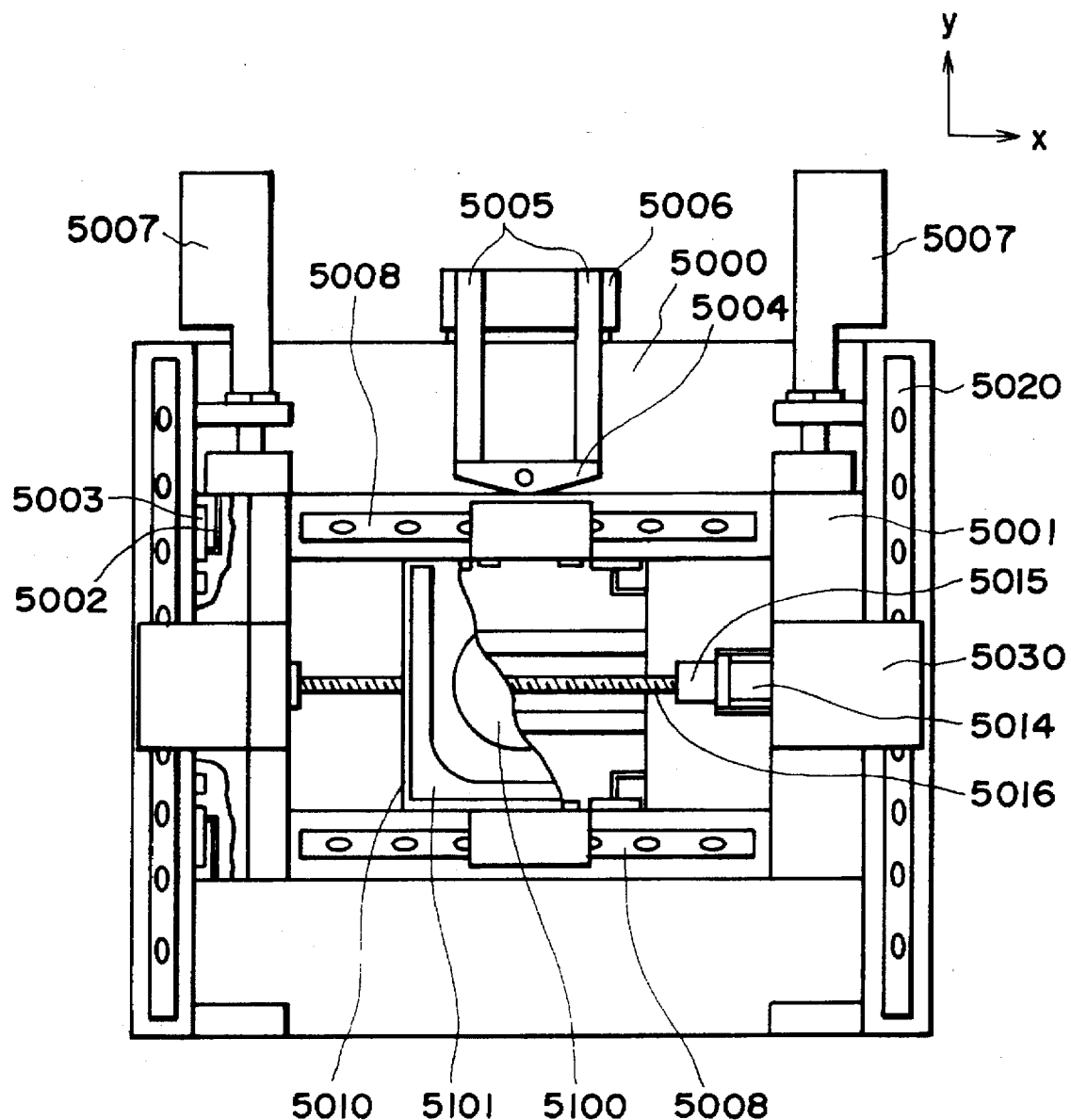
FIG. 62 is a representation, showing the general structure of a tenth embodiment of the present invention.
Figure 63:
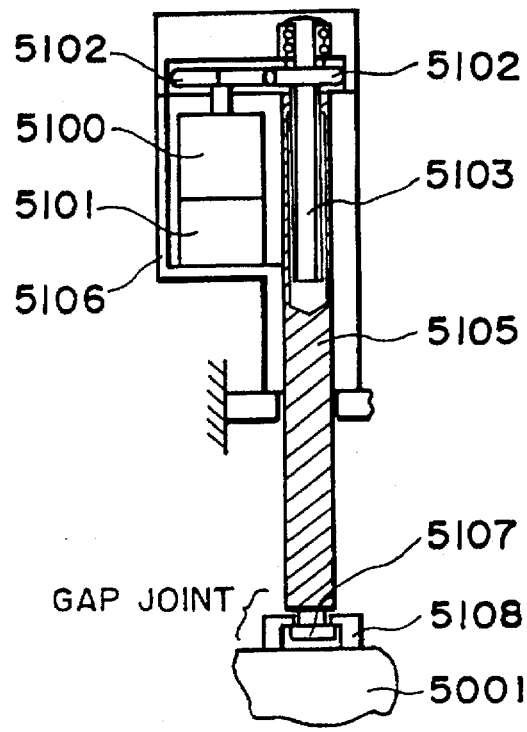
FIG. 63 is an enlarged view, showing details of a portion of the tenth embodiment.

A tenth embodiment of the present invention will now be explained. An important feature of this embodiment resides in that a gap or clearance joint having a clearance is provided to connect the second driving means and the stage to each other. FIG. 62 shows the general structure of the stage device of this embodiment. FIG. 63 shows the structure of the second driving means as viewed in the Y direction, and FIG. 64 shows the same as viewed in the X direction.

In FIG. 62, a stage base 5001 is disposed with its base surface extending vertically (direction of gravity), and a Y stage 5001 of rectangular shape is slidably mounted on the stage base. The stage base 5000 and the Y stage 5001 are guided by a linear air bearing which comprises Y static pressure bearing pressurizing systems 5002 and Y static pressure bearing pads 5003. Y preloading magnet means 5009 is provided so as to hold the stage 5001 on the base 5000 so as to prevent the former from being detached from the latter which is disposed vertically. Mounted through an equalizer mechanism 5004 on the Y stage 5001 is a constant tension spring means 5005 for cancelling the gravity component of the Y stage 5001. The other end of the spring means 5005 is connected to a constant tension spring drum 5006 which is rotatably mounted on the stage base 5000. With this arrangement, the Y stage can be held stationary at a desired position in the Y direction, without being influenced by gravity.

Fixedly mounted on the stage base 5000 are a pair of Y electric cylinders 5007 (second driving means) for moving the Y stage 5001 in the Y direction. FIG. 63 shows the structure of the Y electric cylinder. Y motor (drive source) 5100 is provided with an encoder 5101, and it moves a Y rod 5105 in the Y direction through a Y drive screw 5103 which is rotated through a gear 5102. These components are housed in a casing 5106, and constitute the Y electric cylinder 5007. The Y rod 5105 is provided at an end thereof with an actuator side block 5107. Also, it is provided with a stage side block 5108. This block 5108 covers the actuator side block 5107. The thickness of the actuator side block 5107 is slightly smaller than the space of the stage side block 5108 in the Y direction, whereby a gap or clearance joint is provided. With this gap joint, the Y electric cylinder 5007 is connected to the Y stage 5001 with a small clearance.

First driving means in the Y direction comprises a pair of Y linear motor coils 5020 fixedly mounted on the stage base 5000, and a pair of movable magnets mounted on the Y stage 5001 so as to be opposed to these coils. Thus, a Y linear motor is provided. Inside the Y stage 5001, an X stage 5010 is supported through a Y linear motor coupling plate 5030.

With respect to the X direction, as shown in FIG. 64, the X stage 5010 is guided by a linear air bearing including an X static pressure bearing pressurizing system 5011 and X static pressure pads 5012, with the stage base 5000 and a portion of the inside of the Y stage 5001 functioning as a guide surface. Like the Y stage 5001, the X stage 5010 is held on the stage base 5000 by a preloading magnet 5009 provided on the X stage 5010, so as to prevent the X stage from being detached from the stage base.

The Y stage 5001 has an X motor 5014 (second driving means) mounted thereon to move the X stage 5010 in the X direction. X screw shaft 5016 is connected to this X motor 5014 through a coupling 5015. As shown in an enlarged view of FIG. 64, the X screw shaft 5016 mesh engages with an actuator block 5018, and the rotation of the X screw shaft 5016 causes movement of the actuator side block 5018 in the X direction. The actuator side block 5018 and the stage side block mounted to the X stage 5010 are coupled to each other with a clearance therebetween, whereby a gap joint is provided therebetween. Thus, a drive force can be transmitted from the actuator side block 5018 to the stage side block 5019, by which the X stage 5019 is moved in the X direction.

Figure 64A:
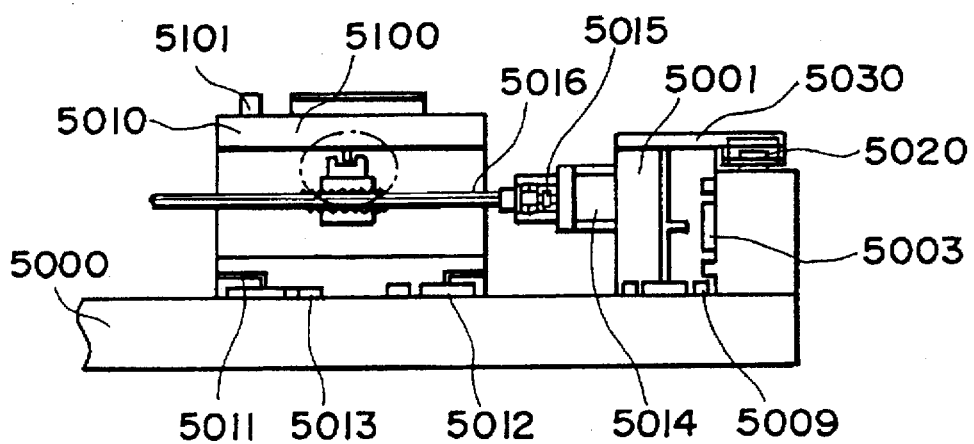
FIGS. 64A and 64B are enlarged views, showing details of another portion of the tenth embodiment.
Figure 64B:
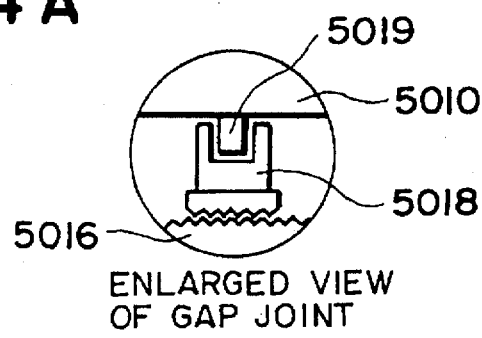

Mounted on the Y stage 5001 is an X linear motor coil 5008 which constitutes an X linear motor (first driving means in the X direction). Mounted on the X stage 5010 are a wafer chuck 5100 and a square mirror 5105 for measurement of the X-Y coordinates through cooperation of laser interferometers.

Where a contact portion of the gap joint such as shown in FIGS. 63, 64A or 64B is covered with a thin layer of a rubber material, for example, for absorbing impact, the impact force during acceleration or deceleration of the stage can be reduced. Sealing the gap joint with an elastomeric sealing material such as a bellows may be preferable since generation of dust is minimized.

Now, the positioning control with respect to the X direction in the structure described above, will be explained. Essentially the same explanation applies to the positioning control with respect to the Y direction. First, electric energy for the stepwise motion of the X stage stage 5010 is applied to the rotary motor 5014 (second driving means). In response, the X screw shaft 5016 rotates to move the actuator block 5018 and presses the same against the stage side block 5019. By this, a drive is applied, and the stage 5010 moves stepwise. At this time, the output of the first driving means (linear motor) is intercepted by a switch so that it produces no drive or, alternatively, it produces a limited, very small drive. Therefore, heat generation is sufficiently suppressed to a level that can be neglected. Close to completion of the stepwise motion, the first driving means (linear motor) is switched to produce a drive for the positioning. As a trigger for this switching, the stage position or the time may be used.

Here, the clearance of the gap joint is set to be larger than the required positional precision. This is a requirement for keeping the stage out of contact to the gap joint when it is positioned by the first driving means (linear motor). Practically, the clearance may preferably be several microns to several tens of microns. With this clearance, the coupling of the stage with the motor and the screw shaft is disconnected, and only the first driving means (linear motor) is connected to the first driving means. In this state, the linear motor is driven through a closed loop control in which the stage position is fed back. Thus, a high mechanical rigidity system is easily assured and high gain (high precision) and stable position control is ensured. As regards heat generation during the positioning operation through the linear motor, the motor and the screw shaft do not generate heat or they are cooled. Moreover, the stepwise motion has already been substantially finished. Therefore, heat generation if any is very low as compared with that during the stepwise motion.

Figure 65:
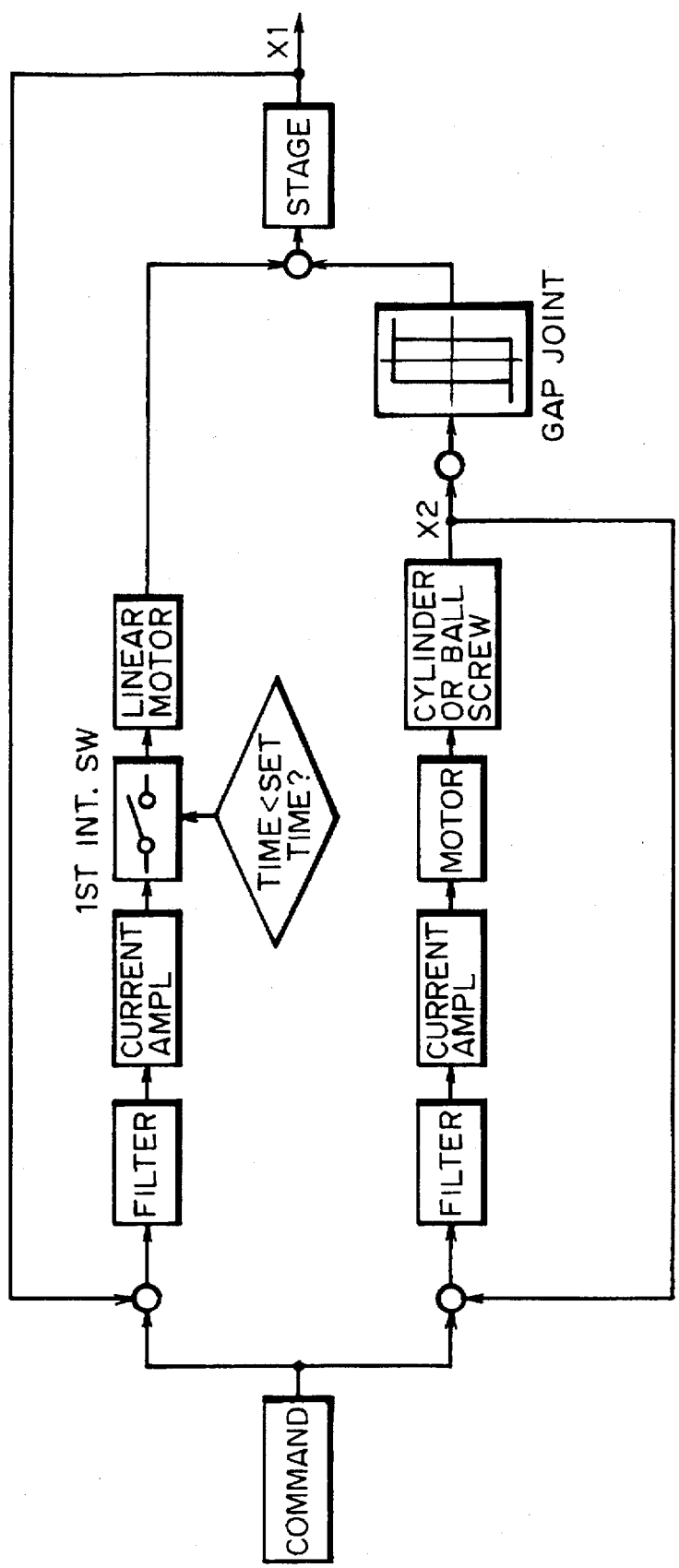
FIG. 65 is a block diagram of a control system of the tenth embodiment.
Figure 66A:
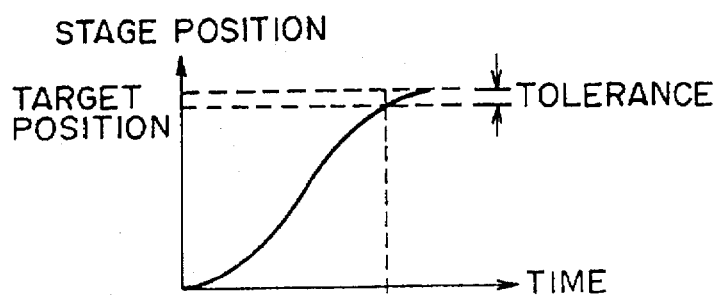
FIG. 66(a) through (c) time charts for explaining the control system of FIG. 65.
Figure 66B:
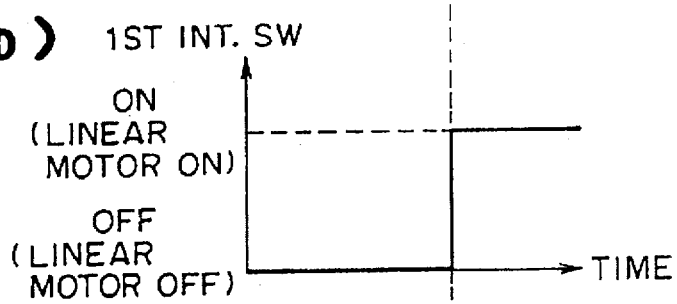
Figure 66C:
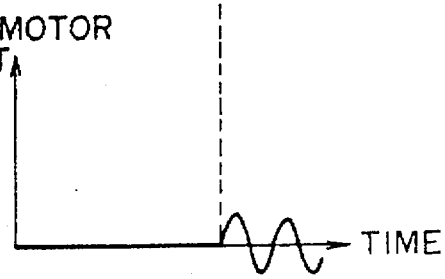
Figure 67:
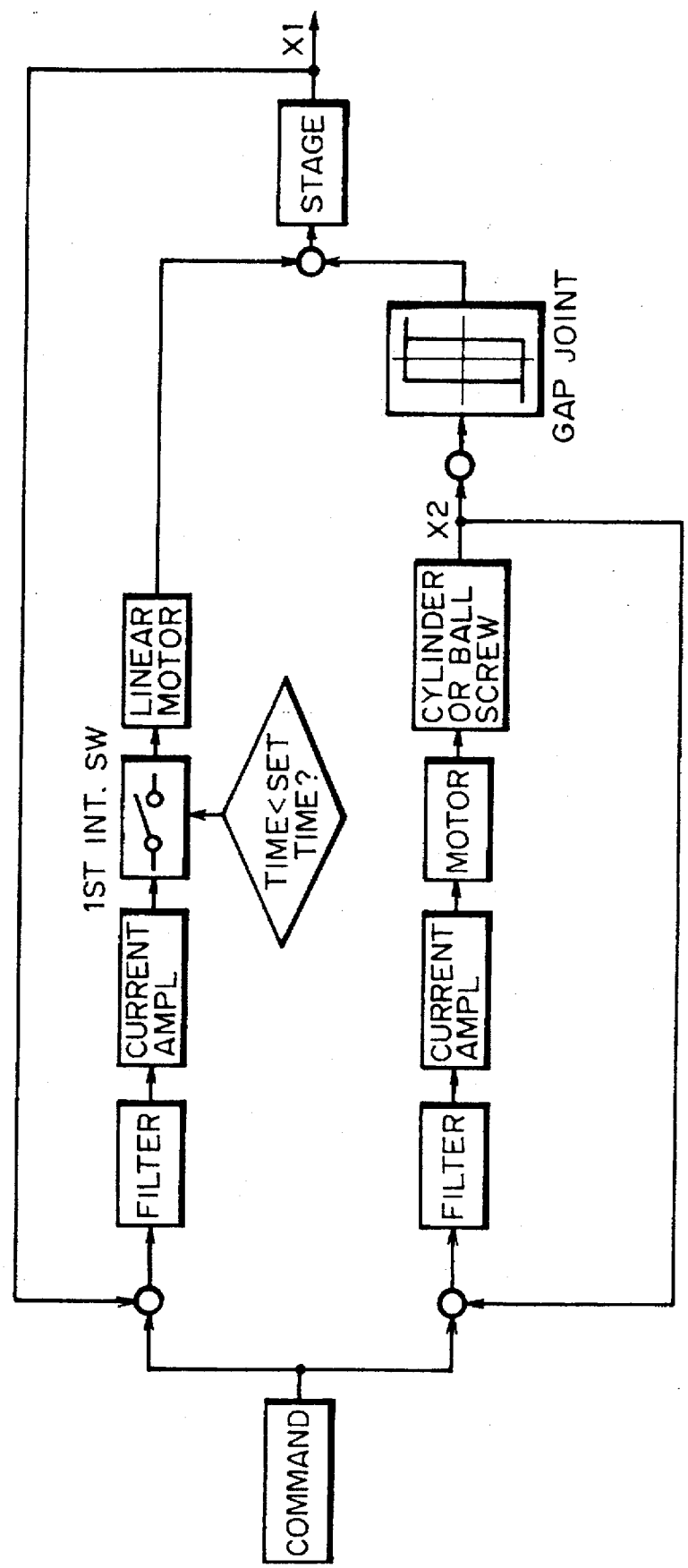
FIG. 67 is a block diagram of a modified form of the control system.
Figure 68A:
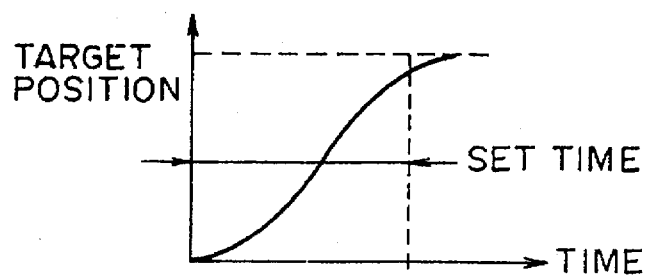
FIGS. 68(a) through (c) are time charts for explaining the control system of FIG. 67.
Figure 68B:
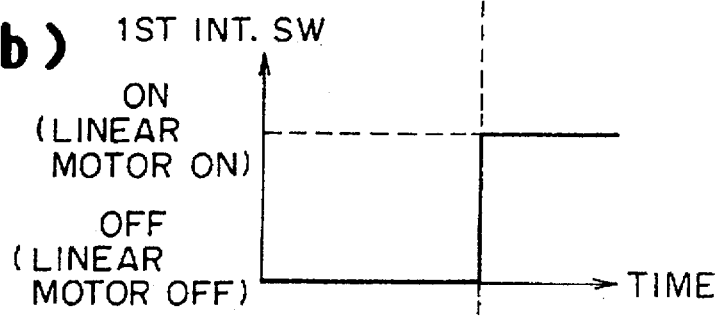
Figure 68C:
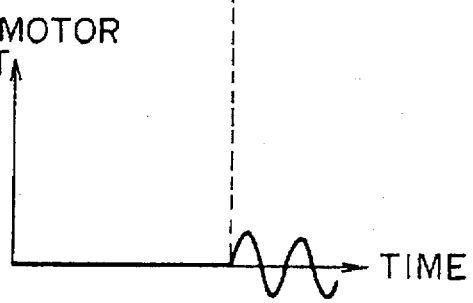

FIG. 65 is a block diagram of an example of a control system of this embodiment. FIGS. 66(a) through 66(c) are time charts wherein the portion (a) shows the relation between the position and the time after supply of an instruction signal, the portion (b) shows the relation between the position of the switch and the time after the application of the instruction signal, and the portion (c) shows the relation between the linear motor current and the time after the application of the instruction signal.

When an instruction signal is applied, in FIG. 65 the switch 1 is open at that moment. Therefore, a drive current is supplied only to the motor of the second driving means illustrated in the lower half of FIG. 65. In response, a drive produced by the motor is transmitted through the gap joint to the stage to accelerate the same, whereby it is moved stepwise in accordance with the position vs. time relation such as depicted by a curve in the portion (a) of FIG. 66. At this moment, i.e., when in the portion (b) of FIG. 66 the switch 1 is at the position disconnecting the linear motor, no current is applied to the linear motor such as shown in the portion (c) of FIG. 66.

As the stage comes close to the target position in accordance with the curve shown in the portion (a) of FIG. 66 and when the difference from the target position comes into a predetermined tolerance, the switch 1 is closed to the side connecting the linear motor (FIG. 66, (b)). In response, a current is supplied to the linear motor (FIG. 66, (c)) so that it applies a drive to the stage. On the other hand, the second driving means is positioned by a servo mechanism which is separate from the stage, and it does not contact the stage. Thus, no drive is transmitted to the stage. Namely, only the linear motor can control the position of the stage. Here, the linear motor need only produce a force to absorb disturbance, tending to cause vibration of the stage. Such force that absorbs the disturbance corresponds to the amplitude of an oscillating wave shown in FIG. 66, (c).

FIGS. 67 and 68(a) through 68(c) are a block diagram and a time chart, showing a modified form of the preceding embodiment. In this example, the timing for a start of the drive of the linear motor is changed to the time period with reference to a start of stepwise motion. The remaining portion is the same as the preceding embodiment.

Figure 69:
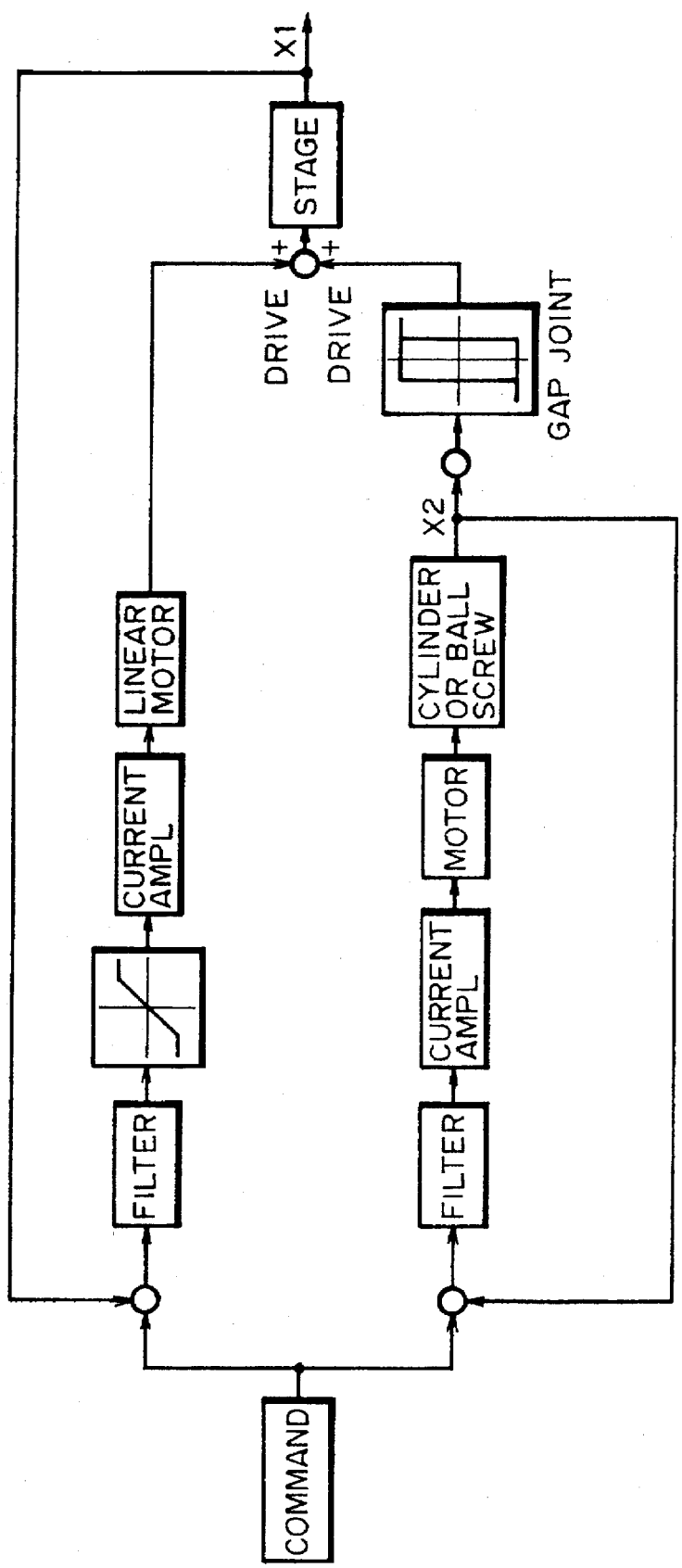
FIG. 69 is a block diagram of a further modified form of the control system.
Figure 70A:
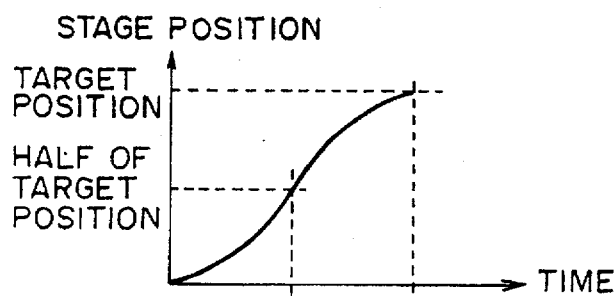
FIGS. 70(a) and (b) are time charts for explaining the control system of FIG. 69.
Figure 70B:
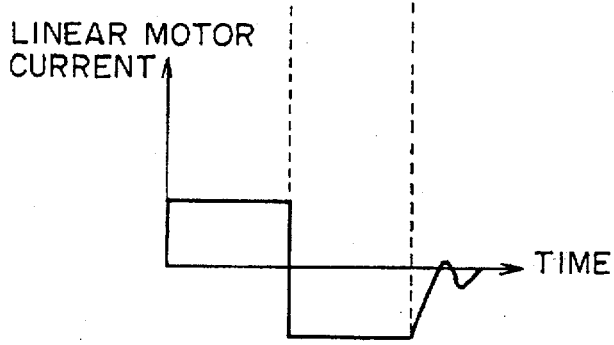

FIGS. 69 and 70(a) and 70(b) are a block diagram and a time chart, showing a further modified form. In this example, the linear motor is driven continuously with limited current, and no drive starting switch is defined. The remaining portion is the same as the preceding embodiment.

While some examples of the position control have been explained above, speed control may preferably be done in the following manner: For constant speed motion of the X stage in the X direction, for example, it is accelerated to a target speed while keeping the actuator side block pressed against the stage side block. Whether the target speed is reached or not is monitored continuously by using a speed detecting means (not shown). As the target speed is reached, the motor is controlled to keep the actuator side block and the stage side block out of contact with each other. To this end, a proximity sensor may be provided between these blocks and the output of the sensor may be fed back to control the motor. Alternatively, the stage position and the motor position may be detected separately, and both of these positions may be fed back to control the motor. In this state, only an air resistance and shearing resistance from the linear air bearing act on the stage. Thus, the linear motor need only produce a force which absorbs these resistances. This arrangement has an advantage in that what is required for the motor control is only to keep the blocks out of contact with each other. This means that a small error in the clearance is allowed: namely, a very high precision is unnecessary for the control. In a conventional system wherein a motor and a stage are continuously connected to each other, the motor speed and the stage speed exactly correspond to each other. Therefore, unless the motor itself is controlled very precisely, the motor may have an influence upon the stage as disturbance. In the system of the present embodiment wherein the connection between the motor and the stage is intercepted during the constant speed motion, such disturbance to the stage is reduced considerably.

Eleventh Embodiment

Figure 71:
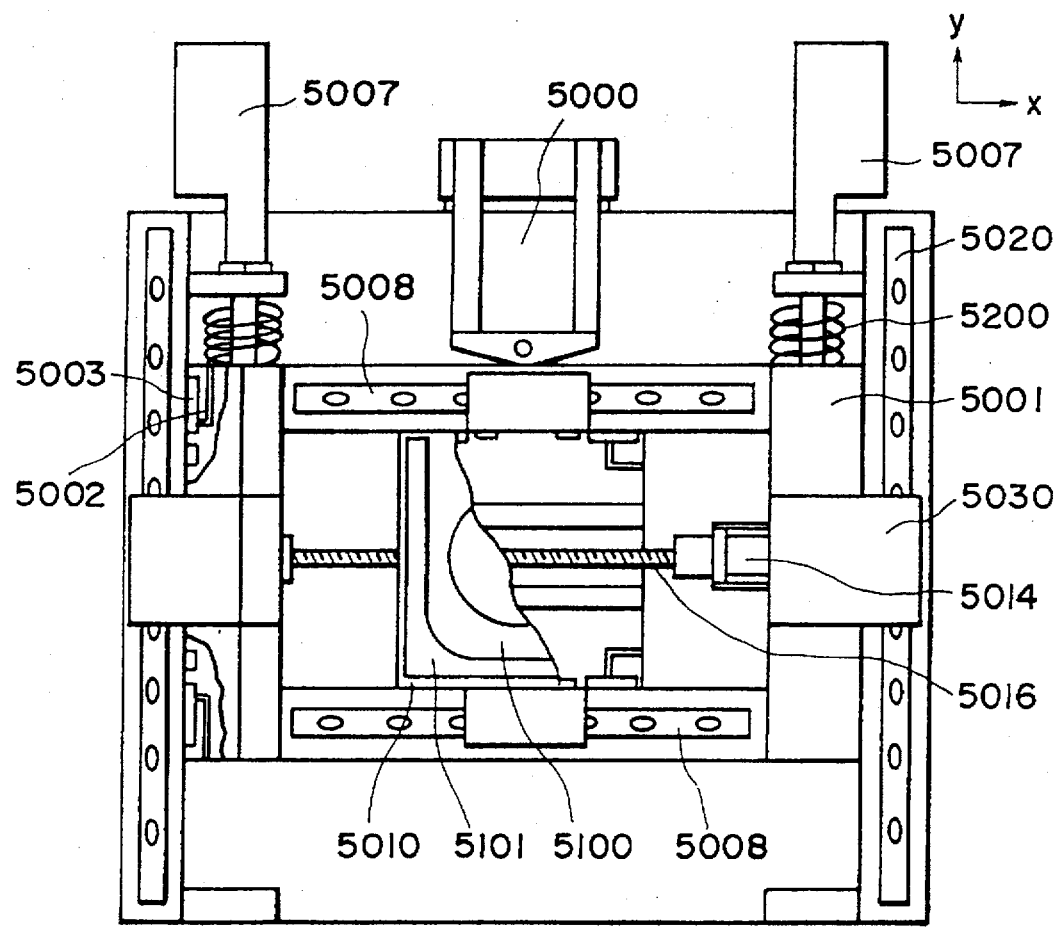
FIG. 71 is a representation, showing the general structure of an eleventh embodiment of the present invention.

FIG. 71 shows the structure of an eleventh embodiment which is a modified form of the tenth embodiment (FIGS. 62 and 63). In the preceding embodiment, a constant tension spring system is used as a means for cancelling the weight of the Y stage, in this embodiment an end of the Y electric cylinder rod and the Y stage are coupled with each other by a coiled spring means 5200 to thereby cancel the gravity. The remaining portion is of the same structure as the tenth embodiment.

Figure 72:
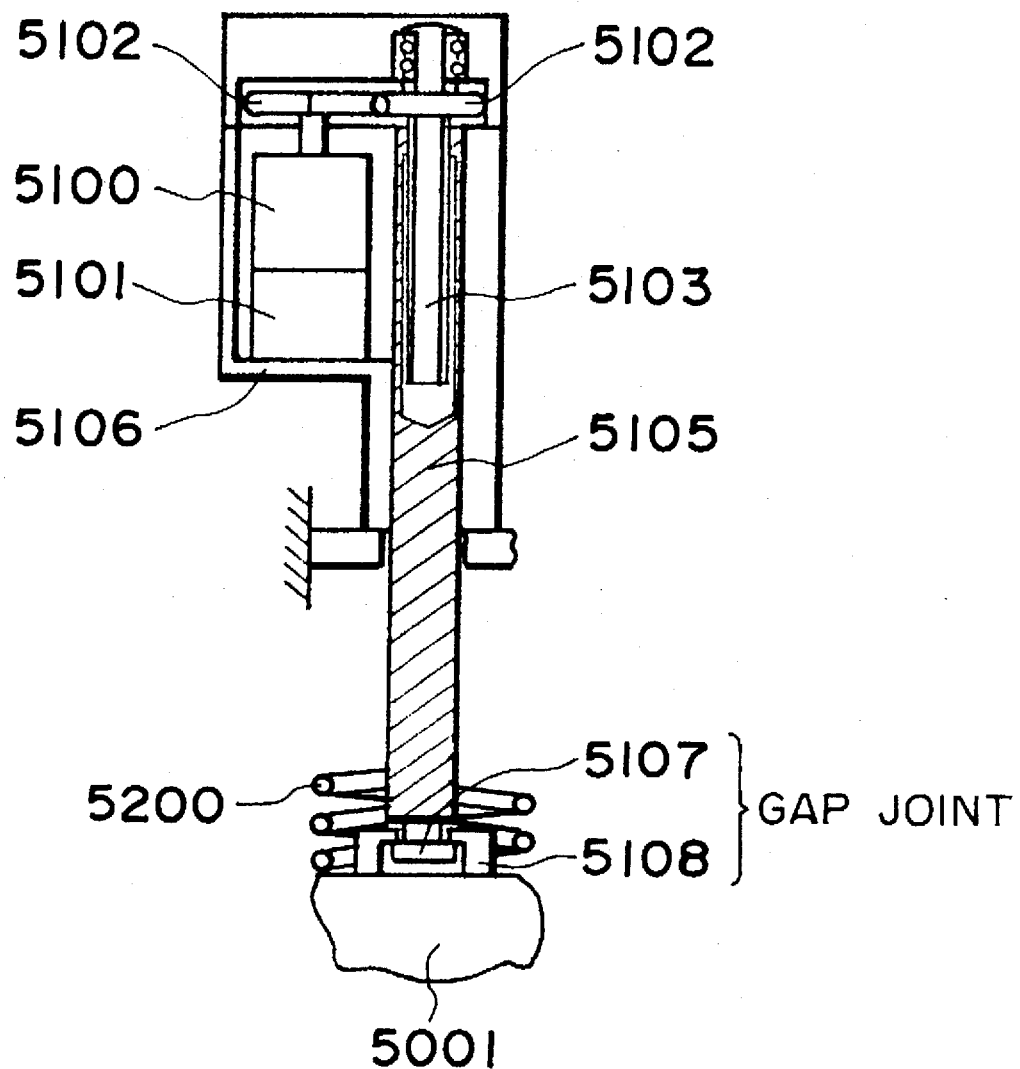
FIG. 72 is an enlarged view, showing details of a portion of the eleventh embodiment.

FIG. 72 shows details of the coiled spring means 5200. An end of the coiled spring 5200 is connected to the end of the Y rod 5105, and the other end of the spring is connected to the Y stage 5001. In parallel to this coiled spring, a gap joint is provided to couple the Y rod 5105 and the Y stage 5001 with each other. Motor 5100 of the Y electric cylinder continuously produces a torque corresponding to the gravity of the Y stage 5001, to thereby cancel the same.

Twelfth Embodiment

Figure 73:
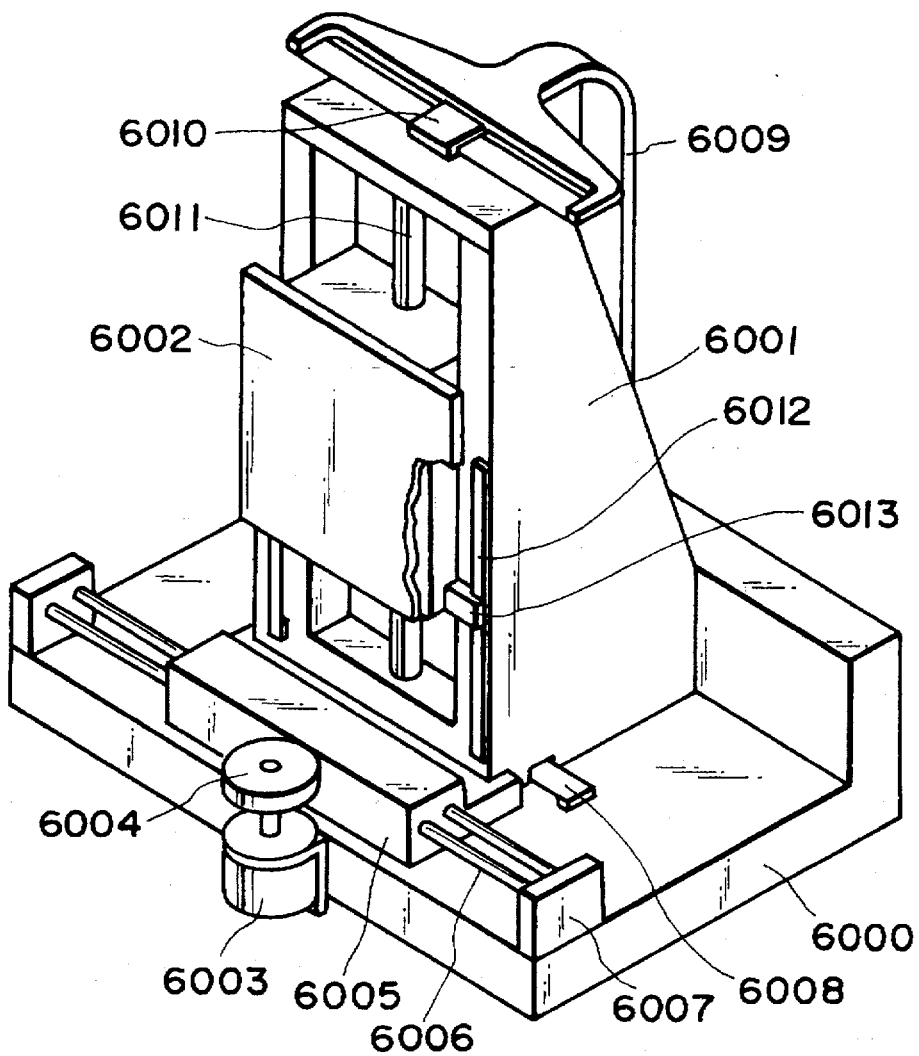
FIG. 73 is a representation, showing the general structure of a twelfth embodiment of the present invention.
Figure 74:
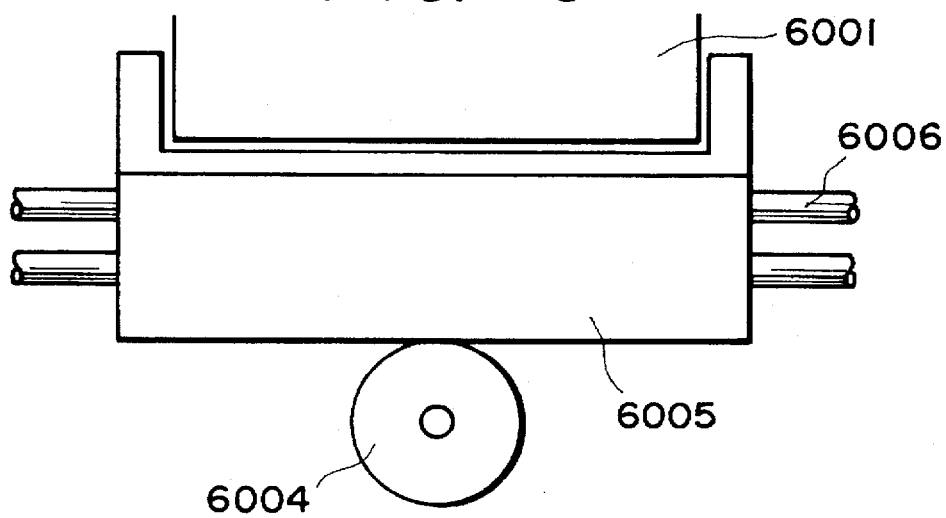
FIG. 74 is an enlarged view, showing details of a portion of the twelfth embodiment.

FIG. 73 shows the general structure of a stage device of a twelfth embodiment. FIG. 74 is an enlarged view of an X-axis second driving means. X stage 6001 is mounted through a linear air bearing on a base 6000, slidably in the X direction. Y stage 6002 is mounted, through a linear air bearing, within the X stage 6001 slidably in the Y direction. There are provided two lines of driving systems for the X stage 6001: i.e., first driving means including a linear motor (stationary pieces 6008 and 6009 and a movable piece 6010) and second driving means including an X motor 6003 fixed to the base 6000, a capstan 6004, a driving block 6005 and a guide bar 6006. The driving block 6005 is made slidable in the X direction, along the guide bar 6006 which is fixed to a bar block 6007 on the base 6000. As a rotary drive of the X motor 6003 is transmitted through the capstan 6004, the driving block 6005 moves in the X direction.

As shown in FIG. 74, the driving block 6005 has end portions sandwiching the X stage 6004 therebetween, with small clearances. As a result, the driving block 6005 moved in the X direction is coupled to the X stage 6001 with a small clearance.

Also, for driving the Y stage 6002, there are provided two lines of systems: that is, first driving means including a Y linear motor (stationary piece 6012 and movable piece 6013) and second driving means including a Y air cylinder 6011. The Y air cylinder 6011 is of the same structure as described with reference to FIGS. 28 and 29.

The stage device of this embodiment of the structure described above is controlled with respect to the X direction essentially in the same manner as described with reference to FIGS. 62–64 and, with respect to the Y direction, in the same manner as described with reference to FIGS. 28 and 29.

Thirteenth Embodiment

Figure 75:
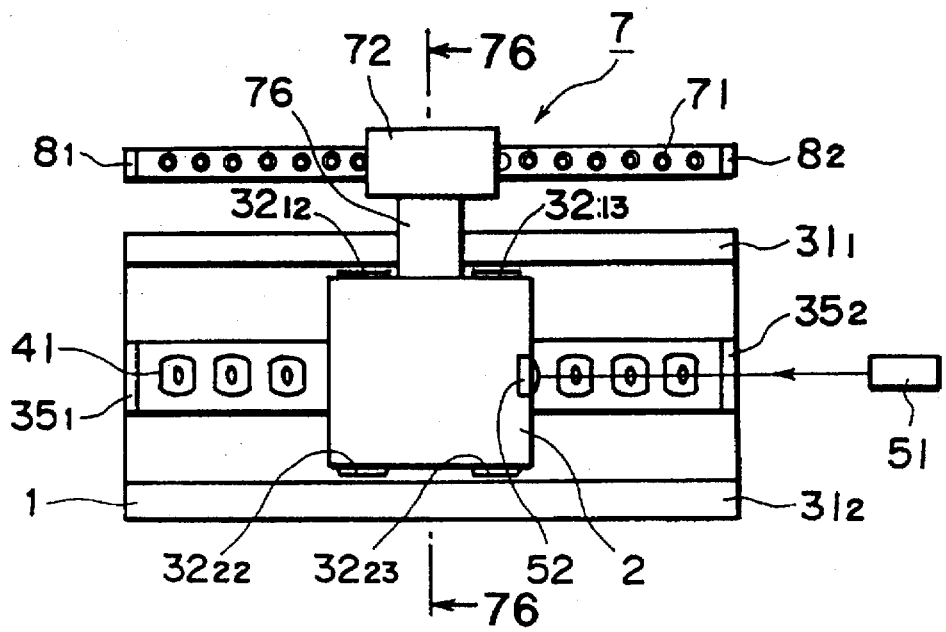
FIG. 75 is a top view of a 13th embodiment of the movable stage device of the present invention.
Figure 76:
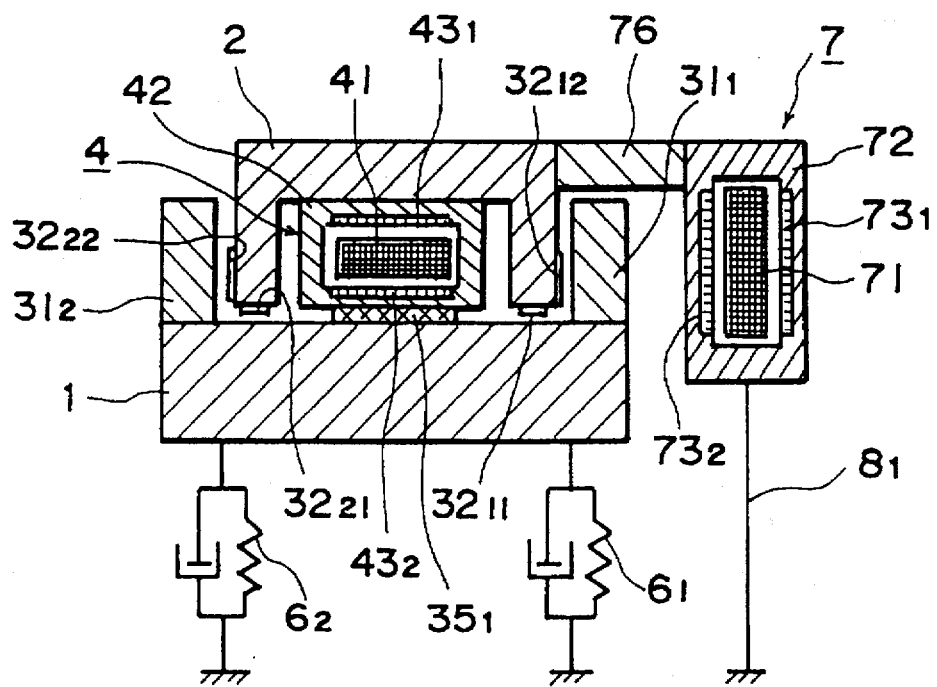
FIG. 76 is an enlarged sectional view taken along line 76—76 of FIG. 75.

FIG. 75 is a top view of the thirteenth embodiment of the movable stage device of the present invention; and FIG. 76 is an enlarged sectional view taken along line 76—76 of FIG. 75.

Figure 87:
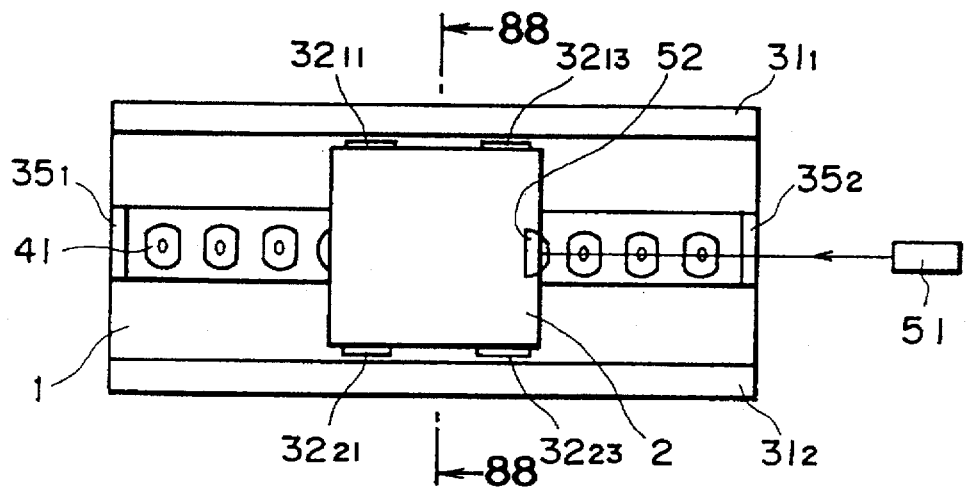
FIG. 87 is a top view of a conventional movable stage device.
Figure 88:
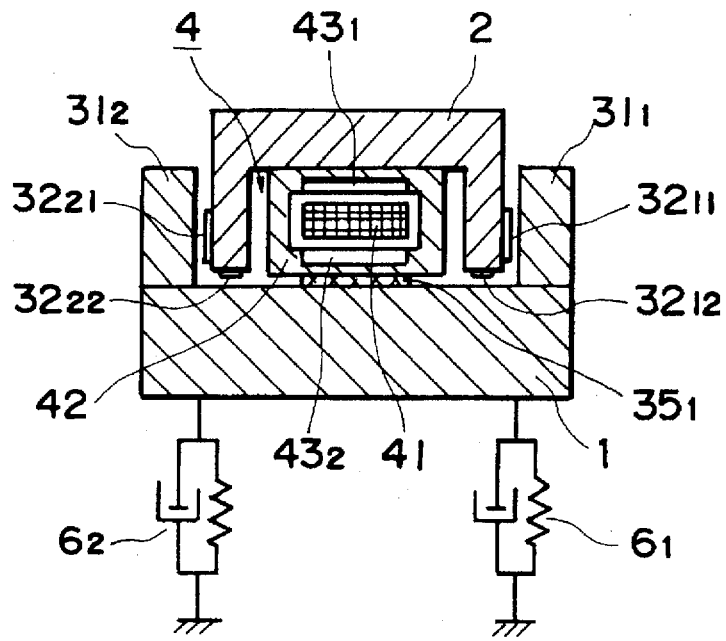
FIG. 88 is an enlarged sectional view taken along line 88—88 of FIG. 87.

This device differs from the conventional movable stage device shown in FIG. 87 in the following ways:

(1) As shown in FIG. 2, a second linear motor 7 serving as a second driving means for imparting thrust to the movable stage 2 is attached to the right side of the movable stage 2 through the intermediation of an attachment plate 76. The second linear motor 7 includes a second yoke 72, the left-hand side of which is attached to the attachment plate 76, and which has a rectangular hollow section. A second group of drive coils 71 is arranged in a row along the direction that the movable stage 2 moves (i.e., horizontally) and extends through the hollow section of the second yoke 72, and a pair of permanent magnet $73_1$ and $73_2$ is mounted in the hollow section of the yoke 72 with the second row of drive coils 71 therebetween.

(2) The right and left end portions of the second row of drive coils 71 are supported above the floor by support plates $8_1$ and $8_2$, respectively (as seen in FIG. 1). The support plates $8_1$ and $8_2$ are independent of the stationary base 1 and directly support the second row of drive coils 71 above the floor in such a way as to provide high rigidity.

In this movable stage device, the linear motor 4 and the second linear motor 7 are driven in accordance with positional information regarding the movable stage 2 obtained by a laser distance measurement system consisting of a laser distance measuring device 51 and a mirror 52. Since the drive coils 41 and the yoke 42 are not in contact with each other, it is possible to switch between transmission and non-transmission of force by providing a means for turning on/off an electric circuit for supplying electric current to the drive coils 41. This also applies to the second linear motor 7.

Figure 77:
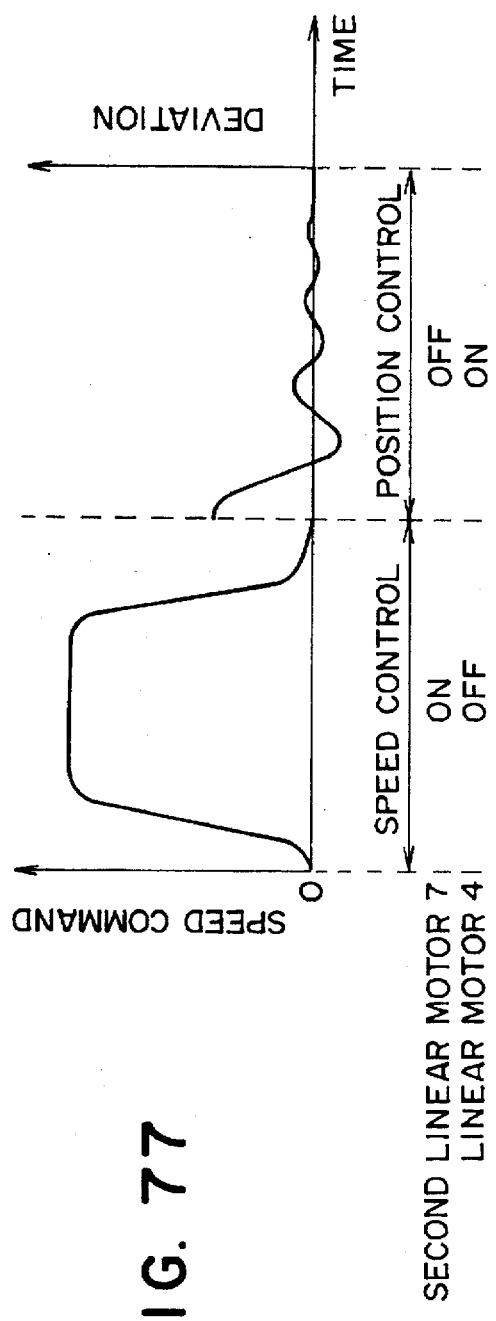
FIG. 77 is a diagram illustrating a 13th embodiment of the movable stage device driving method of the present invention as applied to the movable stage device shown in FIG. 75.

FIG. 77 illustrates the first embodiment of the movable stage device driving method of the present invention as applied to the movable stage device shown in FIG. 75.

Figure 89:
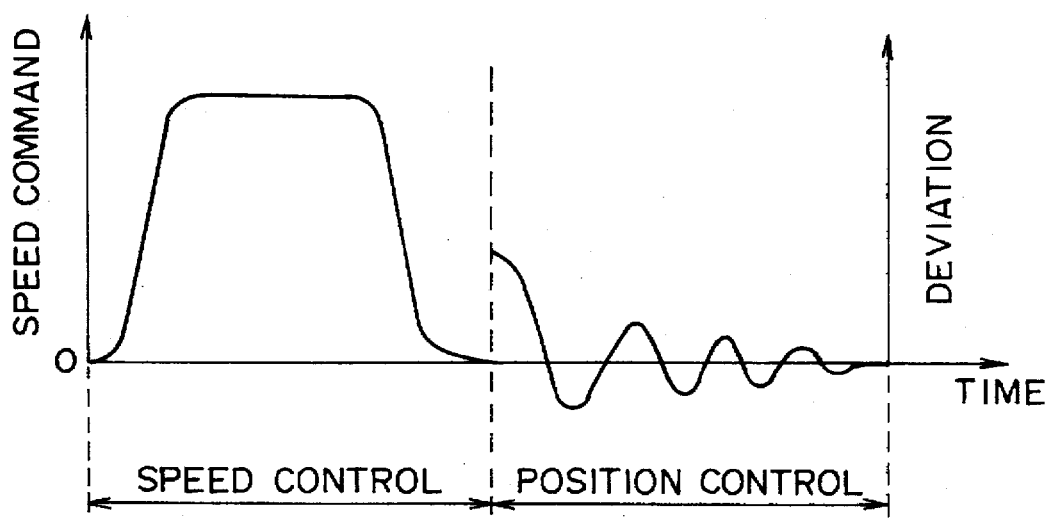
FIG. 89 is a diagram illustrating a method of driving the movable stage device shown in FIG. 87.

This movable stage device driving method is the same as the conventional one which was described above with reference to FIG. 89 in that accurate positioning near the target position is performed by position control after long-distance movement of the stage from the stop position to a point near the target position is performed by speed control, which allows high-speed movement. The method of this embodiment, however, differs from the conventional method in the following ways:

(1) Only the second linear motor 7 is used for speed control, which requires a large thrust; and (2) Only linear motor 4 is used for position control, which requires no large thrust.

That is, when moving the movable stage 2 by speed control, which requires a large thrust, only the second linear motor 7 is used, and the linear motor 4 is not used. The movable stage 2 is moved to the proximity of the target position in accordance with a predetermined speed command curve, which is shown on the left-hand side of FIG. 77. At this time, the movable stage 2 is supported by, but without contact with, the stationary base 1 through the intermediation of a plurality of fluid static pressure bearings $32_{11}$, $32_{21}$, etc. and, at the same time, is supported by, but without contact with, guide plates $31_1$ and $31_2$ through the intermediation of four fluid static pressure bearings $32_{12}$, $32_{13}$, $32_{22}$ and $32_{23}$ shown in FIG. 1, so that there is practically no frictional force or the like between the movable stage 2 and the stationary base 1. Further, since the group of drive coils 41 and the yoke 42 of the linear motor 4 also do not have contact with each other, practically no force is transmitted through the linear motor 4 between the movable stage 2 and the stationary base 1 unless the linear motor 4 is used. Thus, when the movable stage 2 is driven by using the second linear motor 7, which is separately provided from the stationary base 1, the stationary base 1 is mechanically isolated, so that no vibration is caused by the effect of rapid acceleration and deceleration, as in the conventional driving method. Further, since the row of second drive coils 71 of the second linear motor 7 is rigidly supported by the support plates $8_1$ and $8_2$, the vibration caused by the effect of rapid acceleration and deceleration is small, so that there is little waste of energy.

When the movable stage 2 has substantially come to a stop after moving to the proximity of the target position, the second linear motor 7 is stopped in order to terminate the speed control. At this time, the second drive coils 71 slightly vibrate due to the reaction caused by the acceleration and deceleration in the speed control and, at the same time, vibrations from the floor are transmitted due to the high rigidity of the support plates $8_1$ and $8_2$. However, since the row of drive coils 71 of the second linear motor 7 is mechanically separated from the second yoke 72, the vibration of the second drive coils 71 does not affect the stationary base 1 and the movable stage 2 in the subsequent positioning operation. Further, by effecting position control by using the linear motor 4 on the stationary base 1, it is possible to perform positioning quickly and with high accuracy without being affected by the vibration due to the acceleration and deceleration as in the conventional method. The acceleration and deceleration of the stage during positioning is much smaller than during its movement in speed control, so that the positioning operation is hardly influenced by the effect of the acceleration and deceleration during positioning.

From the above discussion, it may be concluded that the method of this embodiment has at least the following advantages:

(1) Since substantially no vibration is generated in the stationary base 1, there is no deterioration in machining precision or printing accuracy due to changes in the posture of the stationary base 1 as in the conventional driving method.

(2) Since rapid acceleration and deceleration requiring a large thrust are effected by using the second linear motor 7 provided outside the stationary base 1, the linear motor 4, provided on the stationary base 1 and used for positioning, requires no large thrust. As a result, the quantity of heat generated in the linear motor 4 is much smaller as compared with the conventional driving method. Further, since the second linear motor 7, which generates a large quantity of heat, is supported apart from the stationary base 1 and the movable stage 2, deterioration in machining precision or printing accuracy due to thermal deformation can be avoided.

(3) Any vibration caused for some reason or other in the stationary base 1 can be stopped by using the linear motor 4 and the second linear motor 7 simultaneously. In that case, the support plates $8_1$ and $8_2$ serve as a reference. The device can be driven in such a case by simultaneously effecting servo lock in the linear motor 4 and the second linear motor 7 to lock the movable stage 2 with respect to the support plates $8_1$ and $8_2$, or by locking one linear motor by servo lock and effecting damping control on the other linear motor.

Fourteenth Embodiment

Figure 78:
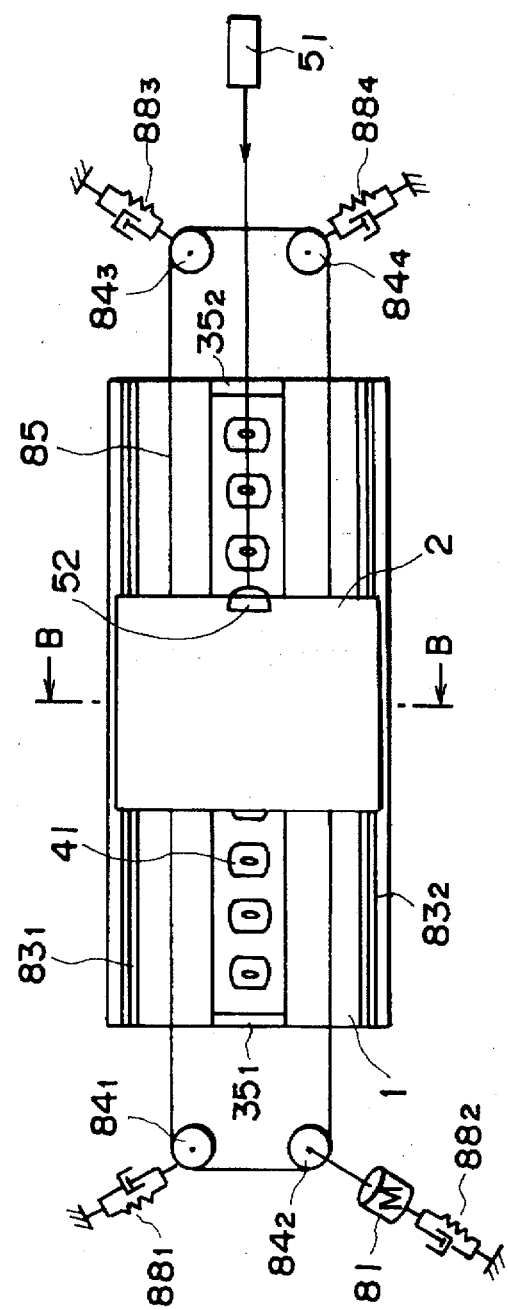
FIG. 78 is a top view of a 14th embodiment of the movable stage device of the present invention.
Figure 79:
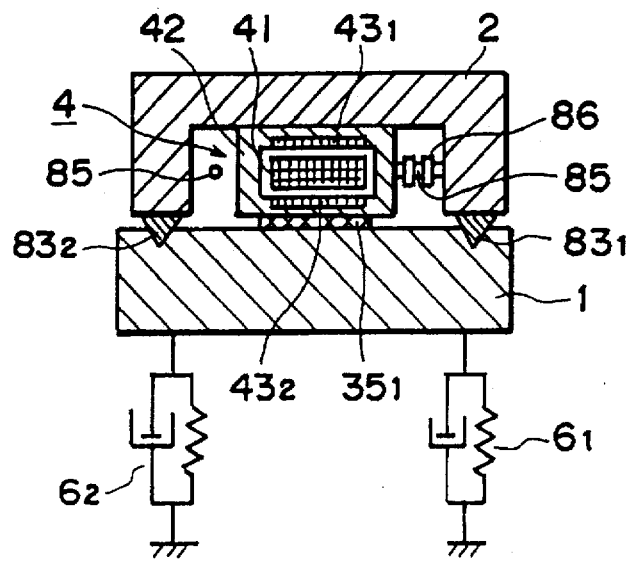
FIG. 79 is an enlarged sectional view taken along line B—B of FIG. 78.

FIG. 78 is a top view showing the fourteenth embodiment of the movable stage device of the present invention; and FIG. 79 is an enlarged sectional view taken along line 79—79 of FIG. 78.

The movable stage device of this embodiment differs from the one shown in FIG. 75 in the following ways:

(1) Instead of the guide plates $31_1$ and $31_2$ of the first embodiment, two slide guide grooves $83_1$ and $83_2$ are provided as guide means, which are arranged near the right and left edges of the stationary base 1 (as seen in FIG. 79).

(2) Instead of the second linear motor 7 of the first embodiment, there are provided, as the second driving means, pulleys $84_1$ and $84_2$ arranged on the left-hand side (as seen in FIG. 78), pulleys $84_3$ and $84_4$ arranged on the right-hand side (as seen in FIG. 78), a wire 85 stretched between the pulleys $84_1$–$84_4$, and a motor 81 for rotating the pulley $84_2$ in the lower left corner (as seen in FIG. 78). As shown in FIG. 78, the wire 85 runs through two spaces defined between the inner side walls of the movable stage 2, which has a U-shaped cross section, and the side walls of the yoke 42. By pinching the wire 85 with a clamper 86 provided between an inner side wall of the movable stage 2 and a side wall of the yoke 42, it is possible to transmit thrust to the movable stage 2.

(3) Instead of the support plates $8_1$ and $8_2$ of the first embodiment, four support dampers $88_1$ through $88_4$ are provided. The pulleys except for the one in in the lower left corner in FIG. 78, i.e., the pulleys $84_1$, $84_3$ and $84_4$, and the motor 81 are supported above the floor by the support dampers $88_1$ through $88_4$. The support dampers $88_1$–$88_4$ have high rigidity with respect to the reaction to driving the movable stage and are set upright with respect to the floor surface so that no vibration is transmitted from the floor in other directions.

This movable stage device is driven in the following manner:

(1) For speed control, which requires a large thrust, only the motor 81 is used; and (2) For position control, which requires no large thrust, only the linear motor 4 is used.

That is, when the movable stage 2 is moved by speed control, which requires a large thrust, only the motor 81 is used, not the linear motor 4, the movable stage 2 being moved up to the proximity of the target position in accordance with a predetermined speed command curve. The movable stage 2 is supported by the stationary base 1 though the intermediation of the slide guide grooves $83_1$ and $83_2$, which involve very little friction in the sliding directions, so that the reaction force and vibration due to the acceleration and deceleration of the movable stage 2 are barely transmitted to the stationary base 1. After that, the clamper 86 is released to separate the wire 85 from the movable stage 2, thereby preventing the vibration of the wire 85, the pulleys $84_1$–$84_4$ and the motor 81 caused by the acceleration and deceleration from being transmitted to the movable stage 2 and the stationary base 1. In the subsequent positioning operation, the linear motor 4 provided on the stationary base 1 is used as in the case of the movable stage device shown in FIG. 1, thereby performing positioning quickly and accurately without causing the stationary base 1 to vibrate.

When the stationary base 1 has started to vibrate for some reason or other, the motor 81 and the linear motor 4 are used simultaneously, with the wire 85 picked by the clamper 86, thereby effectively stopping the vibration of the stationary base 1.

Fifteenth Embodiment

Figure 80:
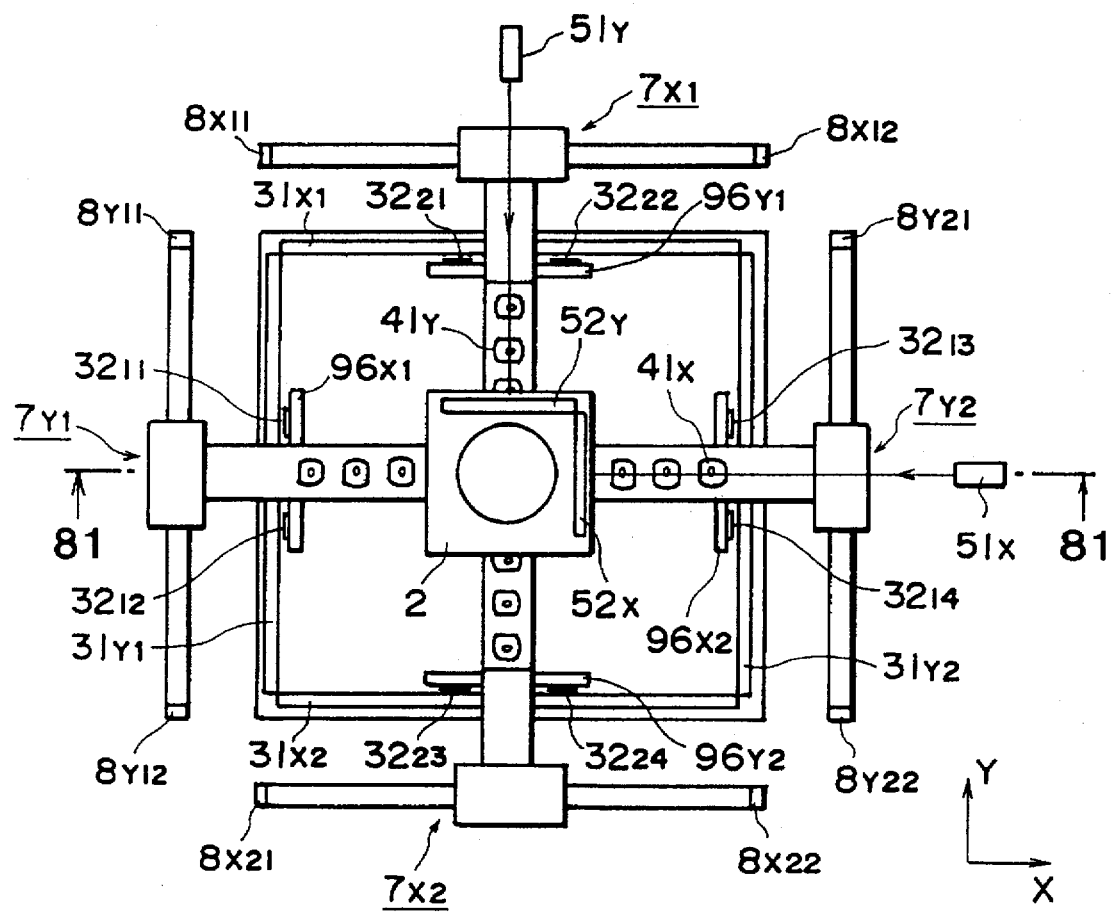
FIG. 80 is a top view of a 15th embodiment of the movable stage device of the present invention.

FIG. 80 is a top view of the fifteenth embodiment of the movable stage device of the present invention; and FIG. 81 is an enlarged sectional view taken along line 81—81 of FIG. 80.

In the movable stage device of this embodiment, the movable stage 2 of the movable stage device of the first embodiment, shown in FIG. 1, can freely move in the XY plane shown in FIG. 80 (a so-called XY stage). That is, in the movable stage device of the third embodiment, the movable stage 2 is moved in the X-axis direction by an X-axis direction linear motor $4_X$ (not shown) and a pair of second X-axis direction linear motors $7_{X1}$ and $7_{X2}$, and in the Y-axis direction by a Y-axis direction linear motor $4_Y$ (not shown) and a pair of second Y-axis direction linear motors $7_{Y1}$ and $7_{Y2}$.

As shown in FIG. 81, provided inside the movable stage 2 are upper and lower yokes (an X-axis direction yoke $42_X$ and a Y-axis direction yoke $42_Y$) having hollow sections intersecting each other. The upper yoke, i e. the X-axis direction yoke $42_X$, functions as the yoke of the X-axis direction linear motor $4_X$, and the lower yoke, i.e., the Y-axis direction yoke $42_Y$, functions as the yoke of the Y-axis direction linear motor $4_Y$. Thus, the X-axis direction linear motor $4_X$ consists of the X-axis direction yoke $42_X$, a row of X-axis direction drive coils $41_X$ fixed in position in a row in the X-axis direction and extending through the hollow section of the X-axis direction yoke $42_X$, and a pair of X-axis direction permanent magnets $43_{X1}$ and $43_{X2}$ attached to the X-axis direction yoke $42_X$ in such a way as to be opposed to each other with the row of X-axis direction drive coils $41_X$ therebetween.

As shown in FIG. 80, provided at the ends in the X-axis direction of the row of X-axis direction drive coils $41_X$ are legs $96_{X1}$ and $96_{X2}$, which are supported by the stationary base 1 and a pair of parallel Y-axis direction guide plates $31_{Y1}$ and $31_{Y2}$ fixed to the end portions in the X-axis direction of the stationary base 1 through the intermediation of fluid static pressure bearings as described below. That is two fluid static pressure bearings $32_{11}$ and $32_{12}$ are provided between the leg $96_{X1}$ on the left-hand side of FIG. 80 and the Y-axis direction guide plate $31_{Y1}$, and two fluid static pressure bearings $32_{13}$ and $32_{14}$ are provided between the leg $96_{X2}$ on the right-hand side of FIG. 80 and the Y-axis direction guide plate $31_{Y2}$. Further, as shown in FIG. 81, two fluid static pressure bearings $32_{31}$ and $32_{32}$ (the latter of which is not shown) are provided between the leg $96_{X1}$ on the left-hand side of FIG. 80 and the stationary base 1, and two fluid static pressure bearings $32_{33}$ and $32_{34}$ (the latter of which is not shown) are provided between the leg $96_{X2}$ on the right-hand side of FIG. 80 and the stationary base 1. Further, though not shown in the drawing, there are provided two fluid static bearings respectively in the right and left gaps between the row of X-axis direction drive coils 41 and the X-axis direction yoke $42_X$.

The Y-axis direction linear motor $4_Y$ consists of the Y-axis direction yoke $42_Y$, a row of Y-axis direction drive coils $41_Y$ arranged in a row in the Y-axis direction and extending through the hollow section of the Y-axis direction yoke $42_Y$, and a pair of Y-axis direction permanent magnets $43_{Y1}$ and $43_{Y2}$ attached to the Y-axis direction yoke $42_Y$ in such a way as to be opposed to each other with the row of Y-axis direction drive coils $41_Y$ therebetween. As shown in FIG. 80, provided at the ends in the Y-axis direction of the row of Y-axis direction drive coils $41_Y$ are legs $96_{Y1}$ and $96_{Y2}$, which are supported by the stationary base 1 and a pair of parallel X-axis direction guide plates $31_{X1}$ and $31_{X2}$ fixed to the end portions in the Y-axis direction of the stationary base 1 through the intermediation of fluid static pressure bearings as described below. That is, two fluid static pressure bearings $32_{21}$ and $32_{22}$ are provided between the leg $96_{Y1}$ on the top side of FIG. 80 and the X-axis direction guide plate $31_{X1}$, and two fluid static pressure bearings $32_{23}$ and $32_{24}$ are provided between the leg $96_{Y2}$ on the bottom side of FIG. 80 and the X-axis direction guide plate $31_{X2}$. Further, though not shown in the drawing, two fluid static pressure bearings are provided between the leg $96_{Y1}$ on the top side of FIG. 6 and the stationary base 1, and two fluid static pressure bearings are provided between the leg $96_{Y2}$ on the bottom side of FIG. 80 and the stationary base 1. Further, two fluid static bearings $32_{51}$ and $32_{52}$ are provided respectively in the right and left gaps between the row of Y-axis direction drive coils $41_Y$ and the Y-axis direction yoke $42_Y$ (as seen in FIG. 81).

Each of the second X-axis direction linear motors $7_{x1}$ and $7_{x2}$ has a construction similar to that of the second linear motor 7 of the thirteenth embodiment shown in FIG. 75, and their respective yokes are attached to the ends of the row of Y-axis direction drive coils $41_Y$. The left-hand end portion of the upper second X-axis direction linear motor $7_{x1}$ in FIG. 80 is supported by a support plate $8_{x11}$, and the right-hand end portion of the same is supported by a support plate $8_{x12}$. Further, the left-hand end portion of the lower second X-axis direction linear motor $7_{x2}$ in FIG. 6 is supported by a support plate $8_{x21}$, and the right-hand end portion of the same is supported by a support plate $8_{x22}$.

Each of the second Y-axis direction linear motors $7_{Y1}$ and $7_{Y2}$ has a construction similar to that of the second linear motor 7 of the thirteenth embodiment shown in FIG. 75, and their respective yokes are attached to the ends of the row of X-axis direction drive coils $41_X$. The left-hand end portion of the upper second Y-axis direction linear motor $7_{Y1}$ in FIG. 80 is supported by a support plate $8_{Y11}$, and the lower end portion of the same is supported by a support plate $8_{Y12}$. Further, the top end portion of the right-hand second Y-axis direction linear motor $7_{Y2}$ in FIG. 80 is supported by a support plate $8_{Y21}$, and the lower end portion of the same is supported by a support plate $8_{Y22}$.

This movable stage device is driven in the following manner:

(1) For speed control, which requires a large thrust, the pair of second X-axis direction linear motors $7_{x1}$ and $7_{x2}$ and the pair of second Y-axis direction linear motors $7_{Y1}$ and $7_{Y2}$ are used; and (2) For position control, which requires no large thrust, the X-axis direction linear motor $4_X$ and the Y-axis direction linear motor $4_Y$ are used.

That is, when the movable stage 2 is moved by speed control, which requires a large thrust, the X-axis direction linear motor $4_X$ and the Y-axis direction linear motor $4_Y$ are not used; instead, the pair of second X-axis direction linear motors $7_{x1}$ and $7_{x2}$ and the pair of second Y-axis direction linear motors $7_{Y1}$ and $7_{Y2}$ are used, the movable stage 2 being moved up to the proximity of the target position in accordance with a predetermined speed command curve. In the positioning subsequent to that, the X-axis direction linear motor $4_X$ and the Y-axis direction linear motor $4_Y$ are used, thereby performing positioning quickly and accurately without causing the stationary base 1 to vibrate.

When the stationary base 1 has started to vibrate for some reason or other, the X-axis direction linear motor $4_X$, the Y-axis direction linear motor $4_Y$, the pair of second X-axis direction linear motors $7_{x1}$ and $7_{x2}$, and the pair of second Y-axis direction linear motors $7_{Y1}$ and $7_{Y2}$ are used simultaneously, thereby stopping the vibration of the stationary base 1.

In this movable stage device, the X-axis direction linear motor $4_X$ and the pair of second X-axis direction linear motors $7_{x1}$ and $7_{x2}$ are driven in accordance with information regarding the position in the X-axis direction of the movable stage 2 as obtained by an X-axis direction laser distance measuring device $51_X$ and an X-axis direction mirror $52_X$. The Y-axis direction linear motor $4_Y$ and the pair of second Y-axis direction linear motors $7_{Y1}$ and $7_{Y2}$ are driven in accordance with information regarding the position in the Y-axis direction of the movable stage 2 as obtained by a Y-axis direction laser distance measuring device $51_Y$ and a Y-axis direction mirror $52_Y$.

Sixteenth Embodiment

Figure 82:
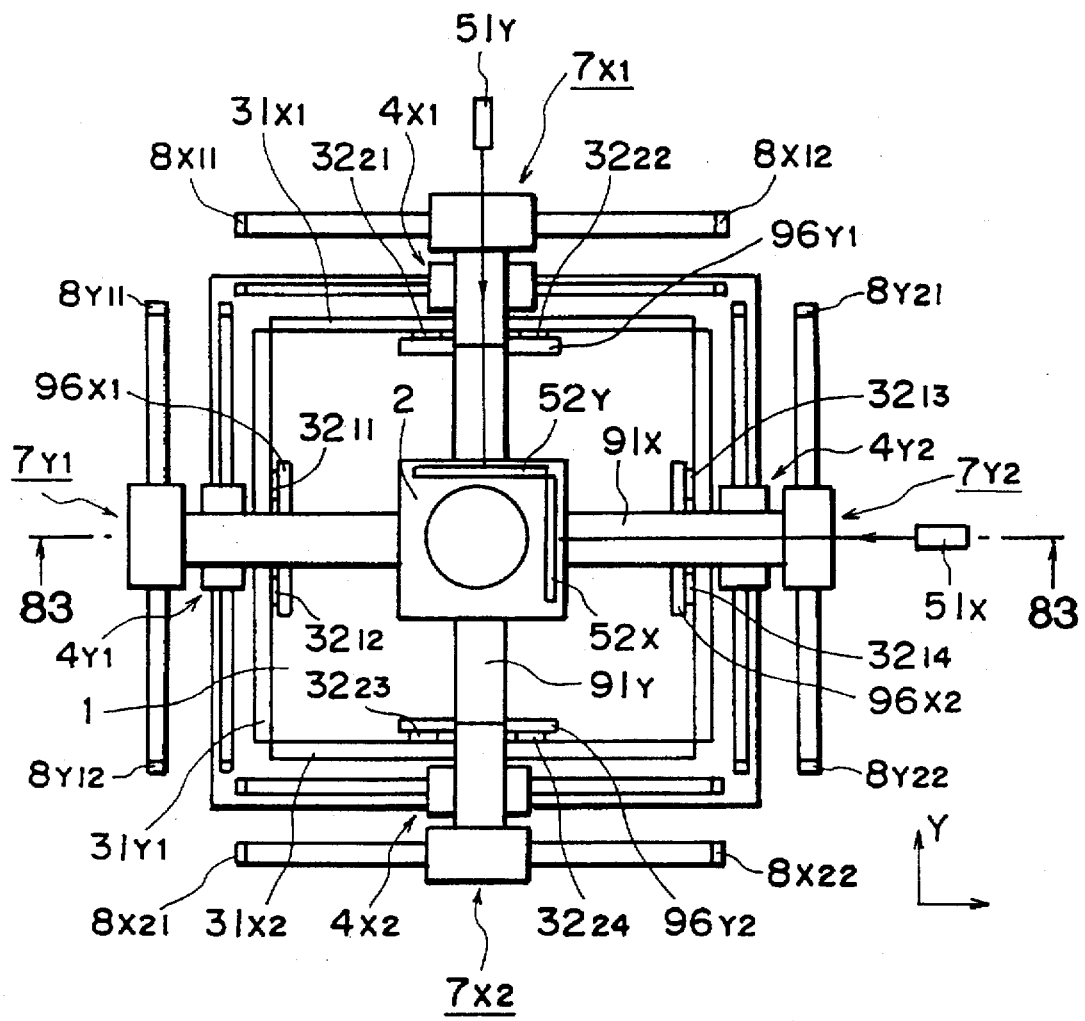
FIG. 82 is a top view of a 16th embodiment of the movable stage device of the present invention.
Figure 83:
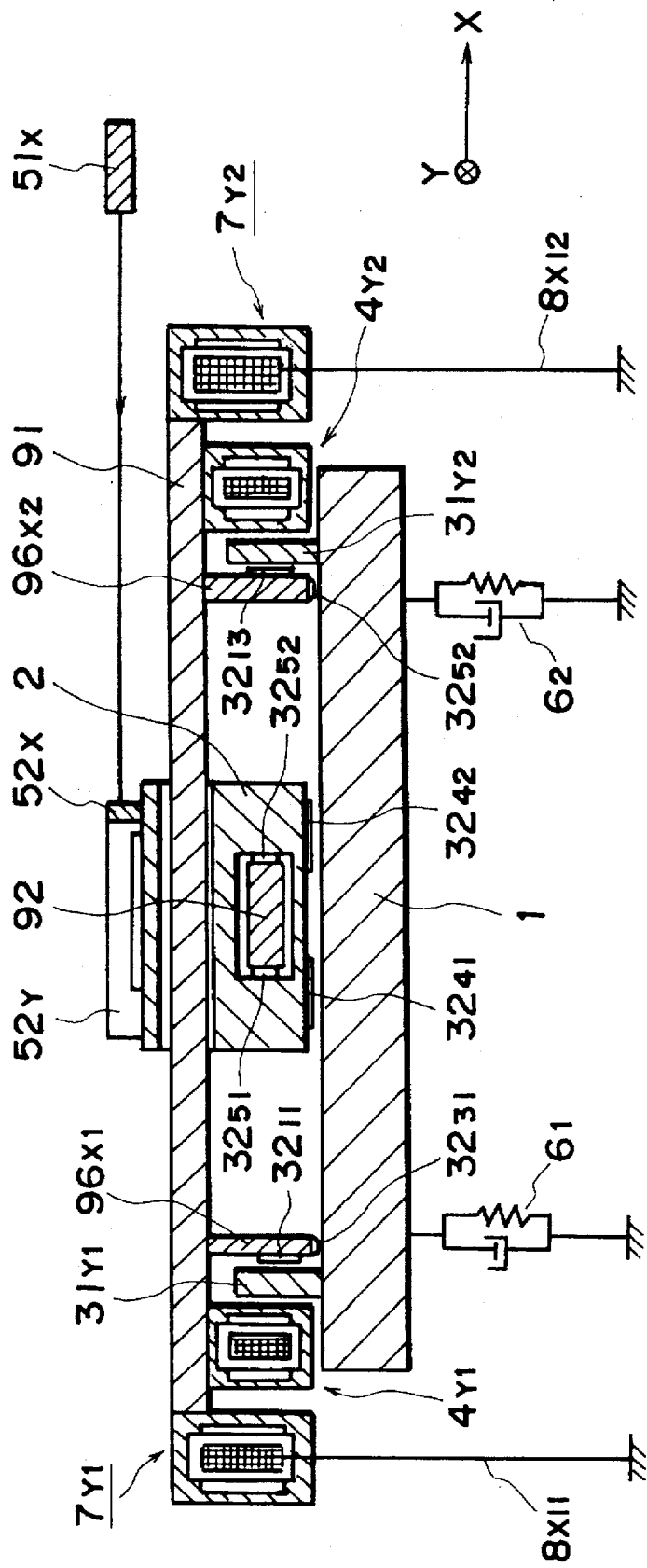
FIG. 83 is an enlarged sectional view taken along line 83—83 of FIG. 82.

FIG. 82 is a top view of the sixteenth embodiment of the movable stage device of the present invention; and FIG. 83 is an enlarged sectional view taken along line 83—83 of FIG. 82.

The movable stage device of this embodiment differs from the one shown in FIG. 80 in the following ways:

(1) Instead of the X-axis direction drive coils $41_X$ and the Y-axis direction drive coils $41_Y$ shown in FIG. 80, an X-axis direction beam $91_X$ and a Y-axis direction beam $101_Y$ are provided.

(2) As shown in FIG. 82, the stage device of this embodiment includes a pair of X-axis direction linear motors $4_{x1}$ and $4_{x2}$ respectively attached to the upper and lower ends of the Y-axis direction beam $91_Y$ and a pair of Y-axis direction linear motors $4_{Y1}$ and $4_{Y2}$ respectively attached to the right and left ends of the X-axis direction beam $91_X$. Though not shown in detail in FIG. 82, the X-axis direction linear motors $4_{x1}$ and $4_{x2}$ are supported by the stationary support 1 through the intermediation of support plates provided between the stationary support 1 and the right and left ends of the X-axis direction linear motors $4_{x1}$ and $4_{x2}$. This is the same with the Y-axis direction linear motors $4_{Y1}$ and $4_{Y2}$.

This movable stage device is driven in the following manner:

(1) For speed control, which requires a large thrust, the pair of second X-axis direction linear motors $7_{x1}$ and $7_{x2}$ and the pair of second Y-axis direction linear motors $7_{Y1}$ and $7_{Y2}$ are used; and (2) For position control, which requires no large thrust, the pair of X-axis direction linear motors $4_{x1}$ and $4_{x2}$ and the pair of Y-axis direction linear motors $4_{Y1}$ and $4_{Y2}$ are used.

That is, when the movable stage 2 is moved by speed control, which requires a large thrust, the pair of X-axis direction linear motors $4_{x1}$ and $4_{x2}$ and the pair of Y-axis direction linear motors $4_{Y1}$ and $4_{Y2}$ are not used; instead, the pair of second X-axis direction linear motors $7_{x1}$ and $7_{x2}$ and the pair of second Y-axis direction linear motors $7_{Y1}$ and $7_{Y2}$ are used, the movable stage 2 being moved up to the proximity of the target position in accordance with a predetermined speed command curve. In the positioning subsequent to that, the pair of X-axis direction linear motors $4_{x1}$ and $4_{x2}$ and the pair of Y-axis direction linear motors $4_{Y1}$ and $4_{Y2}$ are used, thereby performing positioning quickly and accurately without causing the stationary base 1 to vibrate.

When the stationary base 1 has started to vibrate for some reason or other, the pair of X-axis direction linear motors $4_{x1}$ and $4_{x2}$ and the pair of Y-axis direction linear motors $4_{Y1}$ and $4_{Y2}$ and the pair of second X-axis direction linear motors $7_{x1}$ and $7_{x2}$, and the pair of second Y-axis direction linear motors $7_{Y1}$ and $7_{Y2}$ are used simultaneously, thereby stopping the vibration of the stationary base 1.

In this movable stage device, the pair of X-axis direction linear motors $4_{x1}$ and $4_{x2}$ and the pair of second X-axis direction linear motors $7_{x1}$ and $7_{x2}$ are driven in accordance with information regarding the position in the X-axis direction of the movable stage 2 as obtained by an X-axis direction laser distance measuring device $51_X$ and an X-axis direction mirror $52_X$. The pair of Y-axis direction linear motors $4_{Y1}$ and $4_{Y2}$ and the pair of second Y-axis direction linear motors $7_{Y1}$ and $7_{Y2}$ are driven in accordance with information regarding the position in the Y-axis direction of the movable stage 2 as obtained by a Y-axis direction laser distance measuring device $51_Y$ and a Y-axis direction mirror $52_Y$.

While in the above description the movable stage moves in a plane parallel to the floor, it is also possible for the movable stage to move in a plane perpendicular to the floor as in the case of an X-ray exposure apparatus using synchrotron radiation as the light source (Japanese Patent Application Laid-Open No. 2-100311).

Due to the second driving means which is supported by a support means separately provided from the stationary base and which serves to impart thrust to the movable stage, the above-described movable stage device is capable of performing speed control, which requires a large thrust, by using the above second driving means, so that any reaction due to rapid acceleration and deceleration can be received by the above support means, thereby achieving an improvement in speed and accuracy of positioning. Further, by imparting high rigidity to this support means, which receives the reaction caused by the large thrust, the support means practically makes no vibration, thereby avoiding a waste of energy.

Further, in the movable stage device driving method described above, a control operation which requires a large thrust is effected by using only the second driving means to impart thrust to the movable stage, and a control operation which requires no large thrust is effected by using only the driving means which is provided on the stationary base, so that any reaction caused by rapid acceleration and deceleration of the movable stage can be received by the support means for supporting the second driving means, thereby attaining an improvement in speed and accuracy of positioning. Further, any vibration of the movable stage can be effectively stopped by imparting thrust to the movable stage by using both the above driving means and the second driving means.

FIG. 84 is a diagram showing an embodiment of an exposure system for manufacturing semiconductor devices by printing the circuit patterns of masters in the form of reticles, photomasks or the like onto silicon wafers. The system generally comprises an exposure apparatus, a master storing device, a master inspection apparatus and controller, which are installed in a clean room.

Numeral 901 indicates a far ultraviolet radiation source such as an excimer laser, and numeral 902 indicates an illumination system unit, which has the function of illuminating masters set at a predetermined exposure position E.P. simultaneously (collectively) from above with a predetermined numerical aperture NA. Numeral 909 indicates an ultra-high resolution lens system (or mirror system) for transferring the circuit patterns formed on the masters onto silicon wafers 910. In printing, wafers are shifted for each shot in synchronism with the step feed of the movable stage 911. The movable stage 911 has a high-precision stage structure as described with reference to the above embodiments. Numeral 900 indicates an alignment optical system for effecting positioning between the masters and the wafers prior to the exposure operation. The alignment optical system 900 has at least one microscope system for observing masters. These components form the exposure apparatus of this embodiment.

Numeral 914 indicates a master storing device, which stores a plurality of masters. Numeral 913 indicates a master inspection apparatus, which inspects each master selected and extracted from the master storing device 914 for any foreign matter thereon prior to its setting in the exposure position E.P. A controller 918 serves to perform sequence control over the entire system. It supplies operation commands to the master storing device 914 and the master inspection apparatus 913 and performs sequence control for alignment, exposure, wafer step feed, etc., which are the fundamental operations of the exposure apparatus.

The exposure process according to the system of this embodiment will now be described. First, the selected master is extracted from the master storing device 914 and set in the master inspection apparatus 913, where it is inspected for any foreign matter thereon. If there is no foreign matter, the master is set at the exposure position E.P. of the exposure apparatus. Next, a silicon wafer 910, which constitutes the object to be exposed, is set on the movable stage 911. Then, while shifting the wafer for each shot in synchronism with the step feed of the movable storage 911 by the step & repeat method, a reduced-size master pattern is projected for repeated exposure. When the first silicon wafer has been completely exposed, it is stored in the storing device and a new silicon wafer is supplied, and master pattern exposure is repeated in the same manner by the step & repeat method.

With the exposure system of this embodiment, it is possible to manufacture highly integrated semiconductor devices having very minute circuit patterns, which have conventionally been difficult to manufacture.

Figure 85:
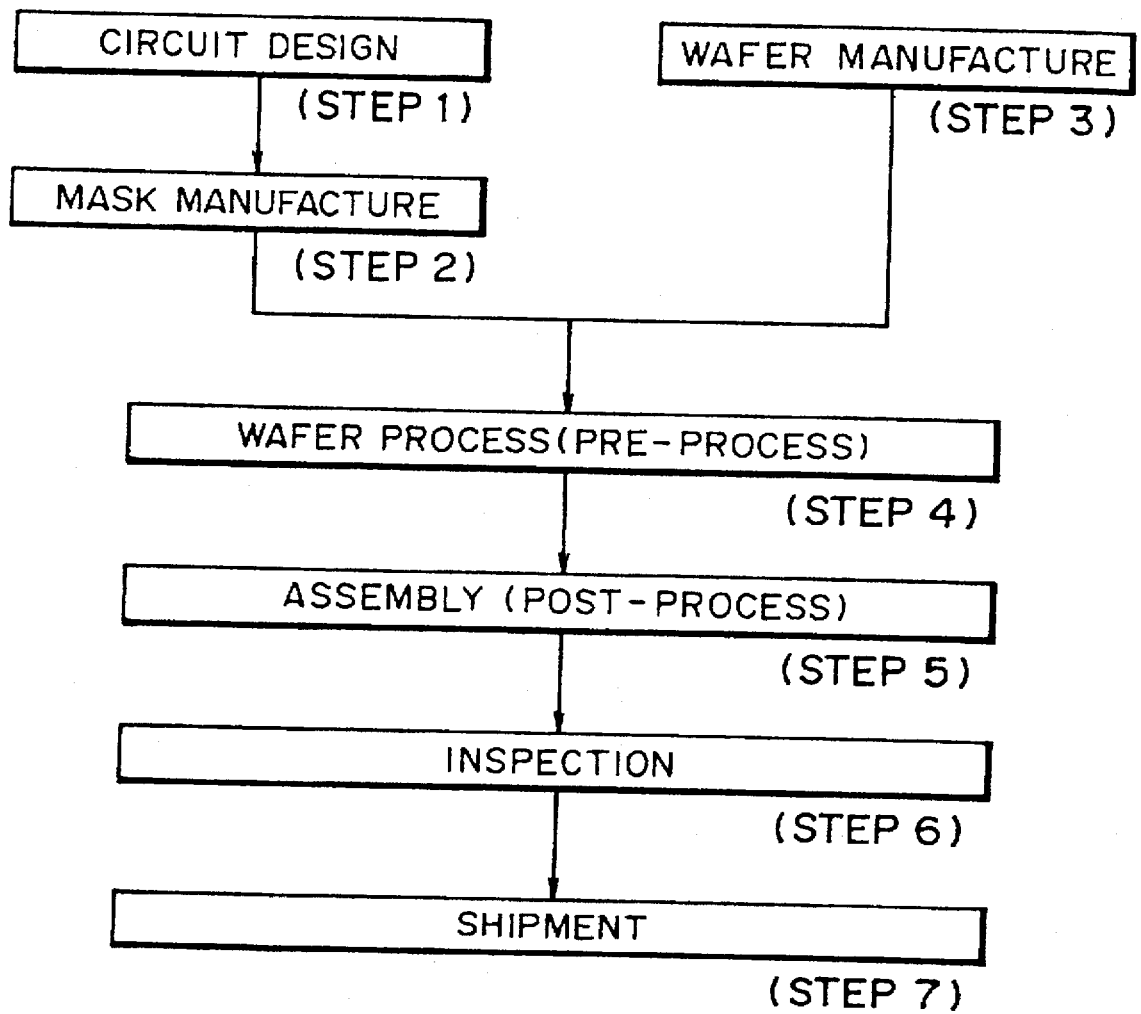
FIG. 85 is a diagram showing a flowchart for manufacturing semiconductor devices.

Next, to be described will be an embodiment of a semiconductor device manufacturing method utilizing the above-described exposure system. FIG. 85 shows a flowchart for manufacturing semiconductor devices (semiconductor chips for ICs, LSIs or the like, or liquid crystal panels, CCDs, etc.). In step 1 (circuit design), semiconductor-device circuits are designed. In step 2 (mask manufacture), masks having the designed circuit patterns are manufactured. In step 3 (wafer manufacture), wafers are manufactured by using materials such as silicon. Step 4 (wafer process) is called a "pre-process", in which the masks and wafers thus prepared are used to form actual circuits on the wafers by lithography. Step 5 (assembly) is called a "post-process", in which the wafers processed in step 4 are formed into semiconductor chips and which include an assembly process (dicing and bonding), a packaging process (chip sealing-in), etc. In step 6 (inspection), the semiconductor devices prepared in step 5 are checked for operability and durability. Then, the semiconductor devices completed through these processes are shipped (step 7).

Figure 86:
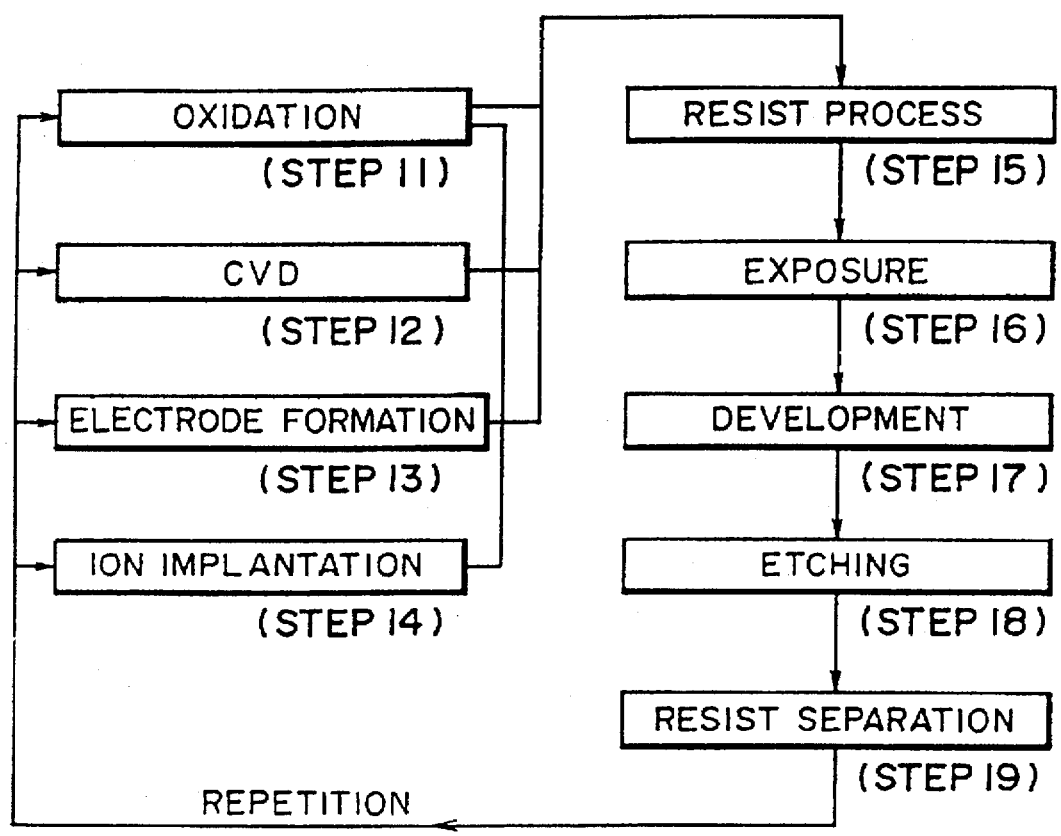
FIG. 86 is a diagram showing a wafer process flowchart.

FIG. 86 shows a detailed flowchart of the above-described wafer process. In step 11 (oxidation), the wafer surfaces are oxidized. In step 12 (CVD), an insulating film is formed on the surface of each wafer. In step 13 (electrode formation), electrodes are formed on the wafers by evaporation. In step 14 (ion implantation), ions are implanted in the wafers. In step 15 (resist process), a photosensitive material is applied to the wafers. In step 16 (exposure), the mask circuit patterns are printed and exposed on the wafers by the above-described exposure system. In step 17 (development), the exposed wafers are developed. In step 18 (etching), those wafer portions other than the developed resist images are removed. In step 19 (resist separation), the post-etching resist residue is removed. By repeating these steps, multiple circuit pattern formation can be effected on the wafers.

With the manufacturing method of this embodiment, it is possible to manufacture highly integrated semiconductor devices having very minute circuit patterns, which have conventionally been difficult to manufacture.

The individual components shown in outline or designated by blocks in the Drawings are all well-known in the semiconductor device manufacturing arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage device, comprising:

first, fine-motion driving means, comprising a linear motor, for moving a movable stage through a first range in a predetermined direction; and second, relatively rough-motion driving means for moving the movable stage through a second range in the predetermined direction, which is substantially of the same extent as the first range.

2. A device according to claim 1, wherein said second driving means comprises a linear motor.

3. A device according to claim 1, wherein said second driving means uses a rotary drive force of a rotary motor.

4. A device according to claim 1, wherein said second driving means uses a gas pressure.

5. A device according to claim 4, wherein said second driving means comprises a gas cylinder and control means for controlling supply of a gas to said gas cylinder.

6. A device according to claim 1, wherein said second driving means and the movable stage are coupled with each other through a resilient member which is deformable with respect to the movement direction.

7. A device according to claim 6, further comprising means for detecting displacement of said resilient member, and control means for moving the movable stage on the basis of an output of said detecting means.

8. A device according to claim 6, further comprising second control means for controlling said second driving means in accordance with an acceleration curve which can be differentiated with respect to time.

9. A device according to claim 1, wherein said second driving means and the movable stage are disengageably coupled with each other through a disengageable clutch.

10. A device according to claim 1, wherein said second driving means and the movable stage are coupled with each other through a joint having a clearance in the movement direction.

11. A device according to claim 1, wherein the movable stage is moved in a direction having a component of gravity.

12. An exposure system including a stage device, comprising:

first, fine-motion driving means, comprising a linear motor, for moving a movable stage through a first range in a predetermined direction;

second, relatively rough-motion driving means for moving the movable stage through a second range in the predetermined direction, which is substantially of the same extent as the first range; and means for exposing a substrate placed on the movable stage with radiation energy generated by one of an X-ray source and an excimer laser source.

13. A system according to claim 12, wherein the substrate comprises a semiconductor wafer, and a circuit pattern is transferred thereto by said system.

14. A device according to claim 1, further comprising static pressure bearing means for guiding the movable stage.

15. A device according to claim 2, further comprising static pressure bearing means for guiding the movable stage.

16. An exposure method for manufacturing a semiconductor device, said method comprising the steps of:

providing a stage device as recited in any one of claims 1 through 11;

holding a substrate with the stage device; and exposing the substrate with radiation energy including one of X-rays and ultraviolet rays.

* * * * *

UNITED STATES PATENT AND TRADEMARK OFFICE
CERTIFICATE OF CORRECTION

PATENT NO. : 5,684,856
DATED : November 4, 1997
INVENTOR(S) : HIROHITO ITOH, ET AL.

It is certified that error appears in the above-identified patent and that said Letters Patent is hereby corrected as shown below:

COLUMN 1:

Line 40, "E-E" should read --88-88--.

COLUMN 4:

Line 41, "Of the" should read --of the--.

COLUMN 6:

Line 34, "(c)" should read --66(c) are--.

COLUMN 9:

Line 39, "and" (second occurrence) should read --through--.

COLUMN 10:

Line 16, "couteracting" should read --counteracting--.

COLUMN 14:

Line 28, "heat as so" should read --as much heat as--.

UNITED STATES PATENT AND TRADEMARK OFFICE
CERTIFICATE OF CORRECTION

PATENT NO. : 5,684,856
DATED : November 4, 1997
INVENTOR(S) : HIROHITO ITOH, ET AL.

It is certified that error appears in the above-identified patent and that said Letters Patent is hereby corrected as shown below:

COLUMN 15:

Line 12, "couteracting" should read --counteracting--.

COLUMN 17:

Line 4, "a" (second occurrence) should read --an--.
Line 5, "an" should read --a--.

COLUMN 18:

Line 64, "counteract to" should read --to counteract--.

COLUMN 21:

Line 55, "to any" should read --any--.

COLUMN 23:

Line 40, "to the" should read --the--.

COLUMN 24:

Line 31, "cause" should read --causes--.

UNITED STATES PATENT AND TRADEMARK OFFICE
CERTIFICATE OF CORRECTION

PATENT NO. : 5,684,856
DATED : November 4, 1997
INVENTOR(S) : HIROHITO ITOH, ET AL.

It is certified that error appears in the above-identified patent and that said Letters Patent is hereby corrected as shown below:

COLUMN 25:

Line 49, "differentiatable" should read --differentiable--.

COLUMN 26:

Line 62, "i" should read --1--.

COLUMN 33:

Line 13, "in in" should read --in--.

Signed and Sealed this

Thirtieth Day of June, 1998

Attest:

*Attesting Officer*

BRUCE LEHMAN
*Commissioner of Patents and Trademarks*